United States Patent
Williams

(10) Patent No.: US 7,812,647 B2
(45) Date of Patent: Oct. 12, 2010

(54) MOSFET GATE DRIVE WITH REDUCED POWER LOSS

(75) Inventor: Richard K. Williams, Cupertino, CA (US)

(73) Assignee: Advanced Analogic Technologies, Inc., Santa Clara, CA (US)

( * ) Notice: Subject to any disclaimer, the term of this patent is extended or adjusted under 35 U.S.C. 154(b) by 254 days.

(21) Appl. No.: 11/890,942

(22) Filed: Aug. 8, 2007

(65) Prior Publication Data

US 2008/0290911 A1    Nov. 27, 2008

Related U.S. Application Data

(60) Provisional application No. 60/931,097, filed on May 21, 2007.

(51) Int. Cl.
*H03B 1/00* (2006.01)

(52) U.S. Cl. ........................ 327/110; 327/108

(58) Field of Classification Search ............... None
See application file for complete search history.

(56) References Cited

U.S. PATENT DOCUMENTS

| | | | | |
|---|---|---|---|---|
| 4,748,351 A | | 5/1988 | Barzegar | 327/384 |
| 5,334,882 A | * | 8/1994 | Ting | 327/108 |
| 5,436,577 A | | 7/1995 | Lee | 326/58 |
| 5,525,925 A | | 6/1996 | Bayer | 327/377 |
| 5,606,281 A | * | 2/1997 | Gloaguen | 330/51 |
| 5,703,415 A | * | 12/1997 | Tanaka | 307/66 |
| 5,737,169 A | | 4/1998 | Sellers | 361/98 |
| 6,040,737 A | * | 3/2000 | Ranjan et al. | 327/543 |
| 6,114,883 A | * | 9/2000 | Knodgen | 327/108 |
| 6,222,403 B1 | * | 4/2001 | Mitsuda | 327/170 |
| 6,380,796 B2 | * | 4/2002 | Sakai et al. | 327/434 |
| 6,438,005 B1 | * | 8/2002 | Walter | 363/60 |
| 6,518,804 B2 | * | 2/2003 | Kawagoshi et al. | 327/112 |
| 6,683,482 B2 | * | 1/2004 | Humphrey et al. | 327/170 |
| 6,888,388 B1 | * | 5/2005 | Cook et al. | 327/170 |
| 7,233,179 B2 | * | 6/2007 | White | 327/112 |
| 7,511,540 B2 | * | 3/2009 | Dickman et al. | 327/108 |

FOREIGN PATENT DOCUMENTS

JP    2005-304218    10/2005

* cited by examiner

*Primary Examiner*—Lincoln Donovan
*Assistant Examiner*—Thomas J Hiltunen
(74) *Attorney, Agent, or Firm*—Patentability Associates

(57) ABSTRACT

A gate driver for a power MOSFET in, for example, a DC-DC converter switches the MOSFET between a fully-on condition and a low-current condition instead of switching the MOSFET between fully-on and fully-off conditions. The amount of charge that must be transferred to charge and discharge the gate of the MOSFET is thereby reduced, and the efficiency of the MOSFET is improved. A feedback circuit may be used to assure that the magnitude of current in the power MOSFET in its low-current condition is correct. Alternatively, a trimming process may be used to correct the magnitude of the voltage supplied by the gate driver to the gate of the power MOSFET in the low-current condition.

7 Claims, 48 Drawing Sheets

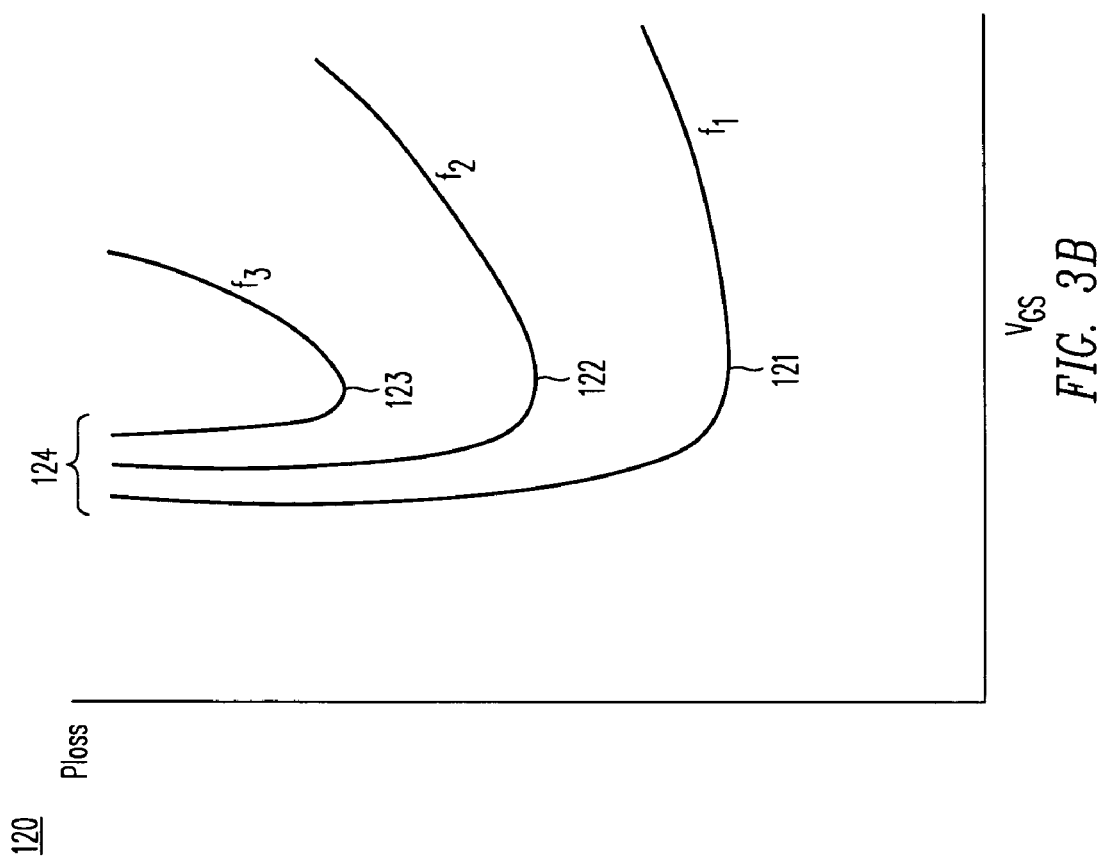

MOSFET GATE DRIVE WITH REDUCED POWER LOSS

CROSS-REFERENCE TO RELATED APPLICATIONS

This application claims the priority of Provisional Application No. 60/931,097, filed May 21, 2007, which is incorporated herein by reference in its entirety.

FIELD OF THE INVENTION

This invention relates to the driving of discrete or integrated power MOSFETs in switching applications such as DC/DC conversion, and especially switching at high frequencies.

BACKGROUND OF THE INVENTION

Switching regulators are used to regulate DC voltages and to convert one DC voltage to another, by stepping the voltage either up or down, or with the ability to step the voltage up or down depending on changing conditions. The quality of a DC/DC switching converter and regulator is measured by its ability to regulate over a range of input voltages, output voltages, load currents and temperatures. It should react sufficiently fast to guarantee good regulation during voltage and current transients as well as during steady state operation. In some applications it should also provide electrical isolation to prevent high input voltages from coupling to the output terminal, eliminating the risk of electrical shock and fire.

Most switching regulators utilize an inductor or coil as an energy storage device, since an inductor easily generates a range of output voltages different from the input voltage that drives, i.e. magnetizes, the inductor. Along with diode rectifiers, one or more power switches, typically power MOSFETs, whose switching and conduction are controlled by a pulse-width modulation (PWM) controller, are used to control the current in the inductor and, by using negative feedback, the output voltage of the regulator. Some examples of well-known prior-art DC/DC converting regulators are illustrated in FIGS. 1A-1F.

Common DC/DC Converter Topologies: In FIG. 1A, a Buck converter 1 provides step-down voltage regulation whereby, through pulse-width modulation, a high-side power MOSFET 2 controls the current in an inductor 4 in response to a PWM controller 7. A capacitor 5 filters the voltage ripple on the output terminal of converter 1. When high-side MOSFET 2 is off, the current in inductor 4 is maintained because the voltage $V_x$ drops below ground, forward biasing rectifier 3 and allowing the inductor current to recirculate until MOSFET 2 is turned on again. A diode 6 remains reverse-biased under normal operation. As shown, MOSFET 2 is a P-channel device, but a high-side N-channel MOSFET may be substituted for the P-channel device with appropriate changes in the gate drive circuitry.

FIG. 1B illustrates a synchronous Buck converter 10 with a PWM controller 17, a high-side P-channel MOSFET 11 with an intrinsic P-N diode 15, an inductor 13, and a capacitor 14. The synchronous rectifier comprises an N-channel MOSFET 12 with an intrinsic P-N diode 16. A break-before-make (BBM) circuit 18 is included to prevent simultaneous conduction in both high-side P-channel MOSFET 11 and low-side N-channel synchronous rectifier MOSFET 12. Operation of synchronous Buck converter 10 employs the same control and feedback techniques as described for non-synchronous Buck converter 1 except that MOSFET 12 conducts during a portion of the time diode 16 is conducting, i.e. when MOSFET 11 is off.

While synchronous Buck converter 10 employs a complementary half-bridge, with MOSFET 11 a P-channel and MOSFET 12 an N-channel, asynchronous Buck converter 20 of FIG. 1C utilizes an N-channel totem-pole arrangement comprising an N-channel high-side MOSFET 21 and an N-channel low-side synchronous rectifier MOSFET 22.

Boost converter 30, shown in FIG. 1D, comprises a MOSFET 31 and a PWM controller 36, controlling the current in an inductor 32 through pulse width modulation or by controlling the on-time of MOSFET 31 in variable-frequency operation. Whenever MOSFET 31 is off and inductor 32 is not being magnetized, the voltage $V_x$ flies up, forward-biasing a rectifier diode 33 and supplying current to a filter capacitor 34 and the output terminal. Feedback of the output voltage $V_{out}$ via a feedback voltage $V_{FB}$ is used to control the on-time of MOSFET 31, the current in inductor 33, and $V_{out}$. A synchronous boost regulator, a modification of boost converter 30, includes an N-channel or P-channel synchronous rectifier MOSFET placed in parallel with diode 33 to shunt current from diode 33 during some portion of the time when diode 33 is forward-biased, i.e. when low-side MOSFET 31 is off.

Typical for switching regulators employing a single inductor rather than a transformer or coupled inductor, the Buck and synchronous Buck converters shown in FIGS. 1A-1C can be used only for step-down voltage conversion, i.e. reducing an input voltage to a lower and well-regulated output voltage. The converse of the Buck converter, the boost converter shown in FIG. 1D and a corresponding synchronous boost converter can be used only for step-up voltage conversion, i.e. increasing an input voltage to a higher and well-regulated output voltage.

To obtain a single regulator with the ability to step an input voltage either up or down requires a more complex solution, using either double the number of power MOSFETs to combine a Buck and boost converter into a single circuit, or by employing multi-winding inductors and transformers. For example, in the converter 40 shown FIG. 1E, a high-side MOSFET 41 drives a coupled inductor 42 with a turns-ratio of "n", the secondary side of which is rectified by one, two, or four rectifier diodes or synchronous rectifier MOSFETs to output a voltage across a capacitor 44. To regulate the output voltage, the output voltage $V_{out}$ must be fed back to a PWM controller 47 via a feedback voltage $V_{FB}$ across an isolation barrier 46 which may comprise a transformer or an opto-coupler.

While converter 40 utilizes a P-channel power MOSFET connected to positive input voltage Vcc, converter 50 shown in FIG. 1F uses a grounded N-channel MOSFET 51 to control the current in a coupled inductor 52, whose secondary winding is rectified by a diode or MOSFET rectifier circuit 53 and filtered by a capacitor 54. The output voltage across capacitor 54 is fed back to the primary side PWM controller 57 through an isolation transformer or opto-coupler 56. Converter 50 may operate as a forward converter or as a flyback converter, depending on whether energy is transferred to the load in phase, when MOSFET 51 is conducting, or out of phase, when MOSFET is turned off.

In all of the regulators shown in FIGS. 1A-1F, power MOSFETs and rectifier diodes are used to control the energy flow in the converter and regulating circuit. In synchronously rectified converters, even the diodes are shunted by conducting MOSFETs to reduce conduction losses.

But switching a power MOSFET at frequencies over one megahertz involves switching and gate drive power losses, not just power lost due to conduction.

Conduction and Switching Losses in Power MOSFETs: Even though power MOSFETs offer superior electrical performance to other semiconductor devices, especially for operation below 100 volts, they are not ideal power switches—they do in fact dissipate power and reduce the efficiency of the circuit in which they are employed. In a conducting or on-state, the power dissipated is determined by the voltage across the drain-to-source terminals times the current, or $P=I_D \cdot V_{DS}$. Since the device is not conducting all of the time, the average power is determined by the percentage of the clock period T that the device is on and conducting, i.e. $t_{on}/T$.

In the main switch of as DC/DC switching regulator this fraction is also referred to as the duty factor D of the converter. It is well known to those skilled in the art that if the circuit is not operating at a fixed frequency $f=1/T$, then its cycle-by-cycle average power changes, and a more careful time-integration must be performed to calculate the device's average power dissipation over longer durations, e.g. during the discharge of a LiIon battery.

The power dissipation in a conducting, "on" state power MOSFET depends on its terminal voltages. The terms "on" and "switch" should not be construed to mean or imply exclusively digital operation. Power MOSFETs may operate as either a programmable current source or as a variable resistance. The term "switch," as used herein, follows the IEEE and Webster dictionary definition as referring to a device that completes or interrupts an electrical circuit, i.e. allowing or preventing current flow, without regard to the magnitude of that current.

In its saturation region of operation, an "on" power MOSFET behaves like a constant current source $I_{sat}$, depending on the gate voltage and relatively independent of the value of its drain voltage $V_{DS}$. The average power dissipation is then given by $$P_{cond(sat)} = I_{sat} \cdot V_{DS} \cdot \frac{t_{on(sat)}}{T}$$

Operating as a controlled current source, the magnitude of a power MOSFET's current must be held to a low value, or the device will overheat. Care must be taken in circuit design to minimize input voltage variations from affecting the device's gate bias. With gate control, the power MOSFET may be operated as a switched current source, alternating between a fixed drain current and an off condition where no current except for device leakage flows.

When a power MOSFET is used as low-resistance switch, the device operates in its "linear" region, which is characterized by a linear relationship between its drain voltage and its drain current, the slope of which defines a variable resistance $R_{DS(on)}$ whose magnitude varies with the MOSFET's gate bias. Since from Ohm's law $V=I \cdot R$, the power dissipation in a MOSFET in its linear region follows the relationship $$P_{cond(lin)} = I_{D(lin)} \cdot V_{DS(lin)} \cdot \frac{t_{on(lin)}}{T} = (I_D)^2 \cdot R_{DS(on)} \cdot \frac{t_{on(lin)}}{T}$$

The term $R_{DS(on)}$ assumes that the device is operating in its linear region, acting as a variable resistance depending on the gate voltage.

Power is also lost switching the power MOSFET on and off at high frequencies. FIGS. 2A-2D illustrate the power loss in a MOSFET that results from its gate capacitance. As shown in FIG. 2A, a transient gate current $I_g(t)$ required to charge and discharge the capacitive gate of a MOSFET 61 is supplied by and lost in a gate buffer 63, first by charging the MOSFET's gate to turn it on, then subsequently to dump the charge stored on the MOSFET's gate to ground. The equivalent power loss from driving a capacitor is given by the well-known formula $P=C_{eq} \cdot V^2$. The term $C_{eq}$ is used because the MOSFET exhibits multiple voltage variable capacitances intrinsic to its structure, making a simple power calculation using capacitance problematic at best. FIG. 2B illustrates a network of capacitance for a MOSFET 66 including a gate-to-source capacitance 70 ($C_{GS}$), a gate-to-drain capacitance 69 ($C_{DG}$), and a drain-to-source capacitance 72 ($C_{DS}$) associated with P-N junction diode 71.

In addition to being voltage-variable, gate-to-drain capacitance 69 forms a feedback path from the MOSFET's drain "output" to its gate input. Any time the circuit shows voltage gain, this capacitance is also amplified, loading the input terminal with a capacitance many times larger than the magnitude of small-signal capacitance $C_{DG}$. This phenomenon, known as the Miller effect, greatly complicates calculating power loss with capacitance since during a switching transient, MOSFET 66 passes from cutoff, into saturation, and into its linear region, with the voltage gain and capacitance all varying in tandem.

FIG. 2C illustrates one such switching transient overlaid atop a power MOSFET's $I_D$-$V_{DS}$ family-of-curves. Specifically the "load" represents a switching regulator such as the Buck converter 1 of FIG. 1A driving both rectifier diode 3 and inductor 4 during diode recovery, i.e. when the diode ceases conduction and the MOSFET starts.

Starting with an "off" device having no current at point 78, the switching transient shown traverses path 71 at a relatively constant drain voltage. The drain-to-source voltage cannot change instantly because diode 3 must be depleted of any stored charge before the drain voltage can rise. With a large $V_{DS}$ drain voltage, $V_{DS} > V_{GS}$ and the MOSFET is operating in its saturation region. The current in a saturated MOSFET ramps as controlled by the gate voltage 74 in proportion to the $V_{GS}$ value. In such a condition and circuit, the saturated MOSFET exhibits voltage gain, amplifying the gate-to-drain feedback capacitance by constantly changing and increasing amounts, making it increasingly harder for a gate buffer to smoothly drive the MOSFET's gate during the transition.

At a gate bias $V_{GS5}$, the device enters operating condition 72 where both current and drain voltage are changing rapidly. Point 75 corresponds to a bias condition in the transition region between linear and saturation, sometimes called edge-of-saturation or quasi-saturation. Instantaneous power losses in the device have peaked and begin to decline as $V_{DS}$ drops. From gate bias $V_{GS6}$ and higher, the MOSFET is operating in its linear region 76.

Further increases in gate voltage 73 lower the MOSFET's resistance $R_{DS}$ further to point 79 but with diminishing improvements in conduction loss. In the example shown, the current becomes semi-constant during this short interval because the load is inductive and will not allow current to charge instantly. Since $I_D$, $V_{DS}$ and $V_{GS}$ vary simultaneously, it is difficult to account for all the intra-device currents.

While in an actual application, the gate buffer used to drive a MOSFET's gate behaves like a fixed voltage source, greater clarity in device operation can be gained with current-source gate drive. As shown in FIG. 2D, a current-source supplying a constant current $I_G$ to the gate of a MOSFET driving a load, produces a $V_{DS}$ switching transient that with time declines in voltage from $V_{cc}$ at cutoff 83, through saturation 87, and into its linear region 88. During the same time, starting at zero volts at point 90, the $V_{GS}$ gate voltage increases linearly 81 during cutoff, reaches a plateau 82 in saturation when the drain voltage 87 is slewing, and increases again 83 as the device enters its linear operating region. At time $t_{on}$, the transient is over, the MOSFET is fully conducting and the drain voltage is now $I_D \cdot R_{DS}$. Since the gate current was constant during the entire transition and since $Q = I_G \cdot t_{on}$ then the x-axis may be re-plotted as gate charge $Q_G$.

Since charge is always conserved, the amount of charge needed to reach point 84 is independent of the gate drive circuit. In other words, the gate charge $Q_G$ needed to reach a given gate and drain bias condition is path-independent and does change with drive circuitry. The graph of $Q_G$ and $V_{GS}$ can be re-plotted with $V_{GS}$ on the x-axis as shown in graph 100 of FIG. 3A, having cutoff, saturation, and linear regions 104, 105 and 106 respectively. Plotted on the same axis the drain voltage is expressed as a resistance, declining rapidly 101 at the edge of saturation into linear region 102, and finally stabilizing at point 108 at a minimum value $R_{DS}$.

The power loss to reach gate charge 107 and drain voltage 108 can then be expressed $$P_{drive} = Q_G \cdot V_{GS} \cdot f$$

This equation takes into account the Miller effect and all voltage dependent capacitances but varies with the drain bias $V_{DS}$, with gate drive $V_{GS}$, and with technology. The total loss of a power MOSFET used in a switching regulator can then be calculated by the equation $$P_{loss} = P_{cond(lin)} + P_{cond(sat)} + P_{drive} + P_{other}$$

In conventional switching regulators, the MOSFET is never intentionally operated in saturation but only experiences saturation during the switching transients and diode recovery. In such cases, provided that the converter's frequency is not too high, $P_{cond(sat)}$ can be neglected and only conduction losses in the linear region $P_{cond(lin)}$ need be considered. At low voltages, miscellaneous losses $P_{other}$ can be neglected and the power loss equation simplifies to $$P = (I_D)^2 \cdot R_{DS(on)} \cdot \frac{t_{on(lin)}}{T} + Q_G \cdot V_{GS} \cdot f$$

Given the $Q_G$ and $R_{DS}$ curves in graph 100, the overall power loss calculated using the above equation is shown in graph 120 of FIG. 3B for operation at a fixed $t_{on}/T$ ratio. As shown, curves 121, 122, and 123 illustrate that the power loss increases in proportion to the frequencies $f_1$, $f_2$, and $f_3$, which may be, for example, 300 kHz, 1 MHz, and 2 MHz.

The power loss curve has a U-shape with a minimum value at some specific gate voltage and increases losses for any gate drive above or below that value. The gradual increase in $P_{loss}$ at higher gate drive voltages is due to increased gate drive losses $P_{drive}$ consistent with curve 106 in graph 100. For low gate voltages, the steep dependence of $P_{loss}$ with gate voltage is a consequence of MOSFET operation at the edge of saturation corresponding to curve 101 in graph 100. As frequency increases from curve 121 to 123, the minimum power loss increases, i.e. the converter exhibits decreased efficiency, and exhibits a greater concavity, i.e. its minimum occurs over a narrower range of gate voltage. In other words gate drive losses become increasingly critical at higher frequency operation.

In normal applications, where a constant voltage rather than a constant current drive is employed, the gate drive losses are not evident from inspection of the $V_{GS}$ switching waveforms because they occur too quickly to be visible. For example, in FIG. 4A, a gate buffer 141, comprising a P-channel MOSFET 142 and an N-channel MOSFET 143 and powered by a voltage source 146 providing a voltage $V_{cc}$, rapidly drives the gate of a power MOSFET 144 between $V_{cc}$ and ground. During turn on, the $V_{GS}$ switching waveform 150 shown in FIG. 4B shows some slight slope change 153 in its otherwise smooth upward progression 151 and 154 and again during turn off reveals a slope change 157 in its smooth decay 156 and 158 to a final gate voltage 159 of zero volts.

A clearer mechanistic picture of the actual drive loss is shown in graph 170, also in FIG. 4B, where the gate charge increases linearly from a start value 171 of zero coulombs, rises with a slope 172, reaches a final value 173 and at time $t_3$ decays 174 to a final value 175 of zero coulombs at the end of the switching transient. So even though the gate drive uses a constant voltage drive, the power loss is the same as shown using with a current source drive condition. The total charge stored on the gate during charging is all lost to ground during turn off.

Such rail-to-rail drive is lossy because it doesn't recycle or preserve any gate charge from cycle-to-cycle and because it drives the gate to a voltage $V_{cc}$ which may not correspond to the minimum power loss condition shown in FIG. 3B. As a result, power is wasted by throwing charge away and by overdriving a MOSFETs gate, both factors lowering the efficiency of a converter.

What is needed in any MOSFET switched at frequencies, and especially in DC/DC switching regulators, is a means to charge and discharge the power MOSFET's gate so that some portion of the gate charge is preserved and reused on a cycle-by-cycle basis in order to improve the overall efficiency of the converter or other circuit.

SUMMARY OF THE INVENTION

These needs are satisfied in a MOSFET that is operated in accordance with this invention, wherein a switching MOSFET is not turned fully off but instead alternates between a fully turned-on condition and a low-current condition. The low-current condition of the MOSFET replaces the fully-off condition that is used in conventional switching sequences. Switching the MOSFET between a fully-on condition and a low-current condition reduces the amount of charge that must be moved to and from the gate of the MOSFET during each switching cycle and thereby reduces the power lost in charging and discharging the gate. In many situations, this power savings more than compensates for the additional power lost from the drain current that continues to flow in the MOSFET in its low-current condition. Therefore the overall efficiency of the MOSFET is improved.

The above method of driving the gate of a MOSFET may be achieved using a variety of gate drive circuits, all of which are included within the scope of this invention.

In one group of embodiments, the gate is driven with a bi-state gate driver, which is constructed functionally as a single-pole double-throw switch and which has a first input terminal connected to a first voltage that is sufficient to turn the MOSFET fully on and a second input terminal connected to a second voltage typically near the threshold voltage of the MOSFET. The output terminal of the gate driver, which is connected to the gate of the MOSFET, is switched between the first and second input terminals to drive the MOSFET between the fully-on and low-current conditions. The gate driver may be constructed using a pair of complementary MOSFETs and a pass transistor that is connected to a reference voltage that is suitable for driving the MOSFET into the low-current condition. The voltage delivered to the gate of the MOSFET may be generated using plurality of pass transistors connected to form a multiplexer, or a voltage-divider circuit that includes resistors and/or diodes. The gate driver may be capable of delivering more than two voltages to assure that a voltage suitable for the low-current condition of the MOSFET is available.

Feedback may be employed to assure that the proper drain current flows through the MOSFET in its low-current condition. The feedback circuit measures the current through the MOSFET and then compares the measurement against a reference that represents the desired current value. If there is a difference, an error signal is generated and the error signal causes the gate driver to increase or decrease the gate voltage of the MOSFET, as necessary, during its low-current condition until the correct value of drain current in the MOSFET is reached. The feedback circuit may include an amplifier, a sense resistor, and/or a current mirror.

Alternatively, since the threshold voltage of the MOSFET is the dominant process parameter affecting its saturation current, the correct value of the low-current in the MOSFET may be obtained by trimming to correct for manufacturing variations in its threshold voltage. The trimming circuit may measure the drain current in the MOSFET when its gate is biased for the low-current condition and adjust the reference voltage that the gate driver delivers to the gate of the MOSFET until the correct value of drain current is achieved. For example, the trim circuitry may include one-time-programmable (OTP) MOSFETs connected in parallel with resistors serially-connected in a voltage-divider network. Individual MOSFETs are programmed, i.e., permanently turned on, to short out a sufficient number of the resistors until a gate voltage is obtained that provides a correct value of drain current in the MOSFET.

Alternatively, the MOSFET may be fabricated monolithically with a second threshold-connected current mirror MOSFET. Since any variations in the threshold voltage will affect both MOSFETs, supplying a fixed current to the current mirror MOSFET will cause the current to be mirrored in main MOSFET by a ratio (n) of the respective gate widths of the MOSFETs. Thus, if a current equal to the target current in the main MOSFET divided by n is supplied to the current mirror MOSFET, the correct magnitude of current will flow through the main MOSFET. The current supplied to the current mirror MOSFET may be adjusted by a D/A converter under control of a digital logic, digital signal processor, or microprocessor and may be adjusted dynamically and in real time as desired. Alternatively, the gate of the current mirror MOSFET may be switched between a first position, wherein it is connected to the drain of the current mirror MOSFET and a current source, and a second position, wherein it is connected to ground, turning off the current mirror MOSFET and connecting the gate of the main MOSFET to a high voltage that drives the main MOSFET into its high-current state.

In another group of embodiments the gate driver is constructed functionally as a three-pole switch with a third input terminal connected to the source of the MOSFET. By connecting the output terminal of the gate driver to the third input terminal, the MOSFET is turned off or put into a sleep or shutdown mode where no power is lost either in driving the gate of the MOSFET or allowing a current to flow through the drain of the MOSFET. In some embodiments the gate driver may have an enable input terminal which in its ON condition causes the gate driver to switch the MOSFET between its high and low-current states, and in its OFF condition causes the gate driver to connect the gate to the source of the MOSFET, turning the MOSFET off or putting it into its sleep mode.

The invention also includes a method of driving a MOSFET by switching the gate between a first voltage at which the MOSFET is fully turned on and second voltage, typically near the threshold voltage, at which the MOSFET is in a low-current or partially-on condition.

The above-described methods and circuits for driving a power MOSFET with low gate drive losses can be applied to low-side, high-side or push-pull configured power MOSFETs, of either N-channel or P-channel conductivity types.

BRIEF DESCRIPTION OF THE DRAWINGS

FIG. 3B is a graph of power loss as a function of gate bias.

DESCRIPTION OF THE INVENTION

While power MOSFET design and manufacturing can be used to optimize or minimize the on-resistance gate-charge product of a device used in a power switching application, power losses can also be minimized by limiting the amount of gate charge moved during each switching transition. This task may be achieved in two ways—by limiting the maximum gate drive to an optimum point or by conserving some of the gate charge during switching transitions. This application discloses a means of preserving some gate charge during subsequent switching cycles.

Figure 5:
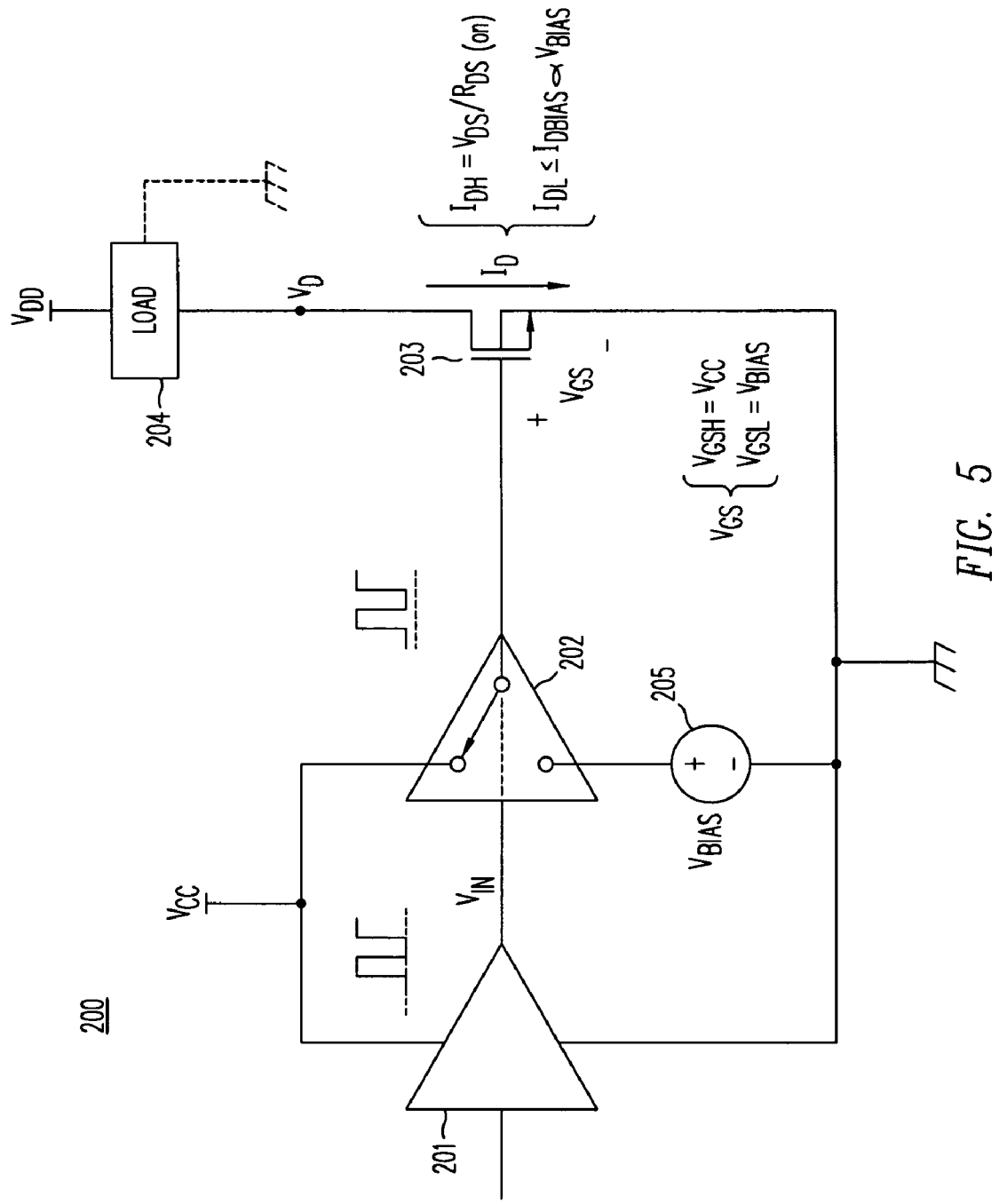
FIG. 5 is a conceptual circuit diagram of a reduced-gate-charge power MOSFET gate driver in accordance with the invention.

One embodiment of this invention is illustrated in FIG. 5, where a circuit 200 illustrates a means of driving the gate of a power MOSFET 203 that controls a load 204. Load 204 may comprise any electrical component connected to supply voltage $V_{DD}$ or an electrical network of components connected to both $V_{DD}$ and optionally to ground or to other voltage sources. The input signal to a gate driver 202 is a logic signal output from a buffer or inverter 201 with an output terminal that switches between a supply voltage $V_{cc}$ and ground. In general, the supply voltage $V_{cc}$ is not the same as $V_{DD}$, and it is generally less than $V_{DD}$, although this need not be the case.

Gate driver 202 drives the gate-to-source terminals of MOSFET 203, repeatedly charging and discharging the gate with a voltage range smaller than the voltage range at the output terminal of buffer 201. In the high or fully-on condition of MOSFET 203, represented by the gate voltage $V_{GSH}$, the gate of MOSFET 203 is biased at a potential $$V_{GS}=V_{GSH}=V_{cc}$$

whereby the MOSFET is driven into its linear region, i.e. operating as a variable resistor, so that the drain current $I_D$ is given by $$I_D=V_{DS}/R_{DS(on)}$$

In this condition, $V_D=V_{DS}\ll V_{GS}$ and $V_{GS}\gg V_t$, where $V_t$ is the threshold voltage of MOSFET 203.

In contrast to the situation in conventional gate drive circuits, where in a second state a power MOSFET is biased fully "off" with its gate shorted to its source, in the technique of this invention MOSFET 203 is not shut-off but rather is biased in a low or partially-on condition $V_{GSL}$ with a gate potential $$V_{GS}=V_{GSL}=V_{BIAS}$$

Assuming that the value of $V_{BIAS}$ is small, typically near the threshold voltage, then in this state $V_{DS}>(V_{GS}-V_t)$ and the device is in its saturated state where drain current is relatively independent of the drain voltage $V_{DS}$, so that the drain current $I_D$ is given by $$I_D=I_{DBIAS}\propto V_{BIAS}$$

The gate potential $V_{BIAS}>0$ is established by a bias supply 205, which may comprise a fixed value reference voltage or a multiple thereof. Alternatively, $V_{BIAS}$ may vary as a multiple of $V_{cc}$. As shown, gate driver 202 performs the function of a single-pole double-throw switch selecting one of two possible gate potentials $V_{BIAS}$ and $V_{cc}$. The gate of MOSFET 203 is not driven to ground, contrary to the conventional method of biasing the gate of a MOSFET.

Typically, $I_{DBIAS}$ is at least one or two orders of magnitude (i.e., from 10 to 100 times) greater than the size of the leakage current through the MOSFET when its gate-to-source voltage $V_{gs}$ is equal to zero and no greater than one or two orders of magnitude less than (i.e., from 1% to 10% of) the magnitude of the current in the MOSFET when it is in its fully-on condition. The gate-to-source voltage $V_{BIAS}$ of the MOSFET in its saturated low-current state is typically in a range of 10% to 125% of its extrapolated threshold voltage, preferably in a range of 25% to 100% of its extrapolated threshold voltage. The extrapolated threshold voltage is defined in Dieter K. Schroder, *Semiconductor Material and Device Characterization* (1990), which is incorporated herein by reference.

For gate biases several hundred millivolts above and below threshold, e.g. gate biases of $V_{GS}=V_t \pm 400$ mV, saturated drain currents change dramatically. Picking a gate bias that produces a specific desired drain current is difficult, especially when considering manufacturing variability. Setting voltage source 205 at a fixed value can result in wide lot-to-lot variations in the saturated drain current in MOSFET 203. Using a fixed gate bias method, products therefore must likely be screened to fit the specific range of drain current. For example, the screening limits for drain current for a 1 W switching regulator with a fixed bias used in portable applications may comprise the specified ranges shown in Table 1:

TABLE 1

| Sat Drain Current | Best | Good | Downgrade | Reject |
| --- | --- | --- | --- | --- |
| Portable Apps | 1 μA-30 uA | 30 uA-300 uA | 300 uA-1 mA | I > 1 mA, I < 1 uA |
| High Power Apps | 100 μA-1 mA | 1 mA-30 mA | 30 mA-300 mA | I > 300 mA, I < 100 uA |

In low-power applications (typically where the drain current is in the range of 0.5 A to 5 A when the MOSFET is fully on), too much saturation current wastes power which, if not offset by reduced diode recovery losses, can lead to lower overall converter efficiencies. In high-power converters (typically where the drain current is in the range of 5 A to 50 A when the MOSFET is fully on), such small losses are negligible and the noise benefit may offset the penalty for any impact in efficiency even at higher bias currents. Note that a lower limit also exists; if the drain current in low-current saturation mode drops below some specified value, the benefit of the disclosed technique in shunting diode current and reducing stored charge in the diode is reduced or lost altogether.

Figure 6:
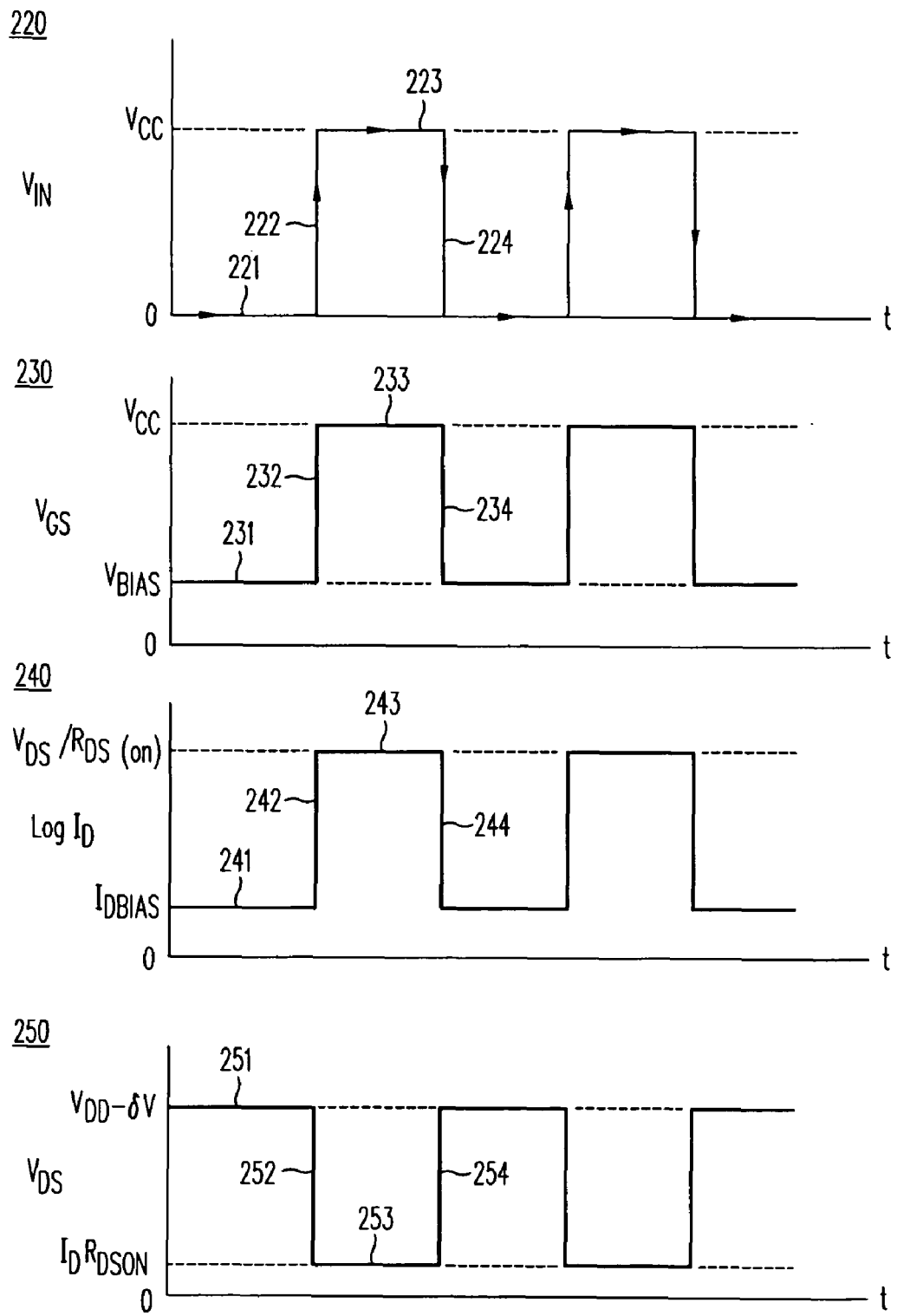
FIG. 6 shows voltage and current switching waveforms in a gate driver of this invention.

The switching waveforms for circuit 200 are shown in the graphs of FIG. 6 with $V_{IN}$, $V_{GS}$, $I_D$ and $V_{DS}$ plotted versus time in graphs 220, 230, 240, and 250 respectively. As shown in graph 220, the input $V_{IN}$ to gate buffer 202 alternates between ground 221, i.e. 0V, and the $V_{cc}$ input voltage 223, with rapid transitions 222 and 224 in between.

The output of gate driver 202, driving the gate voltage $V_{GS}$ of MOSFET 203, shown in graph 230, alternates between the voltages $V_{BIAS}$ and $V_{cc}$, never reaching zero. As shown, the transitions 232 and 234 in $V_{GS}$ are synchronized and in phase with the transitions 222 and 224 in $V_{IN}$, but may be inverted in polarity. Corresponding to the $V_{GS}$ pulses shown, the drain current $I_D$ in semilog graph 240 alternates between a minimum current 241 of magnitude $I_{DBIAS}$ and a maximum current 243 of magnitude ($V_{DS}/R_{DS(on)}$) with transitions 242 and 244.

The drain voltage $V_{DS}$ across MOSFET 203 alternates between a maximum voltage 251 of magnitude ($V_{DD}-\delta V$) $\approx V_{DD}$ and a minimum voltage 253 of magnitude ($I_D \cdot R_{DS(on)}$). The voltage $\delta V$ is the voltage drop across load 204 carrying the small current $I_{DBIAS}$. If $I_{DBIAS}$ is under 1 mA and preferably in the range of 1 μA to 100 μA, then the power dissipation in MOSFET 203, namely $$P_{BIAS}=I_{DBIAS} \cdot (V_{DD}-\delta V) \approx I_{DBIAS} \cdot V_{DD}$$

is negligible. The power saved in gate drive losses is achieved by limiting the gate drive voltage range and therefore limiting the swing in gate charge.

Minimizing Gate-Charge Swing: The above-mentioned power-saving concept is illustrated in graph 280 of FIG. 7, which includes a plot of $V_{GS}$ (on the left-hand y-axis) and $V_{DS}$ (on the right-hand y-axis) versus the gate charge $Q_G$ (on the x-axis). The solid lines indicate the ranges of the gate and drain voltages in a device operated in accordance with this invention, while the solid and dashed lines together indicate the same ranges in a device operated using conventional gate drive techniques. Specifically, in a conventional gate drive, the gate charge starts at zero and then increases along curves 281, 282, 283, and 284 to point 287. If the input $V_{cc}$ increases, the maximum gate charge $Q_{GH}$ will increase beyond point 287 further along line 285. With increasing gate charge, the corresponding drain voltage moves from $V_{DD}$ in the off-state of MOSFET 203 and then via curves 290, 291, and 292 to the on-state of MOSFET 203 at point 294. If the input voltage $V_{cc}$ increases, the voltage $V_{GS}$ will decline only slightly below point 294 along curve 293, even though $Q_G$ increases linearly in this region.

In conventional switching applications, the entire charge placed on the gate of the MOSFET during turn-on is dumped to ground during turn-off. The total gate charge corresponds to charging the gate up to $V_{cc}$ and then discharging to ground resulting in a large "swing" in gate voltage and gate charge. Gate charge swing is herein defined as $$\Delta Q_G = Q_{GH} - Q_0 = Q_G(V_{GH}) - 0$$

For conventional gate drive methods, this total gate charge swing is then $$\Delta Q_G = Q_G(V_{cc}) - 0 = Q_{GH}$$

Figure 7:
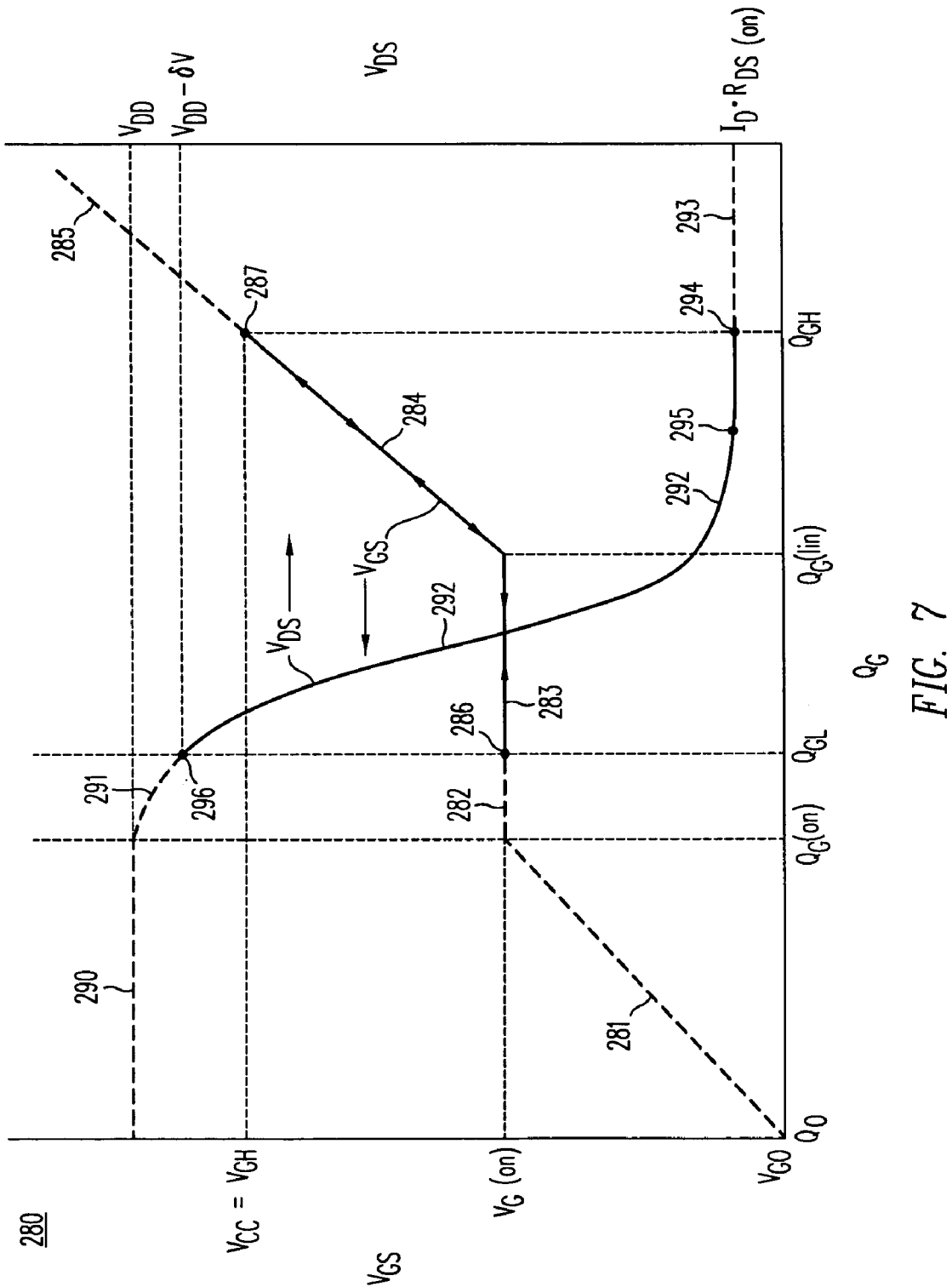
FIG. 7 is a graph of gate voltage and the drain voltage as a function of gate charge illustrating the limited gate voltage swing in a gate driver of this invention.

Referring again to graph 280 in FIG. 7, when the gate is driven in accordance with this invention, the gate charge alternates only between points 286 and 287, along the curves 283 and 284. The gate improved charge swing $\Delta Q'_G$ is then given by $$\Delta Q'_G = Q_{GH} - Q_{GL} = Q_G(V_{GH}) - Q_G(V_{G(on)})$$

where $Q_{GL}>0$. Because $(Q_{GH}-Q_{GL})<Q_{GH}$, less gate charge is required to switch at a given frequency, and the power needed for driving the gate is reduced proportionately, by the charge along the path from zero to point 286 or $(Q_{GL}-Q_{G0})=Q_{GL}$.

Figure 9:
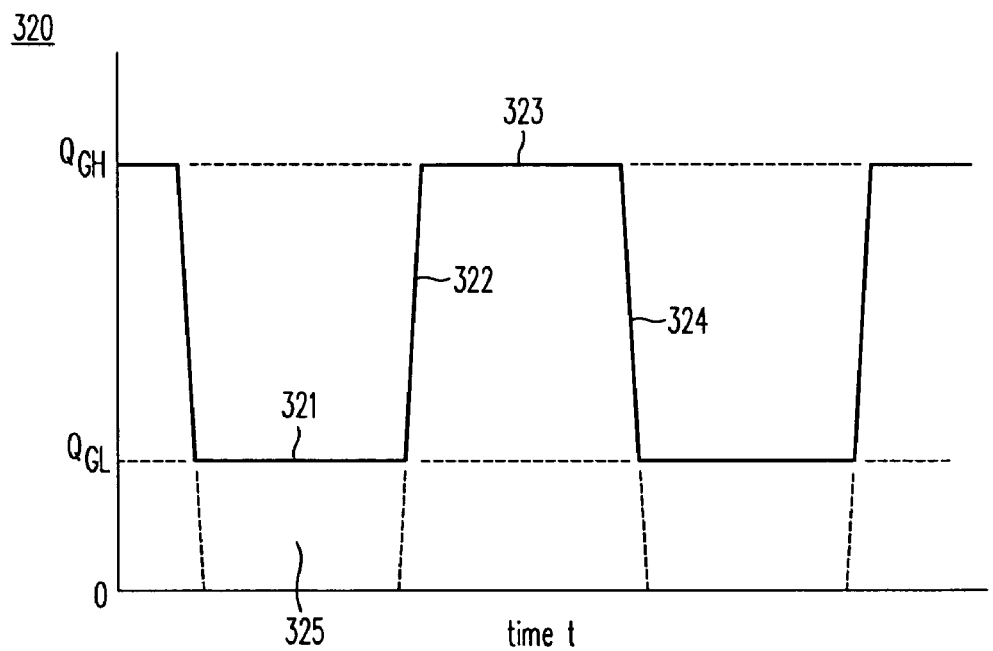
FIG. 9 is a graph showing the limited gate charge swing in a MOSFET driven by a gate driver of this invention.

To better illustrate the reduced gate charge swing, the method of this invention can be represented as a plot of $Q_G$ versus time as illustrated in graph 320 of FIG. 9, where the charge present on the MOSFET's gate varies alternates between a magnitude $Q_{GL}$ (curve 321) and a magnitude $Q_{GH}$ (curve 323) with charging and discharging transitions 322 and 324. Since some minimum amount of charge $Q_{GL}$ is always left on the device's gate, the charge represented by the area 325 is preserved from one cycle to the next, and the efficiency of the gate drive is improved accordingly.

Minimizing Average Power Loss: As stated previously the power loss associated with driving the gate in accordance with this method, is given by $$P_{drive} = (Q_G \cdot V_G)/T = Q_{GH} \cdot V_{GH} \cdot f$$

The corresponding power savings $P_{Gsaved}$ associated with the reduced charge during high frequency MOSFET gate drive is then given by $$P_{Gsaved} = (Q_{GL} \cdot V_{G(on)})/T = Q_{GL} \cdot V_{G(on)} \cdot f$$

Referring again to graph 280 in FIG. 7, using the technique of this invention, the drain voltage $V_{DS}$ varies from point 296 to point 294 along curve 292, skipping cutoff operation regions, represented by curves 290 and 291. At point 294, the voltage across the power MOSFET is given by $I_D \cdot R_{DS(on)}$.

Figure 8:
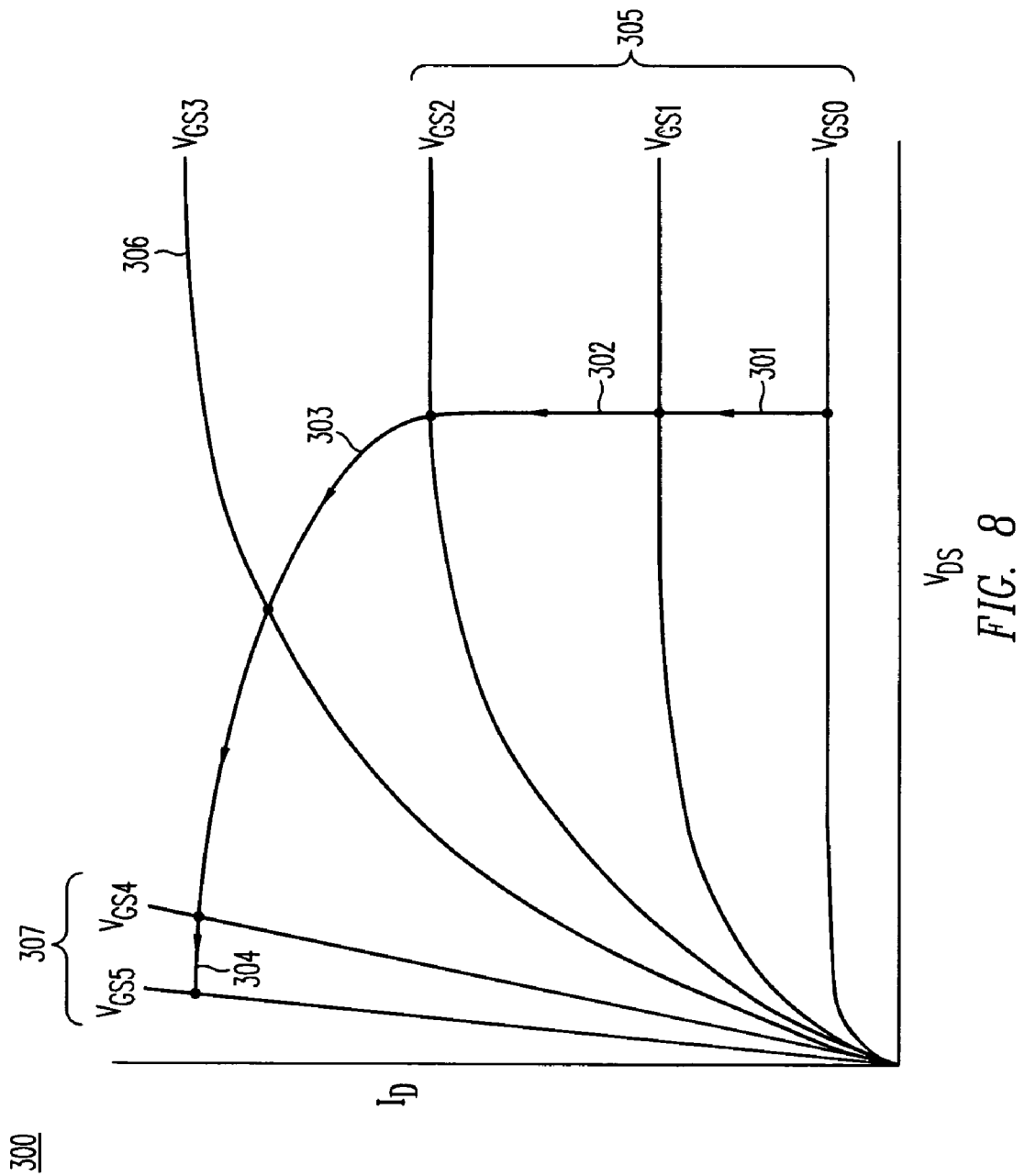
FIG. 8 is a graph showing the limited drain current swing in a MOSFET driven by a gate driver of this invention.

The relationship between current $I_D$ and drain voltage $V_{DS}$ is further illustrated in FIG. 8, where a switching waveform 303 for a switching converter such as Buck converter 1 is overlaid on the MOSFET's family of I-V curves representing gate voltages $V_{GS0}$ through $V_{GS5}$. Starting from point 301, where the gate voltage equals $V_{GS0}$ and $I_D > 0$, the current increases along curve 302 with $V_{GS}$ while the MOSFET's gate is biased in its saturation region 305 and $V_{DS}$ is relatively constant. Under gate voltage $V_{GS3}$, represented by I-V curve 306, the drain voltage $V_{DS}$ changes along curve 303 until the MOSFET is operating in its linear operating region 307, when $V_{DS}$ continues to decline along curve 304 but $I_D$ does not change substantially. The gates discharge process transitions between the two same end points 301 and 304 in the reverse direction.

The average power loss for the fully-on condition lasting an on-time $t_{on}$ in every cycle of period T is given by $$P_{cond} = I_D^2 \cdot R_{DS(on)} \cdot \frac{t_{on}}{T} = I_D^2 \cdot R_{DS(on)} \cdot D$$

where $D \equiv t_{on}/T$.

Referring again to FIG. 7, at point 296, the low current condition, the voltage across MOSFET 203 is given by $V_{DS} = (V_{DD} - \delta V) \approx V_{DD}$ and the corresponding power loss during a duration $t_{sat} = T - t_{on}$.

$$P_{BIAS} = I_{DBIAS} \cdot (V_{DD} \cdot \delta V) \cdot \frac{t_{sat}}{T} \approx I_{DBIAS} \cdot V_{DD} \cdot (1 - D)$$

The total conduction loss in the power MOSFET is then the sum of conduction loss $P_{cond}$ when the MOSFET is biased fully on in its linear region and power loss $P_{BIAS}$ due to the bias current $I_{DBIAS}$ during the interval $t_{sat}$ when the MOSFET is in its saturated region of operation, or $$P'_{cond} = I_D^2 \cdot R_{DS(on)} \cdot \frac{t_{on}}{T} + I_{DBIAS} \cdot V_{DD} \cdot \frac{t_{sat}}{T}$$

where $T = (t_{sat} + t_{on})$ and may vary cycle-to-cycle in variable frequency operation, or in fixed frequency operation with duty factor D where $$P'_{cond} = I_D^2 \cdot R_{DS(on)} \cdot D + I_{DBIAS} \cdot V_{DD} \cdot (1-d)$$

Using the disclosed techniques, the total conduction and gate drive loss in the device is then given by $$P'_{loss} = \left[I_D^2 \cdot R_{DS(on)} \cdot \frac{t_{on}}{T} + Q_{GH} \cdot V_{GH} \cdot \frac{1}{T}\right] + \left(I_{DBIAS} \cdot V_{DD} \cdot \frac{t_{sat}}{T}\right) - \left(Q_{GL} \cdot V_{GL} \cdot \frac{1}{T}\right)$$

where the square bracketed terms represent the gate drive and conduction loss $P_{loss}$ using conventional gate drive techniques. Substituting this term yields the relation $$P'_{loss} = [P_{loss}] + \left(I_{DBIAS} \cdot V_{DD} \cdot \frac{t_{sat}}{T}\right) - \left(Q_{GL} \cdot V_{GL} \cdot \frac{1}{T}\right)$$

where T may vary cycle-to-cycle in variable frequency operation or for fixed frequency operation $$P'_{loss} = [P_{loss}] + (I_{DBIAS} \cdot V_{DD} \cdot (1-D)) - (Q_{GL} \cdot V_{GL} \cdot f)$$

For the disclosed method to save power $P'_{loss} < P_{loss}$ and therefore $$\left(I_{DBIAS} \cdot V_{DD} \cdot \frac{t_{sat}}{T}\right) < \left(Q_{GL} \cdot V_{GL} \cdot \frac{1}{T}\right)$$

meaning the power saved by reducing the gate drive must offset any additional power consumed by the added conduction loss resulting from the bias current $I_{DBIAS}$. Operating at a fixed frequency f and duty factor $D = t_{on}/T$, the equation can be expressed as $$(I_{DBIAS} \cdot V_{DD} \cdot (1-D)) < (Q_{GL} \cdot V_{GL} \cdot f)$$

This condition is more easily satisfied at higher frequencies f and for lower $V_{DD}$ input conditions when the power saving in reduced gate drive is more beneficial than the added power dissipation $P_{BIAS}$ resulting from the bias current.

Figures 1A, 1B:
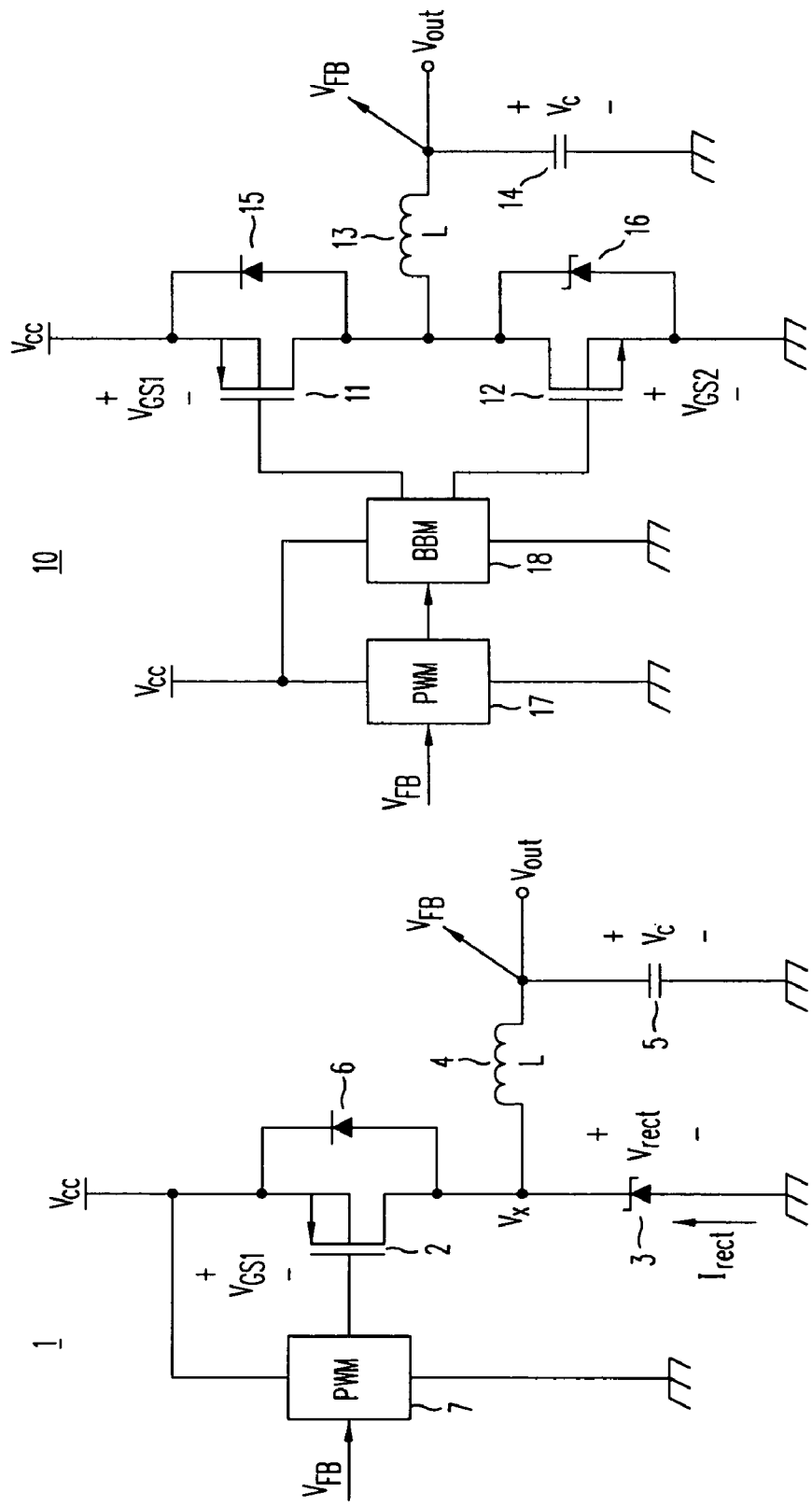
FIG. 1A is a circuit diagram of a Buck converter.
FIG. 1B is a circuit diagram of a synchronous Buck converter with complementary power MOSFETs.

It is difficult to make any general conclusion regarding the relationship between $I_{DBIAS}$ versus $Q_{GL} \cdot V_{GL}$ since they are related and depend on a specific power MOSFET's manufacturing process and design. For a given device, increasing $Q_{GL} \cdot V_{GL}$ in the drive circuit, i.e. increasing $V_{BIAS}$, reduces the gate drive losses but at the same time increases $I_{DBIAS}$ and increases the conduction loss. The optimum power saving bias condition is therefore technology specific. The duty factor D is specific to each switching application. In the step-down Buck converters shown in FIGS. 1A, 1B and 1C for example, the duty factor of high-side MOSFETs 2, 11, and 21 is given by $D = V_{out}/V_{in}$ where $V_{in} = V_{DD}$. Substituting this expression gives us the Buck regulator specific condition when the disclosed reduced gate drive method is beneficial $$(I_{DBIAS} \cdot (V_{DD} - V_{out})) < (Q_{GL} \cdot V_{GL} \cdot f)$$

This equation means that as the difference between the output and input voltages of a Buck converter increases, the disclosed low gate-drive-loss technique is less beneficial.

Figures 1C, 1D:
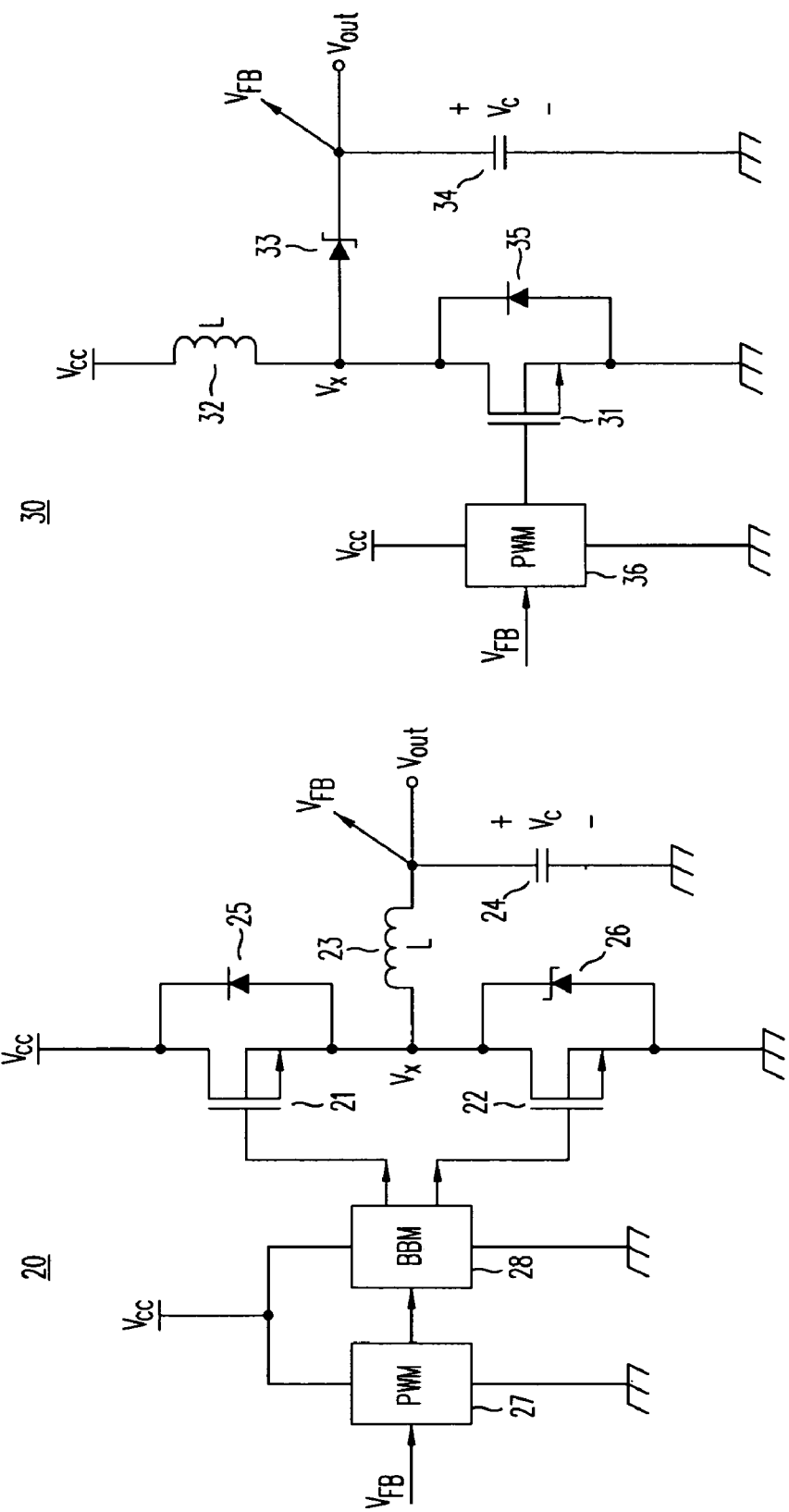
FIG. 1C is a circuit diagram of a synchronous Buck converter with totem-pole N-channel power MOSFETs.
FIG. 1D is a circuit diagram of a non-synchronous boost converter.
Figure 1F:
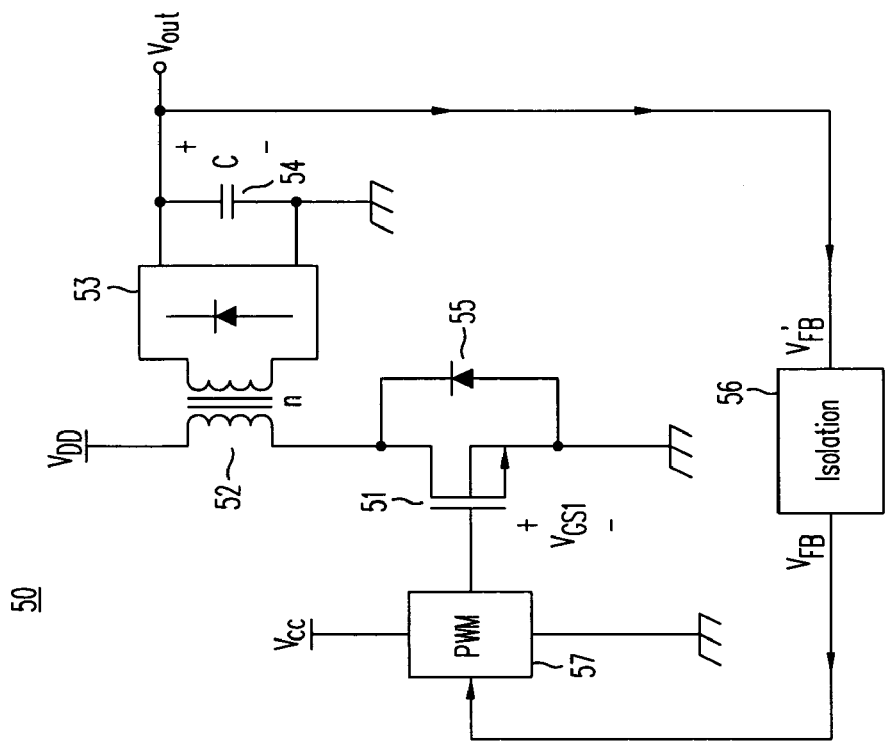
FIG. 1F is a circuit diagram of a flyback or forward converter with an N-channel power MOSFET.
Figure 1E:
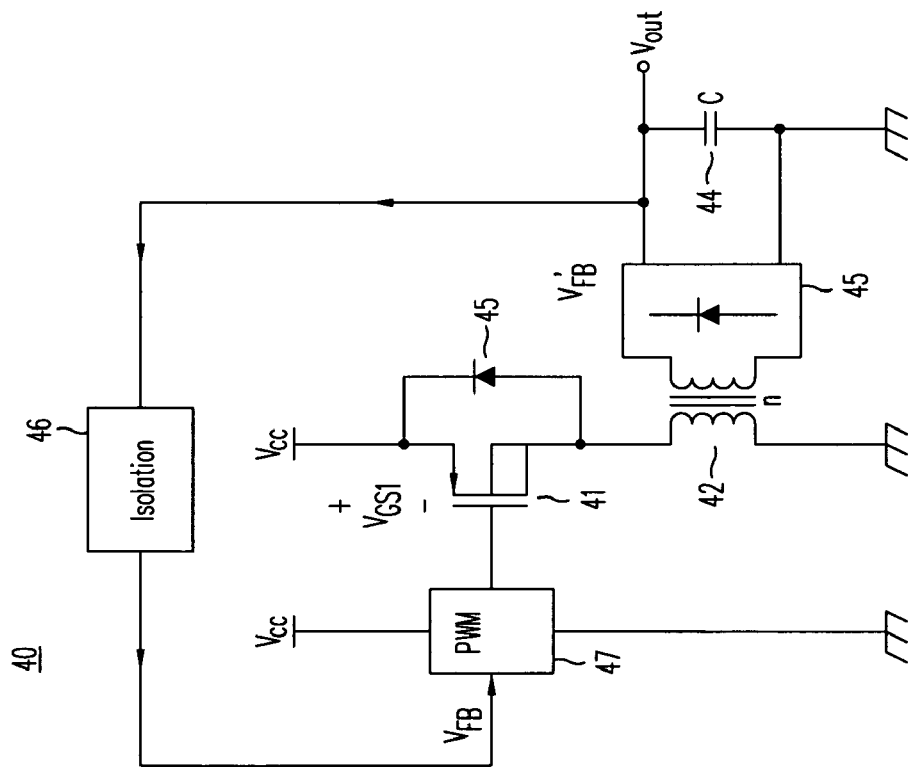
FIG. 1E is a circuit diagram of a flyback or forward converter with a P-channel power MOSFET.
Figure 2A:
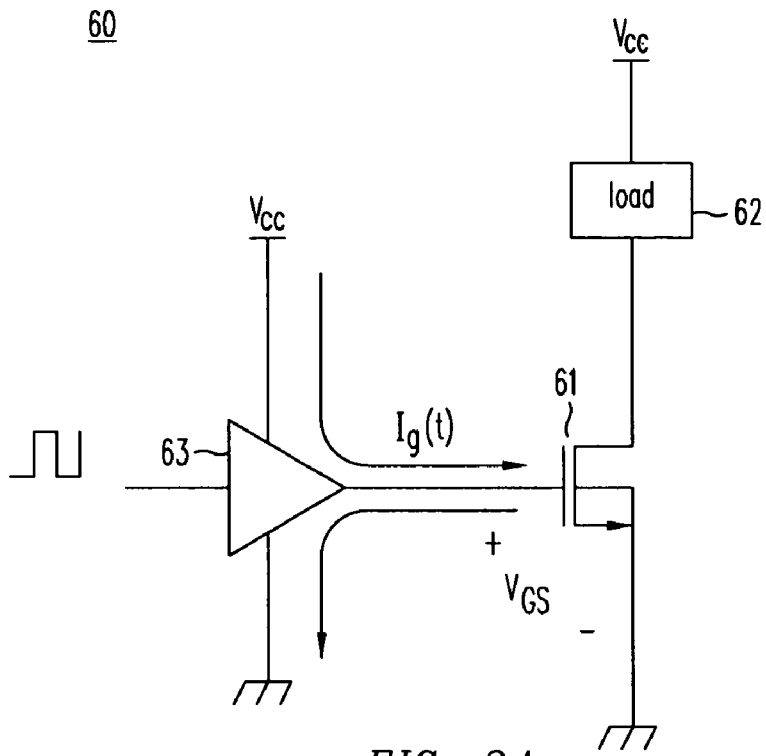
FIG. 2A is a circuit diagram illustrating the operation of a gate driver.
Figure 2B:
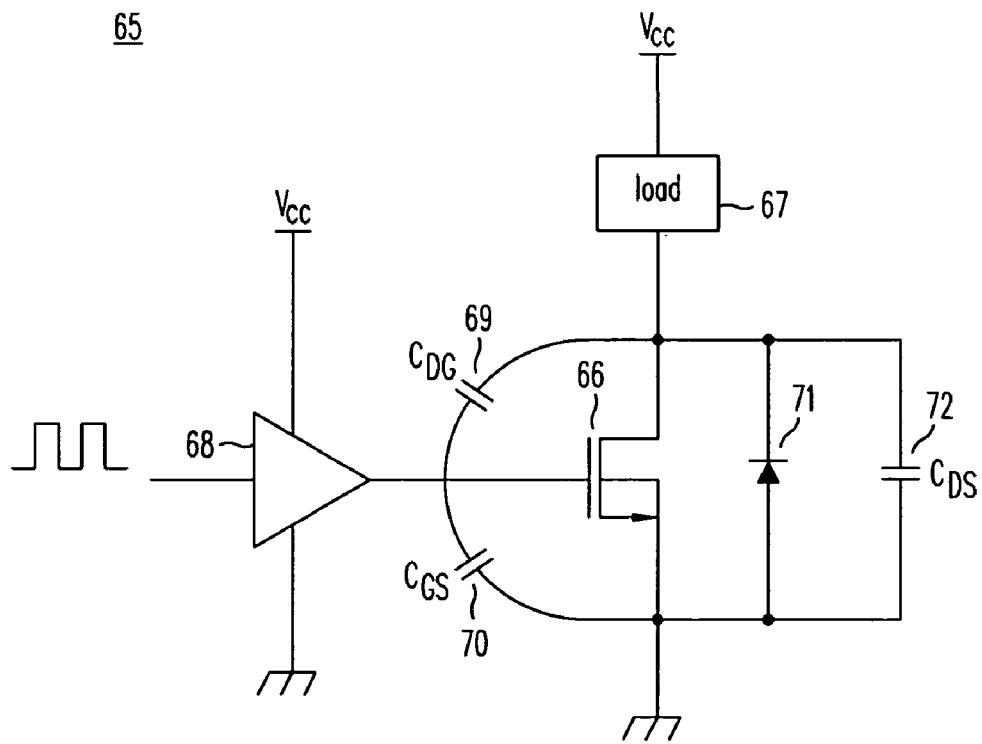
FIG. 2B is a diagram illustrating the intrinsic capacitances in a MOSFET.
Figure 2C:
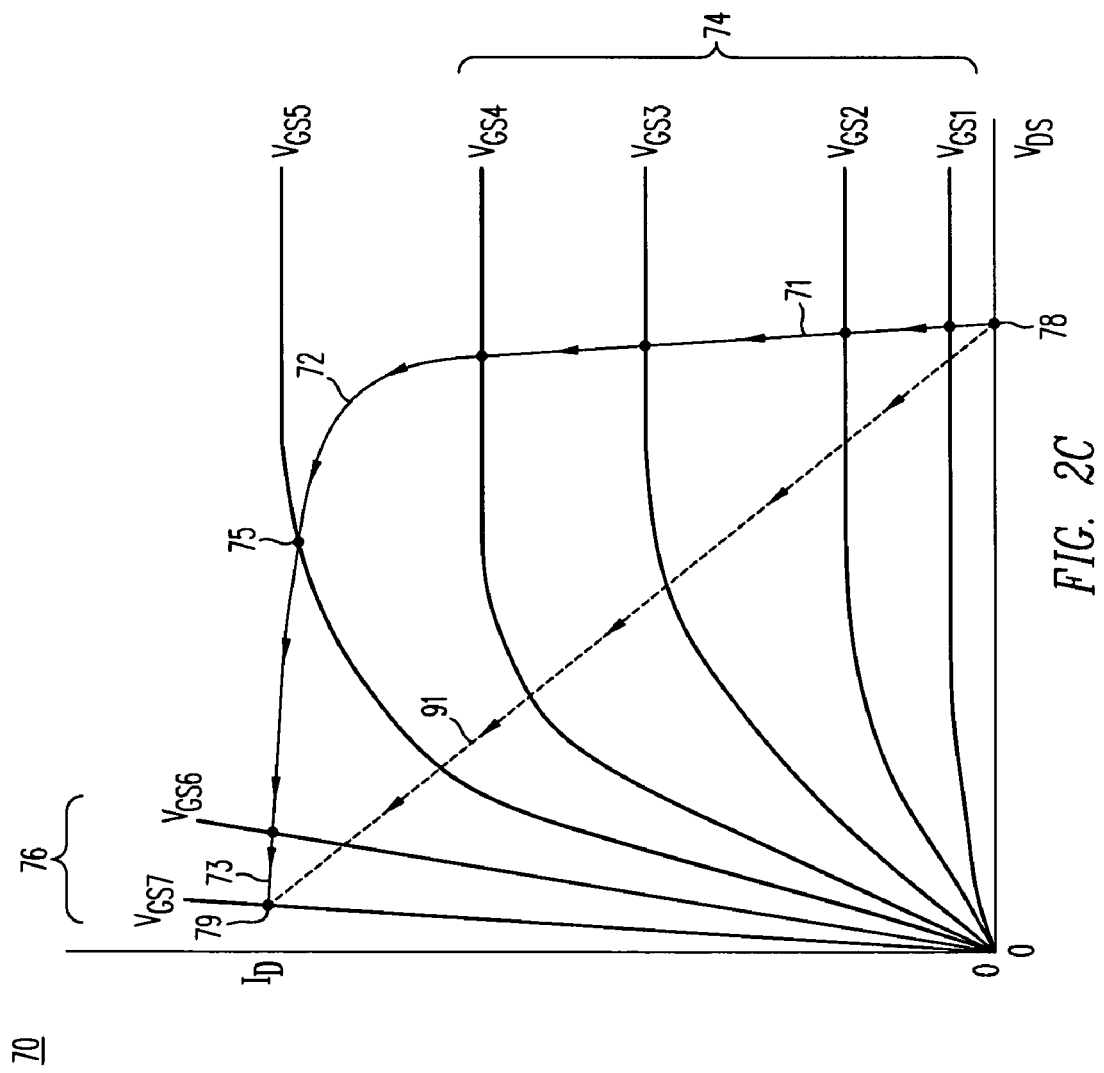
FIG. 2C is a graph showing a switching transient overlaid on an $I_D$-$V_{DS}$ family of curves.
Figure 2D:
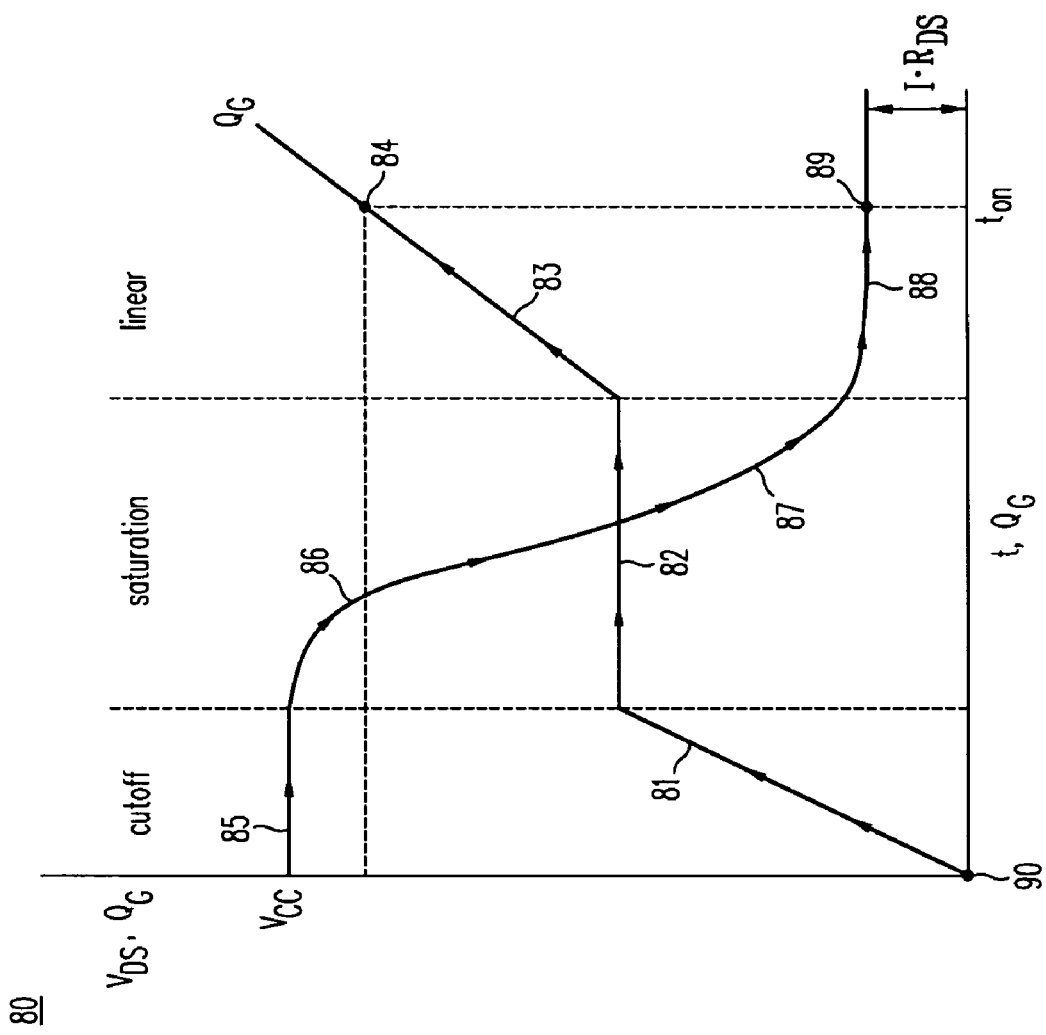
FIG. 2D is a graph showing the variations in the drain-to-source voltage and the gate charge as a MOSFET is turned from an off condition to an on condition.
Figure 3A:
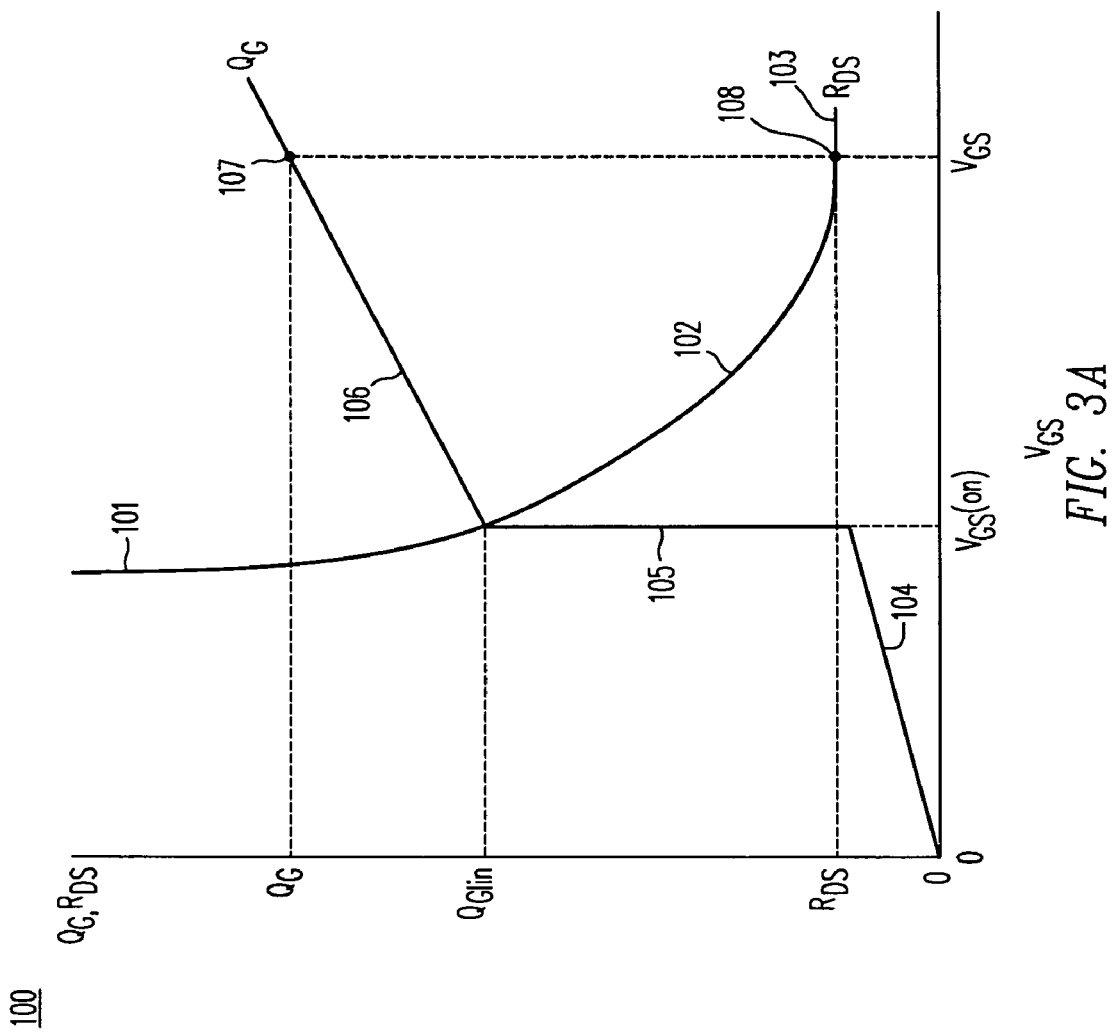
FIG. 3A is a graph showing the variation of gate charge and $R_{DS}$ as a function of the gate voltage.
Figure 4A:
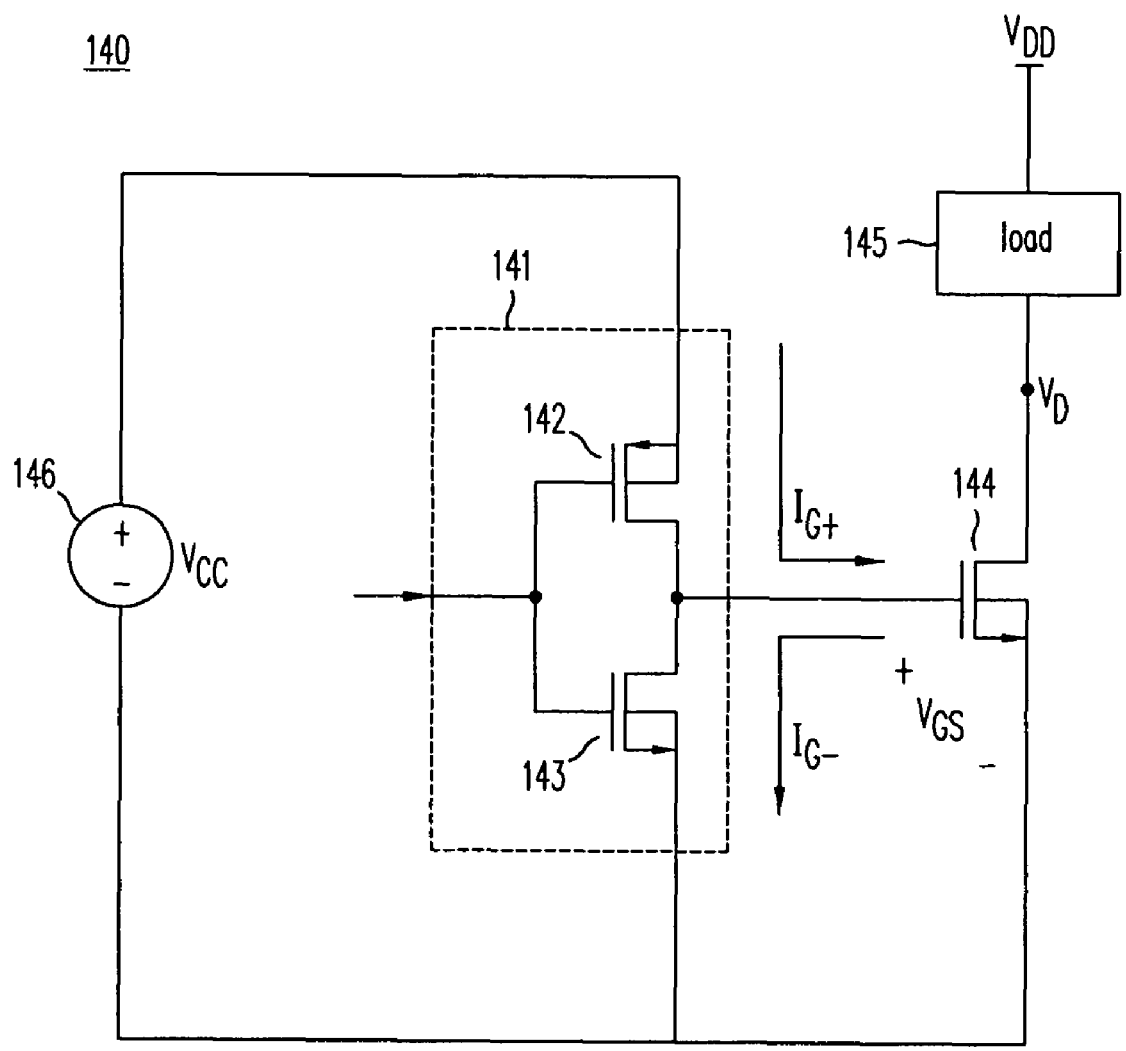
FIG. 4A is a circuit diagram of a CMOS gate driver.
Figure 4B:
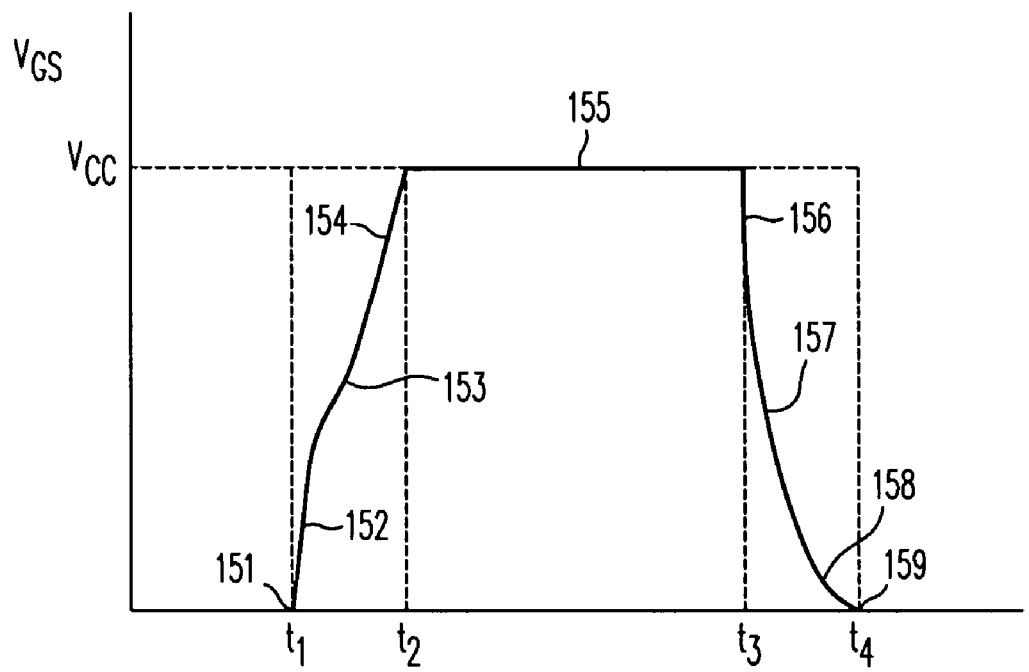
FIG. 4B shows graphs of the gate charge and gate voltage in the gate driver during switching.
Figure 4B:
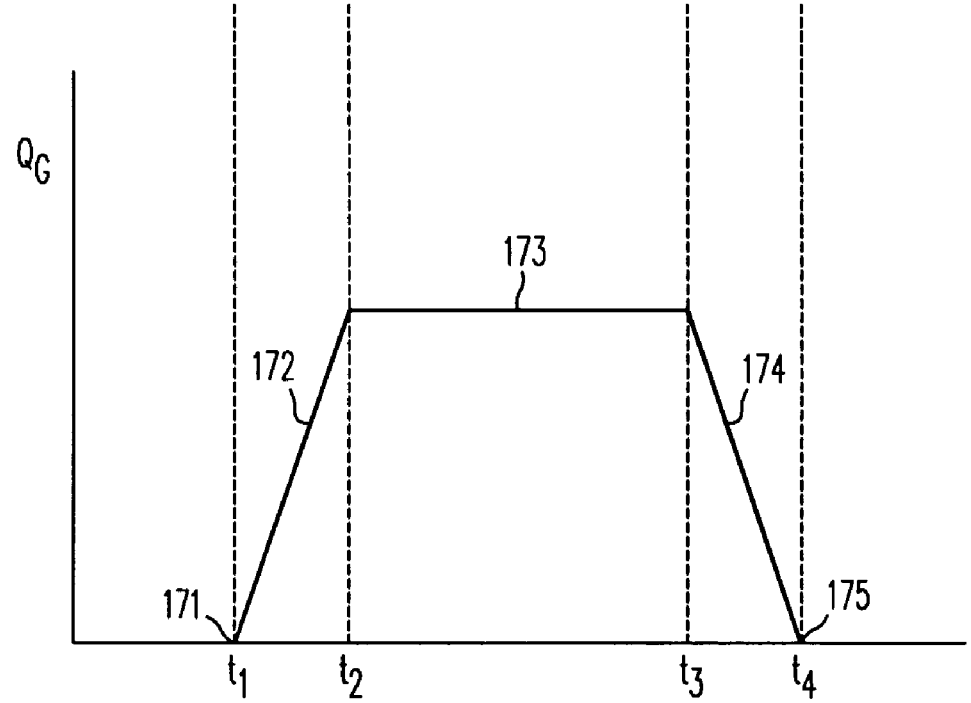

For a boost converter, as shown in FIG. 1D, the conversion ratio $V_{out}/V_{in} = 1/(1-D)$ where D reflects the on-time of low-side MOSFET 31. Rearranging and substituting $V_{in}/V_{out}$ for (1−D) gives us the boost regulator specific condition when the disclosed reduced gate drive method is beneficial $$\left(I_{DBIAS} \cdot \frac{V_{DD}^2}{V_{out}}\right) < (Q_{GL} \cdot V_{GL} \cdot f)$$

In a boost converter, i.e. where $V_{out} > V_{in}$, the disclosed method is more beneficial when a larger output voltage is generated from a lower input voltage.

Referring again to graph 280 in FIG. 7, when MOSFET 203 is operating in its linear region, the $V_{DS}$ voltage drop across MOSFET 203 nearly reaches its minimum value at point 295. In the operation as described the gate drive circuitry "overdrives" the MOSFET to gate bias 294 despite the minimal benefit in reducing on-resistance or voltage drop. Preventing gate overdrive is not easily accomplished since partial charging of the MOSFET's gate to any voltage less than $V_{cc}$ causes the same power loss to occur elsewhere in the circuit and does not improve efficiency.

Figure 10:
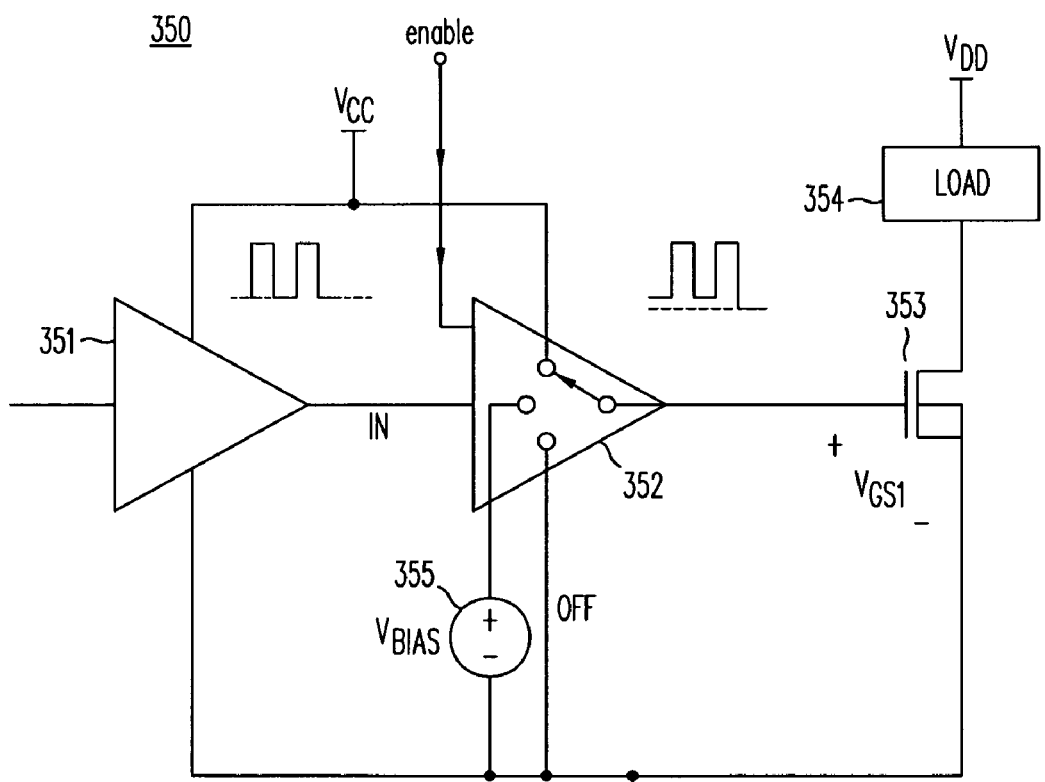
FIG. 10 is a conceptual circuit diagram of a tri-state gate driver in accordance with the invention.

Reduced Gate Drive Loss Circuit with Shutdown Mode: FIG. 10 illustrates another embodiment in accordance with this invention. In a number of applications, extended periods of time may occur when a power MOSFET is not switching, e.g. when a computer is in standby or sleep mode. During such operating conditions, any conduction current, even small amounts like $I_{BIAS}$, flowing from the battery through the load and power MOSFET will discharge the battery over time. The solution to the problem of extended off times is to modify the disclosed invention to include a shutdown mode.

Circuit 350 illustrates a generic description of the disclosed power MOSFET with reduced gate drive loss augmented with an added feature of a shutdown mode. Similar to the circuit 200 of FIG. 5, circuit 350 includes a gate driver 352 but in this case gate driver 352 has not two, but three states, i.e. fully-conducting with a low-resistance, saturated and biased at $V_{BIAS}$ to conduct a small fixed current, and fully-off for low-leakage cutoff. Accordingly gate driver 352 has two inputs, IN for receiving logic or PWM signals, and an enable pin for shutting the device off.

As shown, the output of buffer 351 feeds the "IN" input terminal of gate driver 352 with a signal ranging from $V_{cc}$ to ground, i.e. a digital signal switching from rail-to-rail. So long that enable is biased into its "on" state, gate driver 352 responds to the signal at its "IN" terminal, and the output of gate driver 352 drives the gate of MOSFET 353 at a voltage $V_{GS1}$ alternating between $V_{cc}$ and $V_{BIAS}$. Power MOSFET 353 in turn provides load 354 with a current that alternates between high and low drain currents determined by the gate drive voltages $V_{cc}$ and $V_{BIAS}$. As described previously, during high frequency operation, by biasing the gate of MOSFET 353 to a voltage no lower than $V_{BIAS}$, gate charge is preserved cycle-to-cycle, and gate drive losses are reduced. Efficiency is thereby improved, provided that the power saving achieved by limiting the gate charge swing is greater than the added conduction loss of $I_{BIAS}$, the minimum drain current during switching.

When the enable signal is turned off, gate driver 352 switches into a third state where the gate of MOSFET 352 is grounded, i.e. tied to its source, and where $V_{GS1}=0$. The drain current in power MOSFET 353 is then reduced to the device's $I_{DSS}$ leakage, the junction leakage from drain to source with the gate tied to its source. Even though the current $I_{BIAS}$ is small, preferably in the microampere to tens-of-microampere range—$I_{DSS}$ is even smaller, preferably below one microampere or even several orders of magnitude less than $I_{BIAS}$.

Figure 11A:
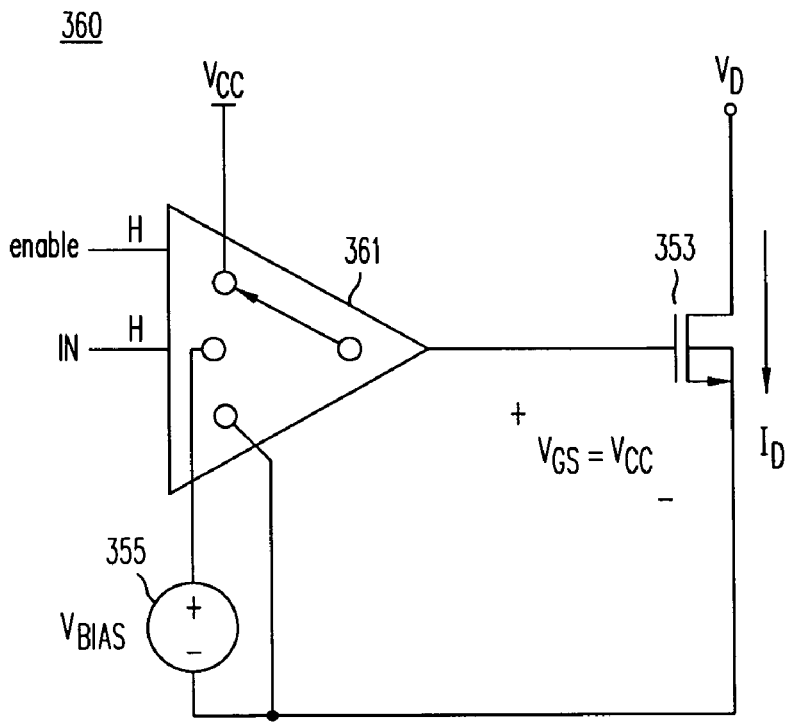
FIGS. 11A-11F are graphs and circuit diagrams illustrating the operating conditions of a tri-state gate driver of this invention, including the low resistance condition, the low- or controlled-current condition and the off-state condition.
Figure 11B:
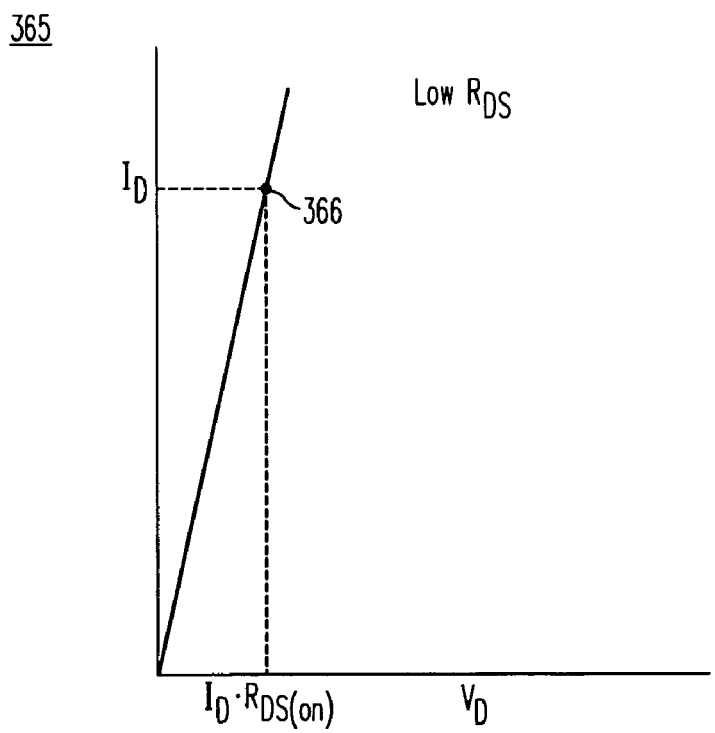

The three conditions are illustrated and contrasted in FIGS. 11A-11F and summarized in Table 2 below: In FIG. 11A, a gate driver 361 biases the gate of MOSFET 353 to $V_{GS}=V_{cc}$ and the device is fully-conducting in the MOSFET's linear region of operation, i.e. behaving as a gate-controlled variable resistance as shown in the I-V graph 365 of FIG. 11B. The drain current and voltage in this region and at point 366 obey Ohms law, namely $V_{DS}=I_D \cdot R_{DS(on)}$. In many power circuits the value of $I_D$ is determined by a voltage divider of the power MOSFET with other elements in the circuit where drain current $I_D=V_{DS}/R_{DS(on)}$ varies in proportion with drain voltage $V_{DS}$. In circuits with inductors switched at a high frequency or other current sources, the magnitude of $I_D$ is imposed by the circuit and $V_{DS}$ adjusts accordingly.

Figure 11C:
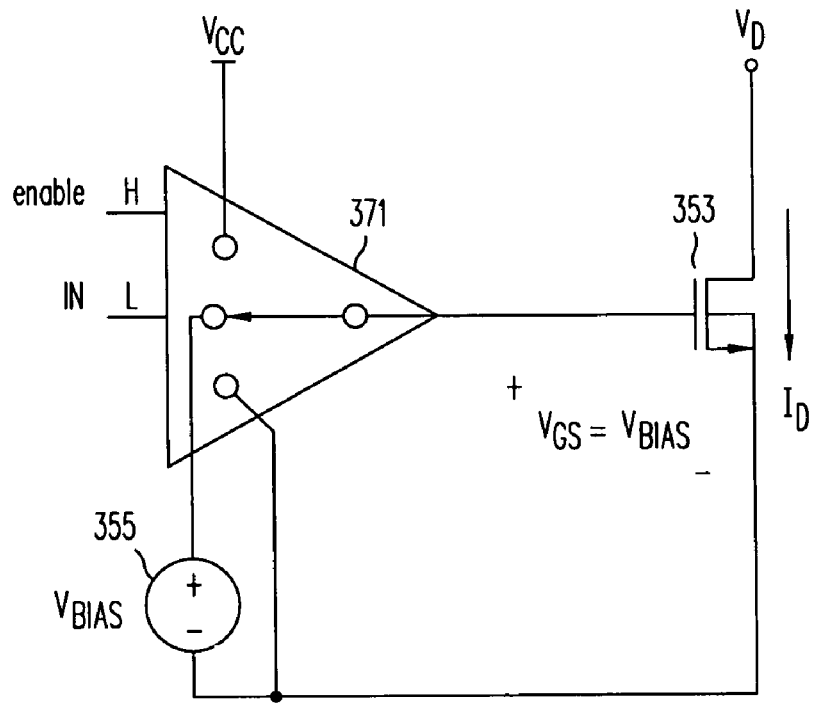
Figure 11D:
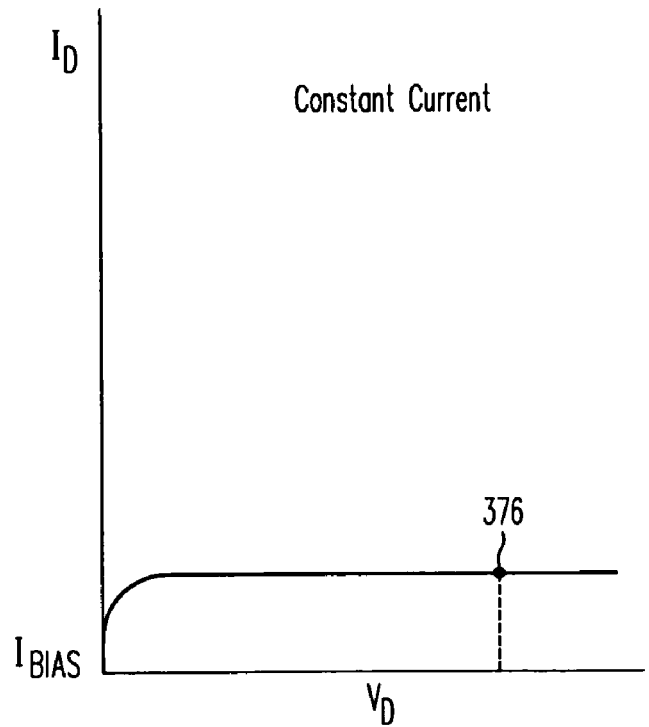

In the second-state, shown in FIG. 11C, gate buffer 371 biases the gate of power MOSFET 353 to a value $V_{GS}=V_{BIAS}$ set by voltage source or reference voltage source 355. MOSFET 353 then conducts a drain current $I_D=I_{BIAS}$ as shown at point 376 in FIG. 11D. In this mode, the drain current $I_D$ is relatively "constant," meaning its shows minimal dependence of the value of $V_{DS}$. It depends strongly however on the gate bias $V_{BIAS}$.

Figure 11E:
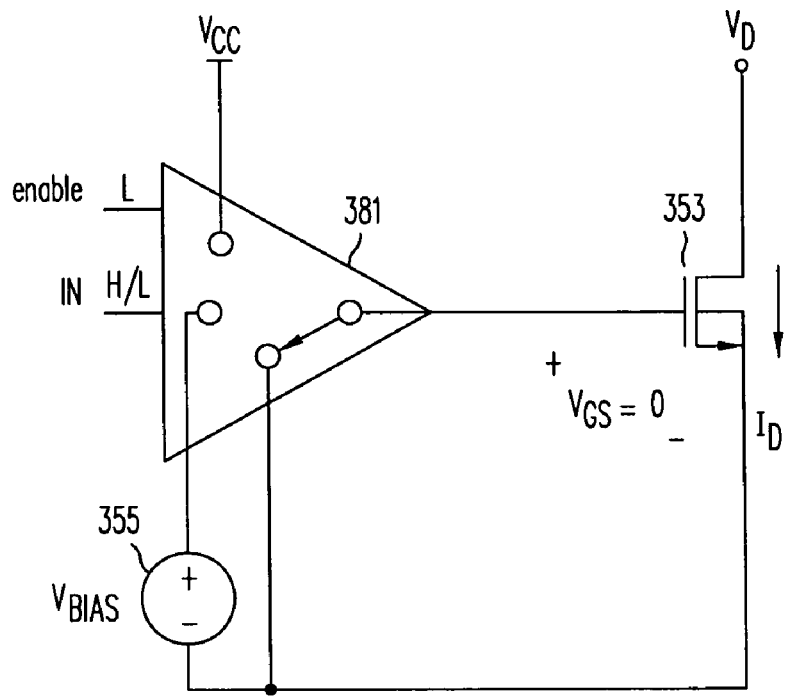
Figure 11F:
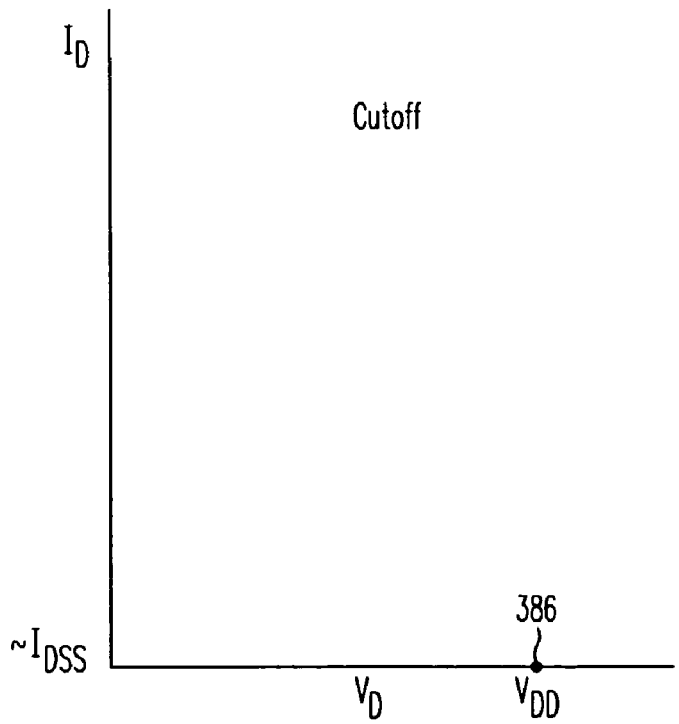

In the third state, shown in FIG. 11E, gate buffer 381 shorts the gate of MOSFET 353 to its source so that $V_{GS}=0$. Assuming that N-channel MOSFET 353 is an enhancement device with a positive threshold voltage, i.e. $V_{tn}>0$, then at $V_{GS}=0$, the device is in cut-off, where the off-state drain current $I_{DSS}$ is due to junction leakage as illustrated in FIG. 11F. While the leakage current at point 386 for a reverse bias of $V_{DD}$ appears to be zero, the actual $I_{DSS}$ leakage current plotted on a semi-log graph may show some voltage dependence, but generally it remains well below 1 μA over the power MOSFET's specified drain voltage range.

The operating conditions of a tri-state gate driver and power MOSFET in accordance with this invention are summarized in the following truth table:

TABLE 2

| IN | EN | $V_{GS}$ | MOSFET Operation | Drain Current | $g_{DS}$ |
|---|---|---|---|---|---|
| H | H | $V_{CC}$ | Linear Region | $I_D = V_{DS}/R_{DS(on)}$ | $1/R_{DS(on)}$ |
| L | H | $V_{BIAS}$ | Saturation Region | $I_D = I_{DBIAS}$ | ~constant |
| H/L | L | 0 | Cutoff | $I_D = I_{DSS}$ | ~constant |

Table 2 reveals that when enable is biased into a high state, the power MOSFET's conduction depends on the logic input IN but when enable is low, the MOSFET is off and operates independent of the IN signal. The output conductance $g_{DS}=dI_D/dV_{DS}$ is included as a qualitative measure of drain voltage sensitivity.

Figure 12A:
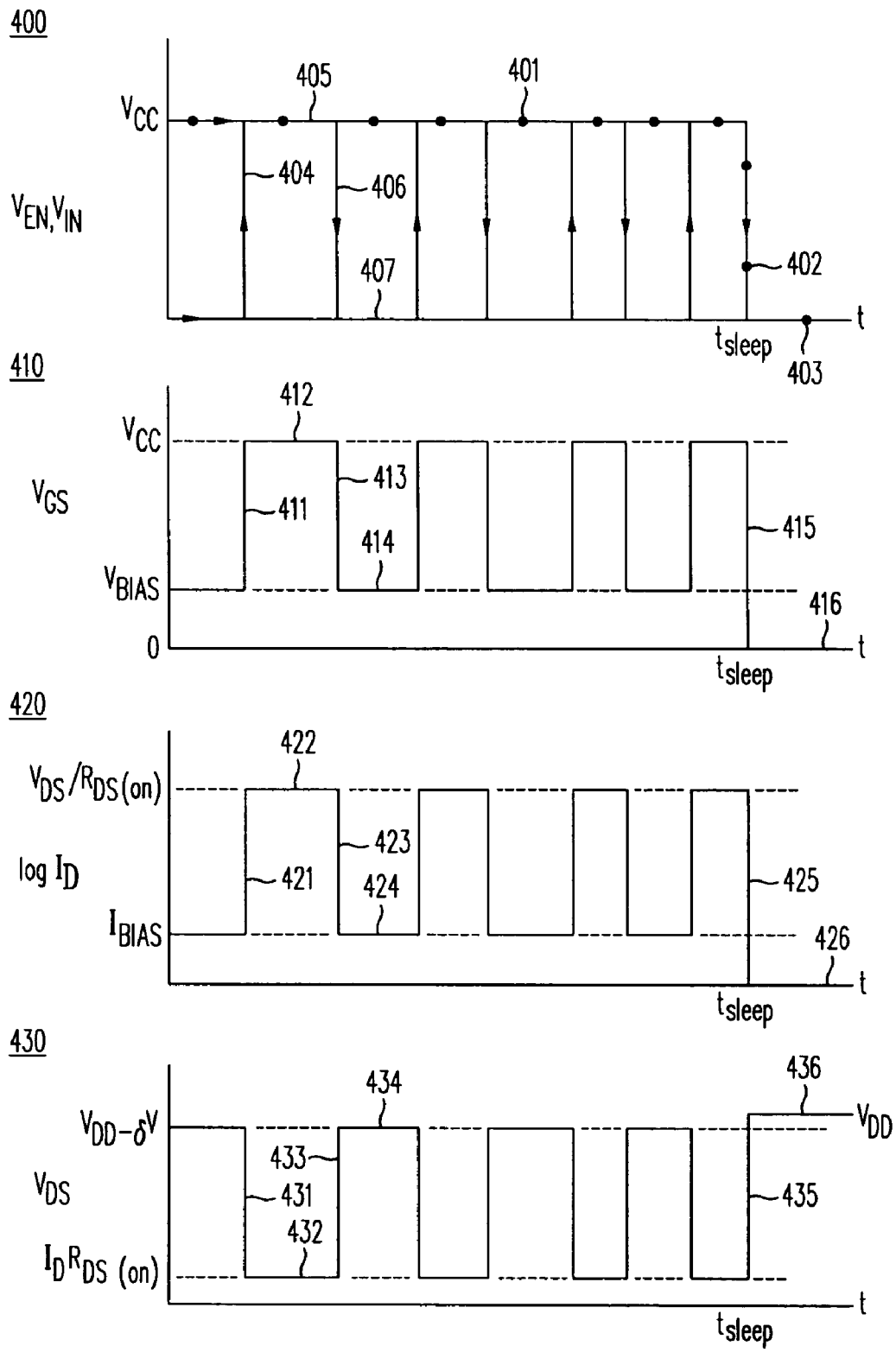
FIG. 12A shows graphs of voltage and current switching waveforms in a tri-state gate driver of this invention.

In a preferred embodiment, during high-frequency switching, the output $V_{GS}$ of the gate driver driving MOSFET 353 alternates between $V_{cc}$ and $V_{BIAS}$, as shown by the square wave 411, 412, 413 and 414 in graph 410 of FIG. 12A and follows the logic input voltage transitions 404, 405, 406 and 407 shown by the arrowed lines of graph 400. During this time, the enable signal EN shown by the dotted line remains high at $V_{cc}$ (curve 401). Similarly, as shown in the semilog graph 420, the drain current $I_D$ switches from $I_{DBIAS}$ to $V_{DS}/R_{DS(on)}$, as shown by the square wave 421, 422, 423 and 424, and as shown in graph 430, the drain voltage $V_{DS}$ alternates between $(V_{DD}-\delta V)$ and $I_D \cdot R_{DS(on)}$ with a waveform 431, 432, 433, and 434.

At time $t_{sleep}$, as MOSFET 353 enters the sleep or shutdown mode, the enable signal $V_{EN}$ is pulled low (curve 402) and biased at zero volts (curve 403), driving $V_{GS}$ down (curve 415) to zero volts (curve 416), a gate voltage lower than $V_{BIAS}$. In the shutdown mode, as shown in graph 420, the drain current $I_D$ drops (curve 425) to a near zero leakage current of magnitude $I_{DSS}$ (curve 426). And as shown in graph 430, $V_{DS}$ jumps (curve 435) to a voltage $V_{DD}$ illustrated by curve 435, slightly higher than the maximum drain voltage ($V_{DD}-\delta V$), shown by curve 434, during the switching of MOSFET 353.

Figure 12B:
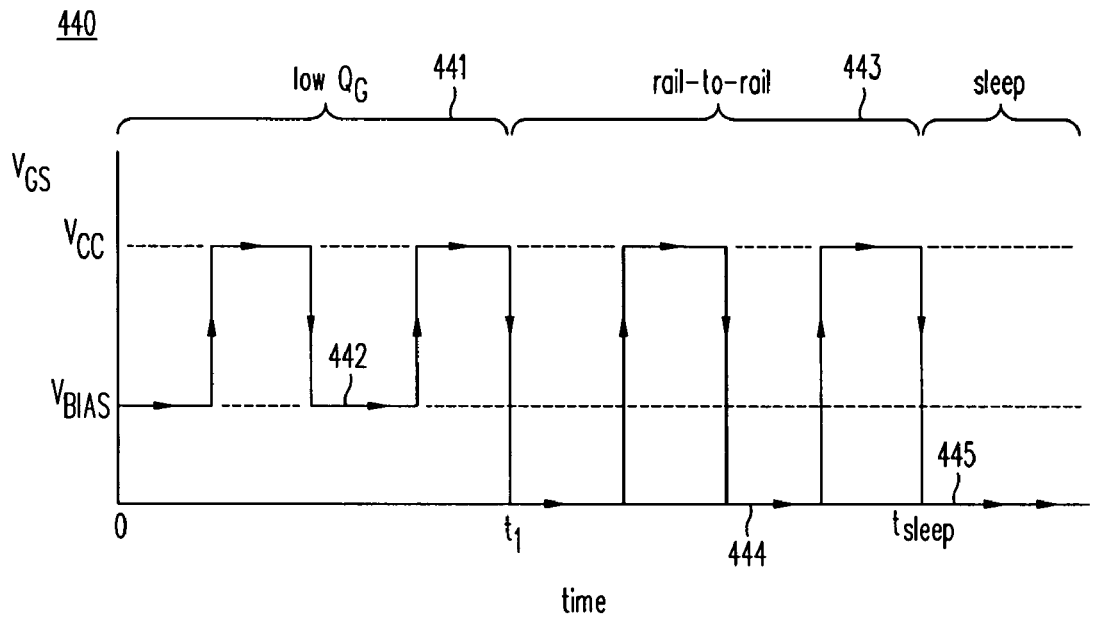
FIG. 12B is a graph of the gate voltage in a gate driver of this invention alternating between low-current and conventional gate drive techniques.

In an alternative embodiment, gate driver 352 may alternate between two different switching waveforms as illustrated in FIG. 12B. As shown in graph 440, before time $t_1$ the voltage output of gate driver 352 alternates between $V_{cc}$ and $V_{BIAS}$. During low $Q_G$ gate drive operation (region 441) in a gate driver in accordance with this invention, the minimum gate drive is the bias voltage $V_{BIAS}>0$ (curve 442).

As described previously, while the disclosed low gate charge gate drive technique can improve efficiency under some conditions, the power lost due to conduction losses associated with the ever-present bias current $I_{DBIAS}$ can lower efficiency. If such a condition occurs, operation of circuit 350 can be altered dynamically to facilitate conventional rail-to-rail gate drive (region 443), where at ti the gate voltage $V_{GS}$ alternates between $V_{cc}$ and ground (curve 444). The benefit of reduced gate charge swing is lost during the rail-to-rail interval. At time $t_{sleep}$, the MOSFET's gate is grounded 445 for some indefinite time corresponding to the sleep mode.

Figure 12C:
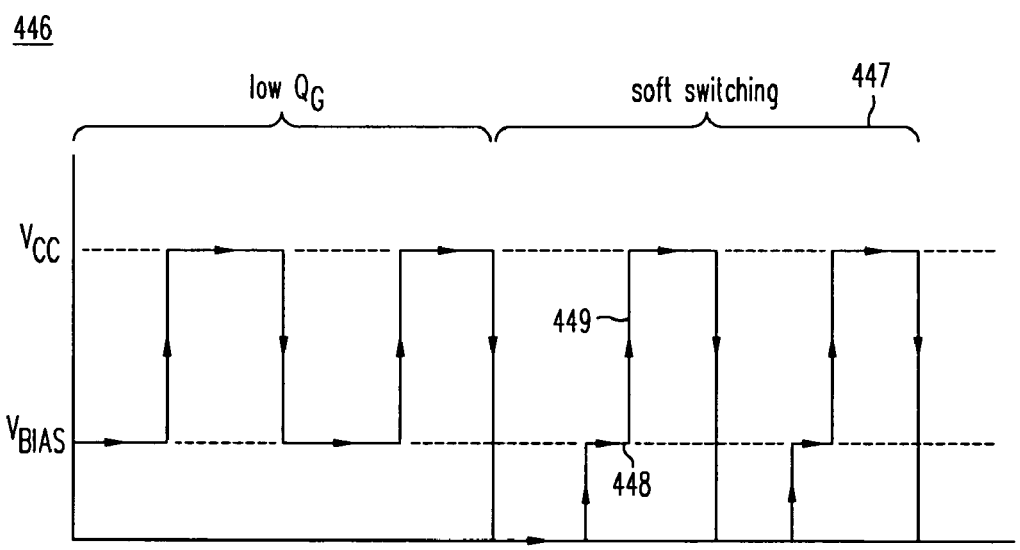
FIG. 12C is a graph of the gate voltage in a gate driver of this invention with a soft turn-on feature.

During rail-to-rail operation, as shown in graph 446 of FIG. 12C, circuit 350 can be operated to reduce turn-on related noise. During "soft switching" rail-to-rail operation (region 447), during each turn-on transition the gate voltage in first briefly raised to $V_{BIAS}$ for a short duration (curve 448) before being driven to $V_{cc}$ (curve 449). The stair-stepped gate waveform of curves 448 and 449 reduces the slew rate of the waveform at the drain of MOSFET 353 and can beneficially reduce noise.

Figure 13A:
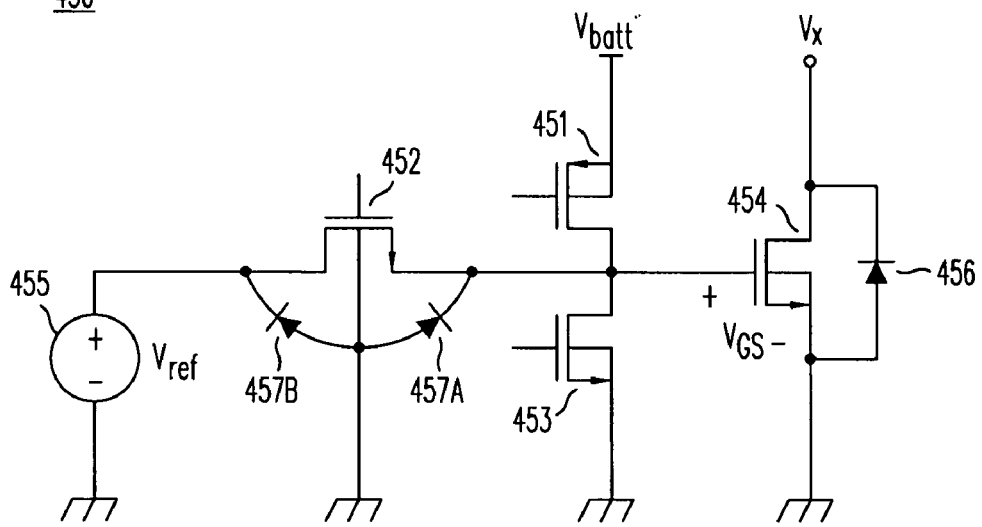
FIG. 13A is a circuit diagram of a gate driver containing a pass transistor.

Implementing Tri-state Low Loss Gate Drive: FIG. 13A-13E illustrate several circuits for implementing a power MOSFET gate drive with reduced drive losses. In FIG. 13A a complementary MOSFET gate driver comprising a high-side P-channel MOSFET 451 and low-side N-channel MOSFET 453 drives the gate of a power MOSFET 454. An N-channel pass transistor 452 also connects the gate of MOSFET 454 to $V_{ref}$, a reference voltage provided by a reference voltage source 455. The gate voltage on MOSFET 452 must be sufficiently positive relative to its source voltage to turn on MOSFET 452. Controlled by appropriate timing and logic circuitry, only one device is turned on at a time. When high-side MOSFET 451 is on, $V_{GS}=V_{batt}$ and MOSFET 454 is operating in its linear region. When MOSFET 452 is on, $V_{GS}=V_{ref}$ and MOSFET 454 is biased as a current source. When low-side MOSFET 453 is on $V_{GS}=0$ and MOSFET 454 is off.

As shown, the body of MOSFET 452 is grounded. The grounded body is needed to prevent parasitic diode conduction in MOSFET 452, since depending on the state of MOSFETs 451 and 453 the gate voltage $V_{GS}$ may be either greater than or less than the value of $V_{ref}$.

By grounding the body of MOSFET 452, the parasitic body diodes 457A and 457B remain permanently reverse-biased. If the body of MOSFET 452 is not grounded, but instead incorporates a source-body short, then one of these diodes would be in parallel with the channel of MOSFET 452, similar to diode 456 in parallel with MOSFET 454. A source-to-drain parallel diode would become forward biased in one of the various gate bias conditions, namely when $V_{GS}>V_{BIAS}$ or when $V_{GS}<V_{BIAS}$.

Figure 13B:
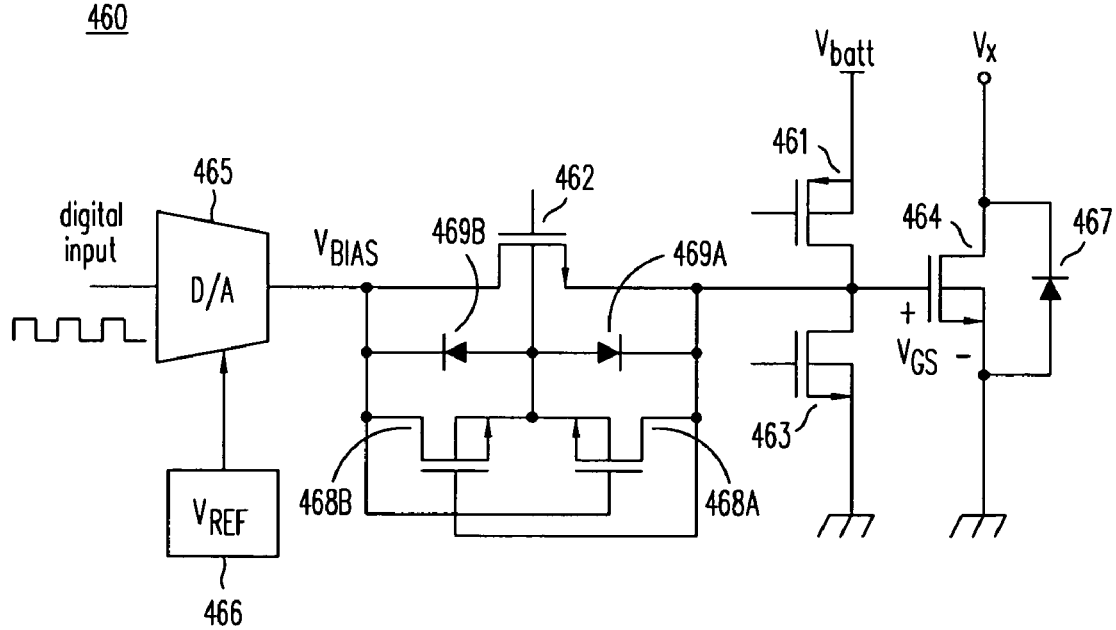
FIG. 13B is a circuit diagram of a gate driver containing a D/A converter.

Other circuit techniques, such as a body bias generator or "body snatcher" shown in FIG. 13B, can be used to avoid this problem. As shown in circuit 460, pass transistor 462 contains parasitic P-N diodes 469A and 469B. To prevent either diode from conducting, a network of two cross-coupled N-channel MOSFETs 468A and 468B bias the body potential of MOSFET 462 so that whichever diode becomes forward biased, it is shorted out by a parallel MOSFET, leaving the other parasitic diode reverse-biased and non-conducting.

For example, if $V_{GS}>V_{BIAS}$, diode 469B is forward-biased and diode 469A is reverse biased. Since $V_{GS}$ is the more positive terminal, N-channel MOSFET 468B turns-on and shorts out the forward-biased diode 469B, tying the body of MOSFET 462 to its more negative $V_{BIAS}$ terminal, turning off MOSFET 468A, and leaving diode 469A reversed-biased and in parallel with MOSFET 462. As a symmetrical circuit, whenever the polarity reverses the devices switch state and diode 469B becomes reverse-biased and parallel to pass transistor 462. The body bias generator technique can be applied to any pass transistor, e.g. in circuit 450. A pass transistor is defined herein as a MOSFET with neither source nor drain connected to a fixed supply rail.

Figure 13C:
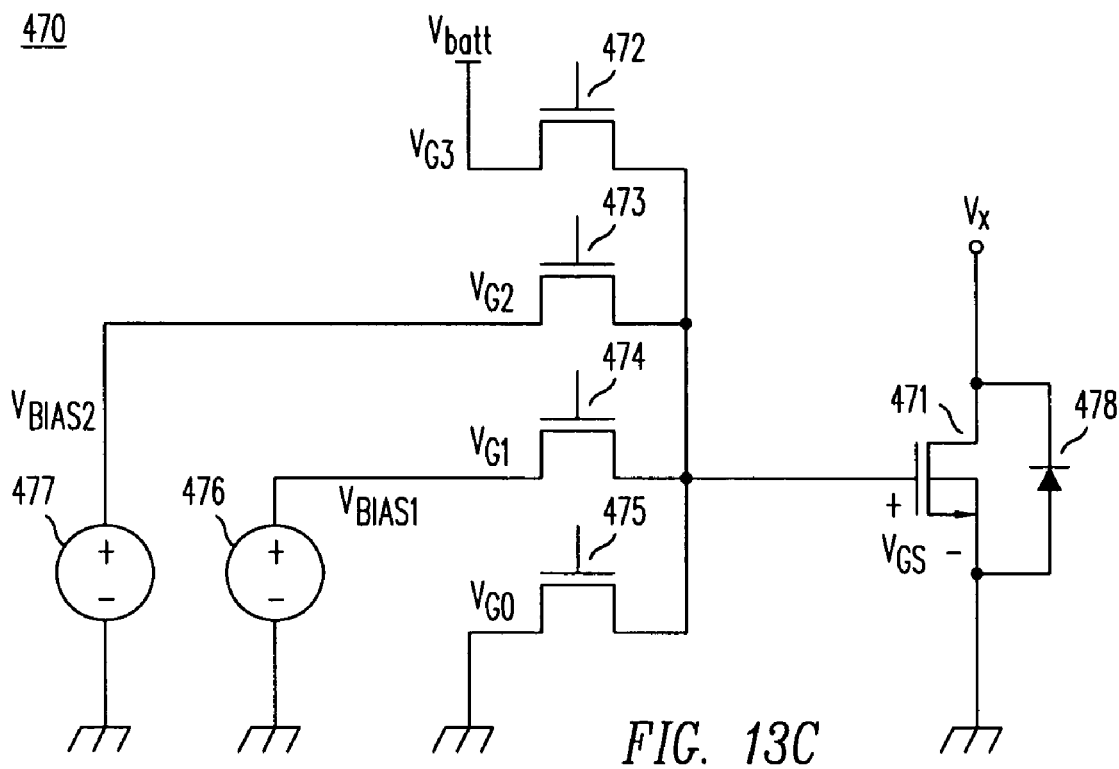
FIG. 13C is a circuit diagram of a gate driver containing multiplexed pass transistors.

Aside from the cross-coupled MOSFETs 468A and 468B, circuit 460 is Similar to circuit 450 except that a digital-to-analog converter 465 is substituted for fixed voltage reference 455. The output of the D/A converter 465 allows $V_{BIAS}$ to be adjusted using digital control of D/A converter 465. As shown, D/A converter 465 outputs a voltage up to a maximum amount $V_{ref}$ supplied by a voltage reference source 466. Otherwise, circuit 460 of FIG. 13B utilizes a complementary MOSFET gate driver comprising a high-side P-channel MOSFET 461 and a low-side N-channel MOSFET 463 driving the gate of power MOSFET 464 whenever N-channel pass transistor 462 is off. As before, the gate of MOSFET 462 must be biased sufficiently positive relative to its source to turn on MOSFET 462. FIG. 13C illustrates an implementation of a D/A converter-driven power MOSFET with low-drive losses made in accordance with this invention. As shown in circuit 470, the gate of a power MOSFET 471 is powered by a multiplexer comprising N-channel and/or P-channel pass transistors 472, 473, 474 and 475, only one of which may conduct at a time. Low-side MOSFET 475 biases the gate of power MOSFET 471 to $V_{G0}=0$ or ground, pass transistor MOSFET 474 biases the gate of power MOSFET 471 to $V_{G1}=V_{BIAS1}$, pass transistor MOSFET 473 biases the gate of power MOSFET 471 to $V_{G2}=V_{BIAS2}$, and high-side MOSFET 472 biases the gate of power MOSFET 471 to $V_{G3}=V_{batt}$. The body bias techniques described above may be employed as needed.

Figure 13D:
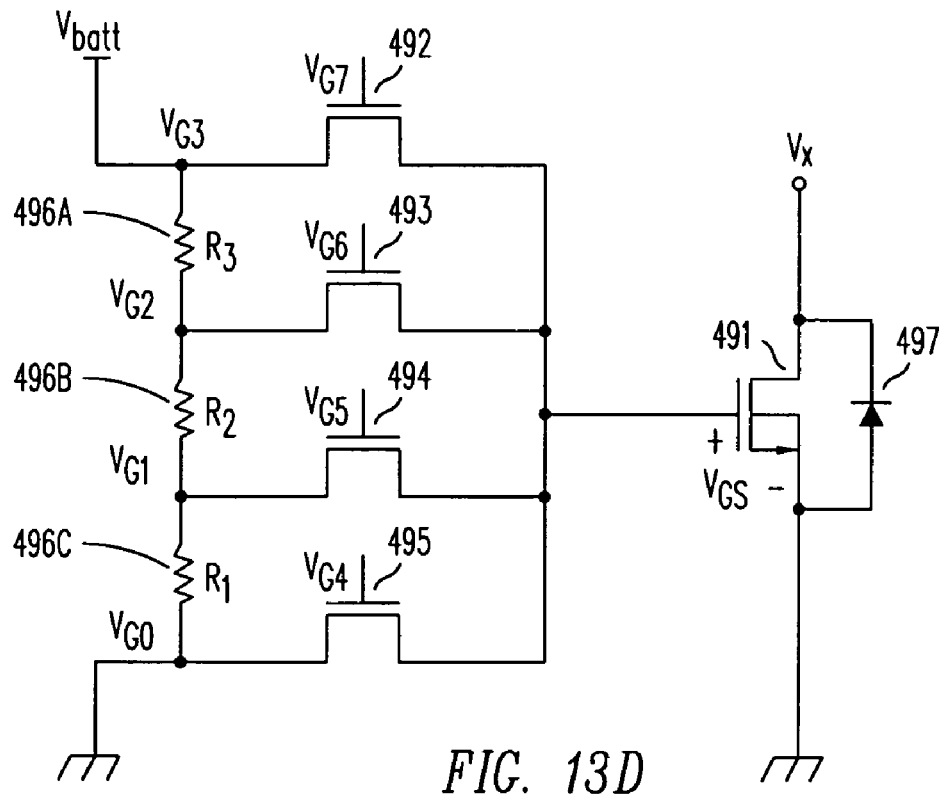
FIG. 13D is a circuit diagram of a gate driver containing a multiplexed resistor voltage divider.

FIG. 13D illustrates another D/A converter driven power MOSFET, where the bias conditions are determined by a resistor-divider network comprising resistors 496A, 496B, and 496C to produce bias points $V_{G2}$ and $V_{G1}$. The resistors are sized appropriately to set the bias points, for example, $V_{G2}=V_{batt}\cdot(R_2+R_3)/(R_1+R_2+R_3)$. The $V_{GS}$ gate voltage is selected using the analog multiplexer comprising MOSFETs 492, 493, 494, and 495. As shown, $V_{GS3}=V_{batt}$, $V_{GS0}=0$ with intermediate bias conditions in between those values of gate voltage. Any number of resistors may be used to form the divider network.

Figure 13E:
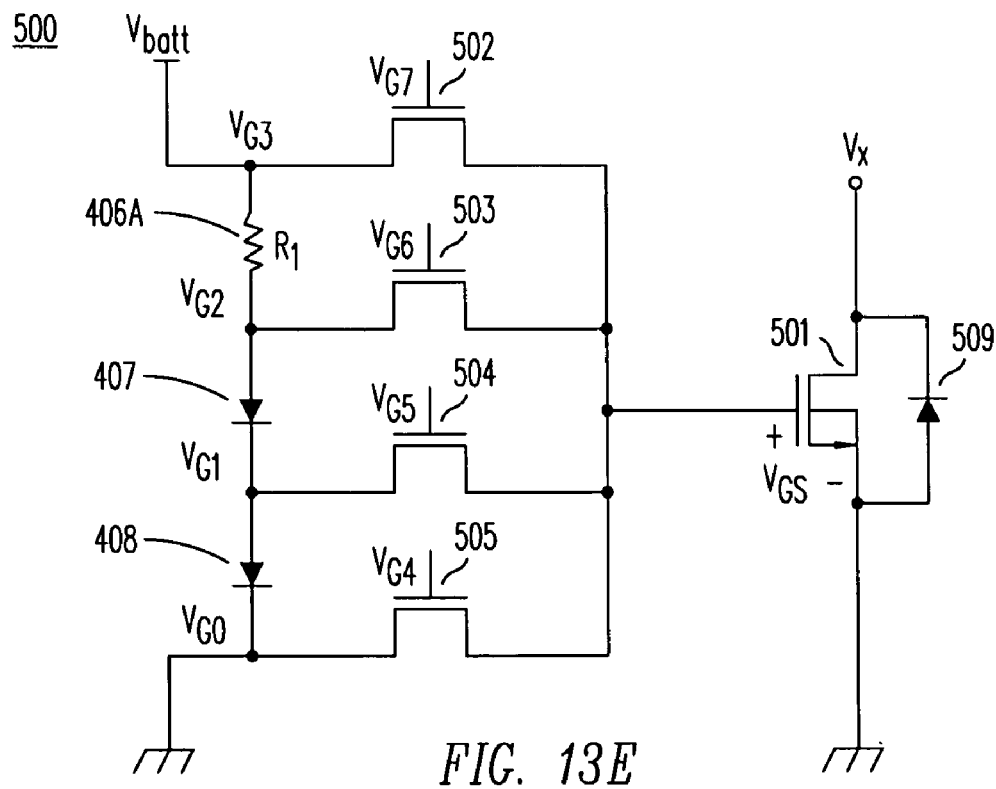
FIG. 13E is a circuit diagram of a gate driver containing a multiplexed resistor/diode voltage divider.

Alternatively, a combination of forward-biased diodes and resistors may also be used, as shown in FIG. 13E. The divider network need not comprise linear steps, but can include greater resolution near the targeted bias voltage. All of the D/A converter gate drive methods described provide some degree of control in setting the value of $I_{DBIAS}$ either during manufacturing or during operation.

Reduced Gate Drive Loss Circuit with Current Feedback:
While providing varying degrees of flexibility in setting the value of $I_{DBIAS}$, the above-mentioned circuits and gate drive methods employ a fixed bias voltage and do not automatically compensate for variations of the power MOSFET due to manufacturing or changing operating conditions.

Figure 14A:
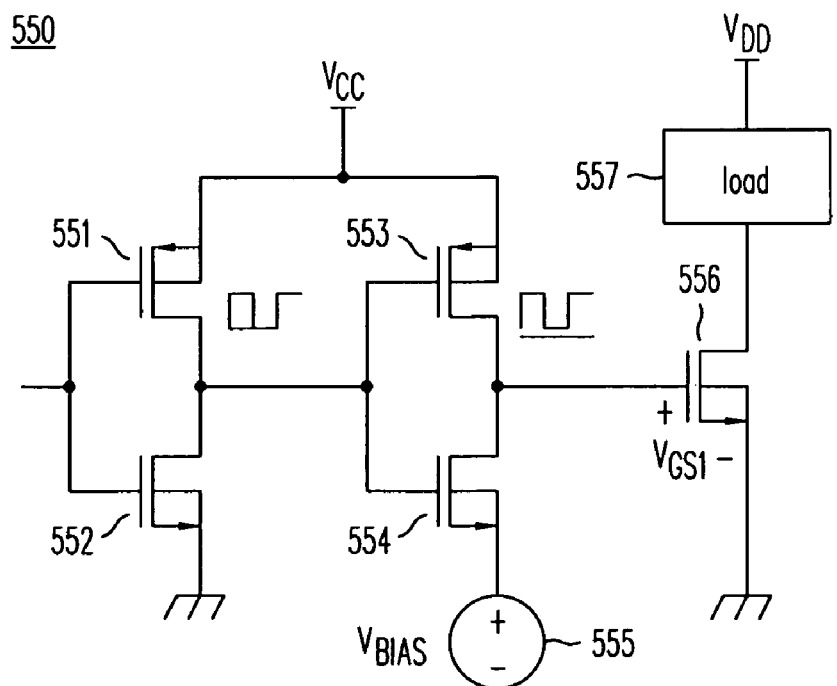
FIG. 14A is a circuit diagram of an open-loop gate driver without feedback.

For example, FIG. 14A illustrates a circuit 550 for implementing the gate driver 202 shown in FIG. 5. As shown, the gate of power MOSFET 556 is driven by a CMOS driver comprising high-side P-channel MOSFET 553 connected to $V_{cc}$ and N-channel MOSFET 554 with its source biased to reference voltage $V_{BIAS}$ provided by a voltage source 555. When MOSFET 554 is biased in its low-current on state, then $V_{GS1}=V_{BIAS}$, and the drain current $I_D$ is proportional to $(V_{BIAS}-V_t)$. Since $V_t$ varies with temperature and with manufacturing from lot-to-lot, then the current will vary accordingly.

Figure 14B:
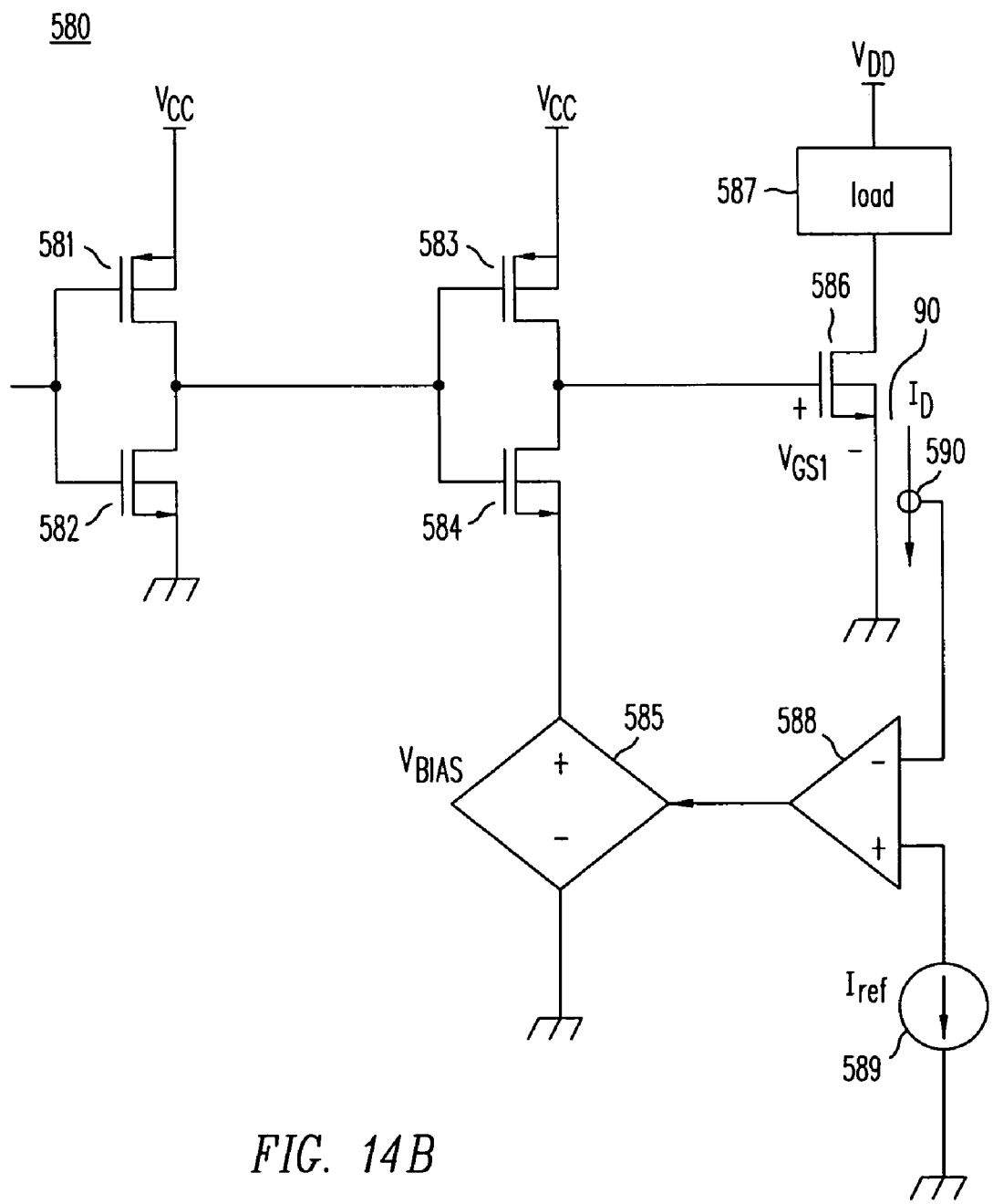
FIG. 14B is a circuit diagram of a gate driver with a current sensing feedback system.

To remove the influence of such variations, circuit 580 in FIG. 14B includes $I_D$ current feedback circuit 90 which dynamically adjusts the value of the reference voltage $V_{BIAS}$ provided by reference voltage source 585 using an amplifier 588 to force the drain current $I_D$ to a multiple of the reference current $I_{ref}$ provided by current source 589. The magnitude of the drain current is measured by a current sensor 590 and delivered to the negative input of amplifier 588. The feedback stabilizes the output current. For any increase in current $I_D$, the negative input to amplifier 588 decreases its output, lowering the magnitude of $V_{BIAS}$ and decreasing $I_D$, thereby offsetting the current increase.

Figure 14C:
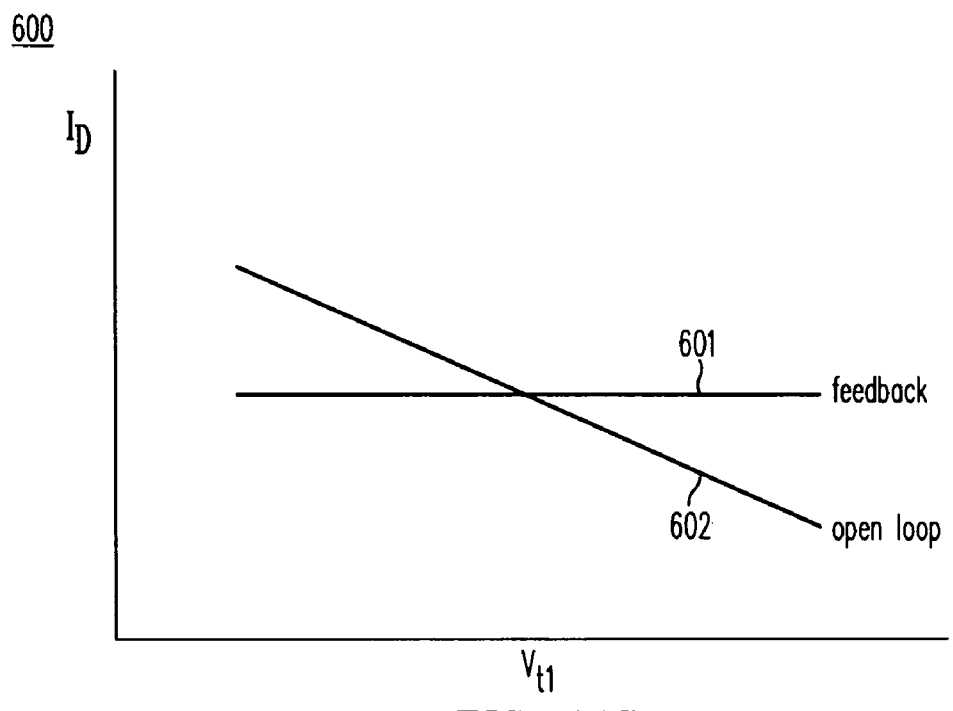
FIG. 14C is a graph comparing the stability of the drain current in open-loop and feedback gate drivers.
Figure 14D:
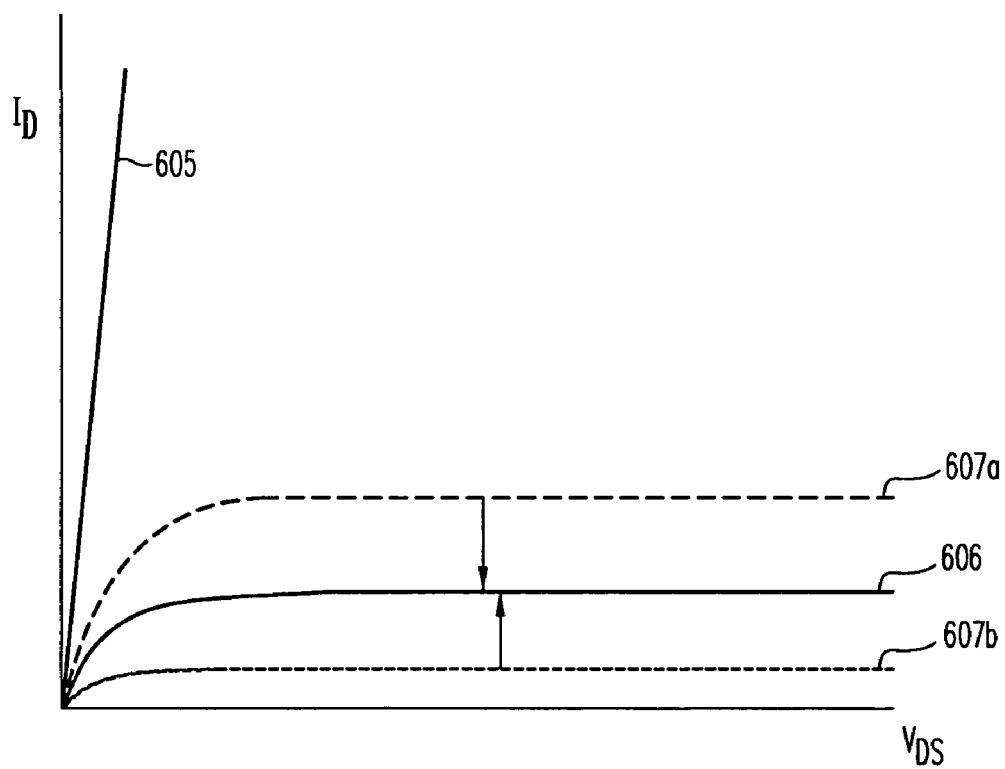
FIG. 14D is an I-V graph illustrating the control of the drain current in a gate driver having feedback.

The net effect is shown in graph 600 of FIG. 14C, where the influence of the power MOSFET's threshold voltage is plotted against the drain current $I_{DBIAS}$. With no feedback, any increase in $V_{t1}$ results in a commensurate reduction in drain current $I_D$ as shown by curve 602. In contrast, with feedback the drain current 601 remains constant. The effect of feedback is further illustrated in FIG. 14D, where a plot of $I_D$ versus $V_{DS}$ dynamically adjusts gate biasing to reduce an over-current 607A down to its target value 606, or conversely to increase a drain undercurrent from 607B up to the target value 606.

Figure 15A:
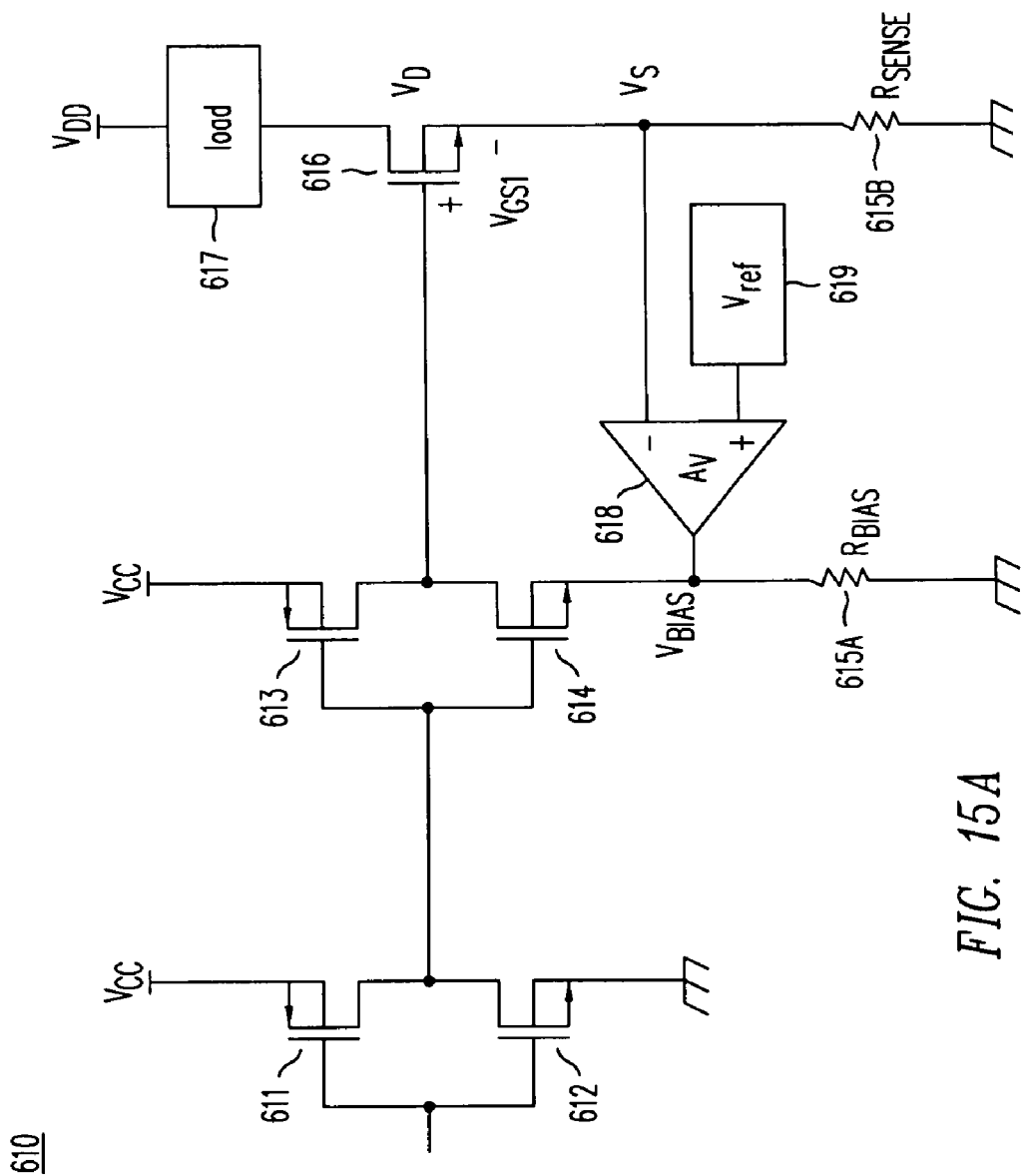
FIG. 15A is a circuit diagram of a gate driver with a feedback system utilizing a current sense resistor.

In the embodiment of this invention shown in FIG. 15A, $I_D$ drain current feedback is achieved using a sense resistor 615B. The voltage drop Vs across resistor 615B is amplified differentially by an operational amplifier 618 with respect to a reference voltage $V_{REF}$ provided by voltage source 619 to produce the voltage $V_{BIAS}$. The bias voltage $V_{BIAS}$ drives the gate of power MOSFET 616 Whenever MOSFET 614 is biased in an on-state condition. Current sense resistor 615B increases the total resistance in series with electrical load 617 and therefore reduces efficiency.

Figure 15B:
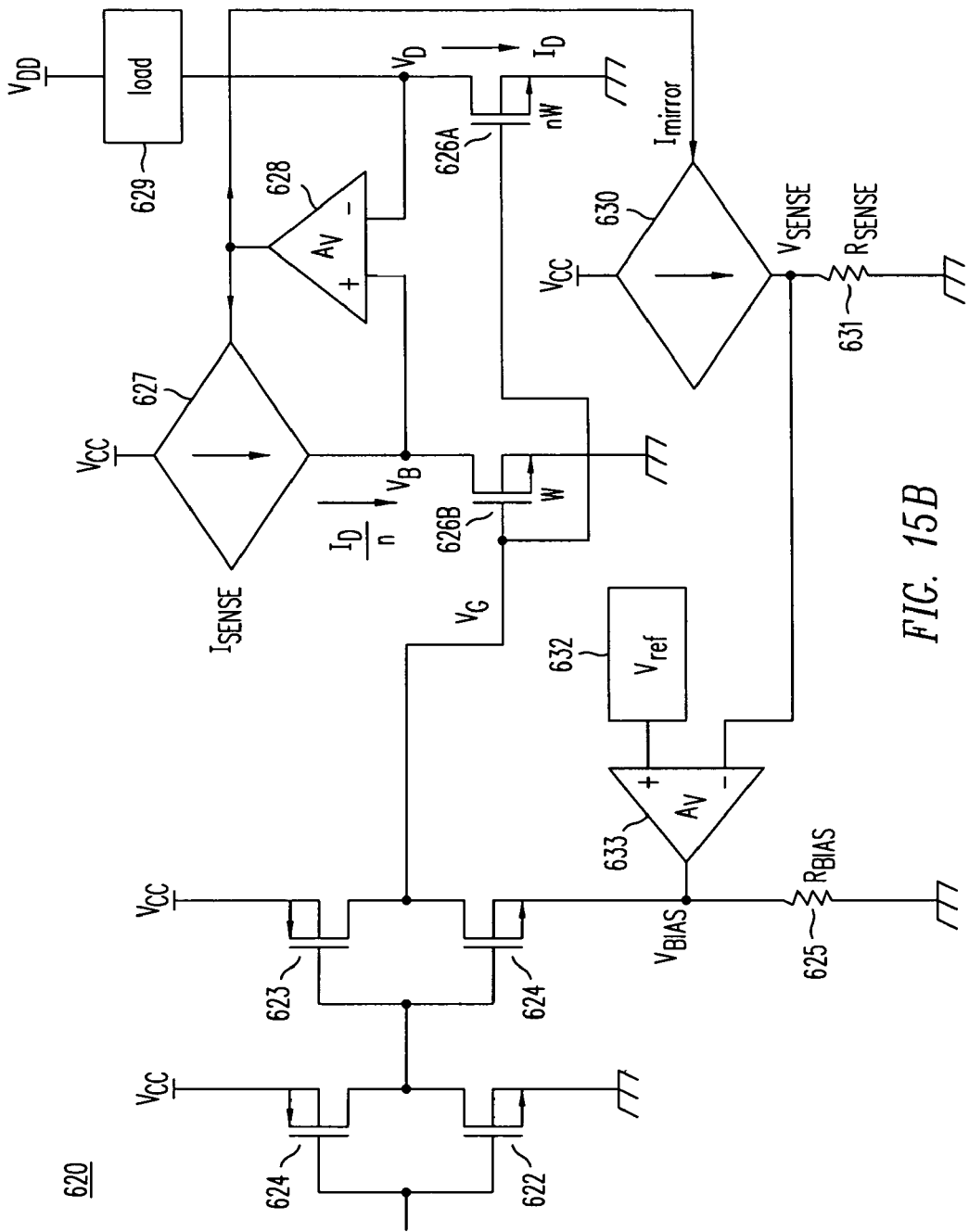
FIG. 15B is a circuit diagram of a gate driver with a feedback system utilizing a current mirror sense technique.

In another embodiment of this invention, shown in FIG. 15B, an improved circuit 620 utilizes a current mirror comprising a power MOSFET 626A with a gate width n·W and a sense MOSFET 626B with a gate width W, having common gate and source terminals and separate drain connections. Under gate control of a CMOS gate driver comprising a P-channel MOSFET 623 and an N-channel MOSFET 624, power MOSFET 626A controls the current $I_D$ through load 629. An operational amplifier 628 controls the current in current-source 627, forcing the drain voltage $V_\beta$ of MOSFET 626B to the same voltage as the drain of power MOSFET 626A. Given that the $V_{GS}$ of MOSFETs 626A and 626B are identical, when $V_\alpha=V_\beta$ the currents in the two devices are in a proportion determined by their relative gate widths n·W and W respectively. Accordingly, when power MOSFET 626A conducts a drain current $I_D$, the sense current of dependent current source 627 is given by $I_{sense}=I_D/n$, regardless of whether the MOSFET is in its linear or saturation region of operation.

The sense current $I_{sense}$ 627 is mirrored to a current source 630 and Converted into a voltage $V_{sense}$ across a sense resistor 631. Unlike resistor 615B in circuit 610, sense resistor 631 does not contribute to increased resistance in series with load 629. The sense voltage $V_{sense}$ is then amplified differentially by amplifier 623 with respect to a reference voltage $V_{REF}$ provided by a voltage source 632, producing an output voltage $V_{BIAS}$ on the source of MOSFET 624. Whenever $V_{GS1}=V_{BIAS}$, i.e. when MOSFET 624 is on and MOSFET 623 is off, then the current sense circuit and bias network forms a closed loop with negative feedback, offering stable control of the low drain current condition $I_{BIAS}$ in power MOSFET 626A. Any increase in the drain current $I_D$ in MOSFET 626A causes the $I_{sense}$ current supplied by current source 627 to increase to balance the voltages. This in turn increases the current $I_{mirror}$ and increases $V_{sense}$ applied to the negative input of operational amplifier 633. A larger negative input signal lowers $V_{BIAS}$, decreasing $V_{GS}$ on power MOSFET 626A and compensating for the increased current, thus holding $I_D$ constant despite variations in temperature or manufacturing.

One advantage of current-mirror circuit 620 over circuit 610 is that it doesn't introduce any additional voltage drop in series with the electrical load 629, and therefore improves energy transfer efficiency from the power source to load 629. Unlike the sense resistor technique embodied in circuit 610, the current mirror method embodied in circuit 620 can be used only with common-source split-drain MOSFETs such as MOSFETs 626A and 626B, where the drains of the MOSFETs can be separately connected. It cannot be used with common-drain devices current in discrete power MOSFET 656 without introducing a such as trench-gated vertical DMOS or planar vertical DMOS.

Figure 15C:
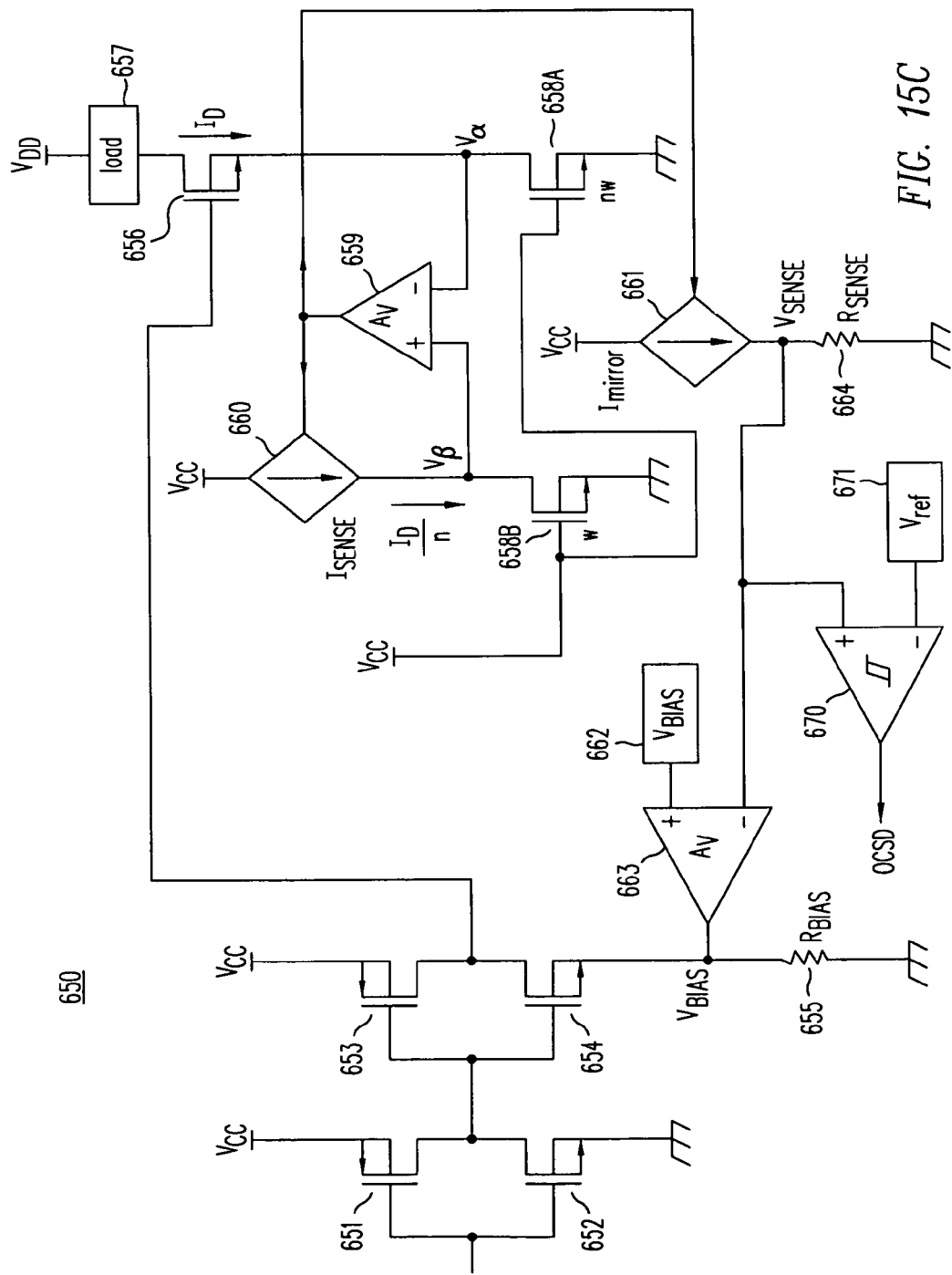
FIG. 15C is a circuit diagram of a gate driver with a feedback system utilizing a cascode current sense technique.

Alternatively, circuit 650 shown in FIG. 15C may be employed to accurately monitor the drain current in discrete power MOSFET 656 without introducing a large-value sense resistor in series with load 657. The sense current 660 is then used to control the magnitude of $I_{DB1As}$ during low current conduction and to sense short-circuit conditions in the high-current low-resistance state. This current sensing method is described in application Ser. No. 11/890,948, titled "Cascode Current Sensor For Discrete Power Semiconductor Devices," filed contemporaneously herewith and incorporated herein by reference.

Specifically, as shown in FIG. 15C, the gate bias applied to power MOSFET 656 is controlled by a gate driver comprising a P-channel 653 MOSFET and an N-channel MOSFET 654. The gate potential $V_{GS}$ may comprise either $V_{cc}$ when operating in a low-resistance condition, or $V_{BIAS}$ in the low-current state. The voltage $V_{BIAS}$ is controlled using feedback to produce a desired output current $I_{DBIAS}$ regardless of operating conditions or manufacturing process variations. Current sensing is achieved using a low-resistance low-voltage MOSFET 658A with gate width n·W connected in series with power MOSFET 656. Power MOSFET 656 may comprise a low or high-voltage device and need not be integrated with the other components in circuit 650. The current sensing element includes a current mirror MOSFET 658B of gate width W fabricated monolithically with the larger MOSFET 658A and sharing a common source and split drain.

In a preferred embodiment, both MOSFETs 658A and 658B have their gates biased to the supply voltage $V_{cc}$ and are therefore biased into their low-resistance linear-regions of operation. Even at high $I_D$ drain currents, the low-resistance of MOSFET 658A insures that voltage $V_\alpha$ at the drain of MOSFET 658A remains low. The drain voltage of MOSFET 658B is designated $V_\beta$. A differential amplifier 659 controls the current $I_{sense}$ in a dependent current source 660 until the drain voltages of MOSFETs 658A and 656B are equal, i.e. $V_\beta = V_\alpha$. Under this condition, $I_{sense} = (I_D/n)$, and accurately measures the current $I_D$ flowing in power MOSFET 656, regardless of its bias condition.

The value of $I_{sense}$ is mirrored using a current mirror 661 into a proportional current $I_{mirror}$ in series with a sense resistor 664 to produce a sense voltage $V_{sense}$ proportional to $V_\alpha$. Because of the voltage gain of operational amplifier 659, the signal $V_{sense}$ can be made large despite the fact that the voltage $V_\alpha$ is small. The value of $V_{sense}$ is amplified differentially by an operational amplifier 663 with respect to a reference voltage $V_{BIAS}$ produced by a voltage source 662.

Under closed-loop operation, when MOSFET 654 is on and MOSFET 653 is off, the output of amplifier 663 has an output voltage $\sim V_{BIAS}$ when $I_D$ is equal to a target current $I_{DBIAS}$. If $I_D$ is too low, the current in $I_{mirror}$ will also decrease, thereby lowering the $V_{sense}$ voltage to the negative input of operational amplifier 663. A lower negative input voltage results in an increase in the output voltage of amplifier 663 which in turn drives the gate of power MOSFET 656 to a higher bias, increasing $I_D$ to its target value.

When N-channel 654 is off and P-channel 653 is on, power MOSFET 656 is biased into its high-current state and the output of operational amplifier 663, dropped across resistor 655, is ignored. The voltage $V_{sense}$ may still be used to monitor the current $I_D$ in MOSFET 658A for purposes of short-circuit and over-current protection. The voltage $V_{sense}$, as shown, is compared to a reference voltage $V_{ref}$ provided by a voltage source 671, by a hysteretic comparator 670. When $V_{sense}$ exceeds $V_{ref}$, the current $I_D$ is too high and over-current shut-down, i.e. OCSD comparator 670 generates a high logic output signal informing the system that an over-current condition has occurred and that power MOSFET 656 should be shut off.

Thus, by utilizing current sensing techniques, including sense resistors, current mirrors, cascode current-sensing, or any other method, by and combining the current sensing technique with negative feedback to modulate a gate bias $V_{BIAS}$, the value of drain current $I_{DBIAS}$ can be accurately controlled. By controlling the value of $I_{DBIAS}$ the minimum gate charge $Q_{GL}$ remaining on a power MOSFET's gate in the low state of each switching cycle can also be controlled consistent with the graph of FIG. 9 and in accordance with the inventive method to minimize gate drive losses.

Reduced Gate Drive Loss Circuit with Current Trimming: While the above techniques use current feedback to set the value of the $I_{DBIAS}$ low-current condition, the current accuracy and circuit complexity may be more than is required for many applications. Since a saturated MOSFET has a drain current given by the equation $$I_D = k(V_{GS} - V_t)^2$$

which is linearly proportional to the transconductance factor and proportional to the square of $(V_{GS} - V_t)$, the threshold voltage is the dominant process parameter affecting saturation current. As such, reasonably accurate current control can be achieved by electrical trimming of the circuit to compensate for threshold variability as part of the fabrication process.

Figure 16A:
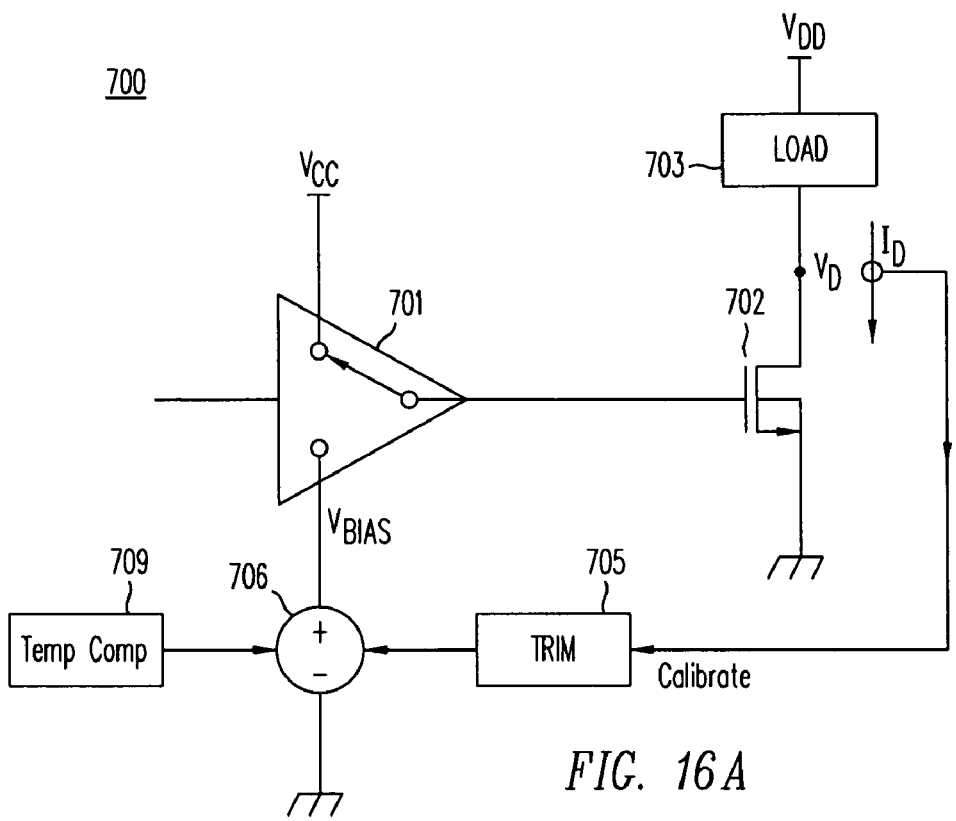
FIG. 16A is a conceptual circuit diagram of a trimming circuit for a gate driver of this invention.

As shown in FIG. 16A, a power MOSFET gate driver 701, with low drive losses, made in accordance with this invention drives the gate of a power MOSFET 702 with a voltage alternating between $V_{cc}$ for low-resistance operation and $V_{BIAS}$ for low-current conduction. A fixed voltage source 706 sets the value of $V_{BIAS}$. After fabrication, the current $I_D$ is measured by test equipment and used to adjust a trim network 705 until the measured value of $I_D$ matches the target value of the bias current $I_{DBIAS}$. This calibration is preferably performed at room temperature.

Since the saturation current also varies with temperature, primarily due to threshold voltage, an optional temperature compensation circuit 709 can be used to adjust $V_{BIAS}$ 706 to maintain a semi-constant value of $I_D$ over temperature.

Figure 16D:
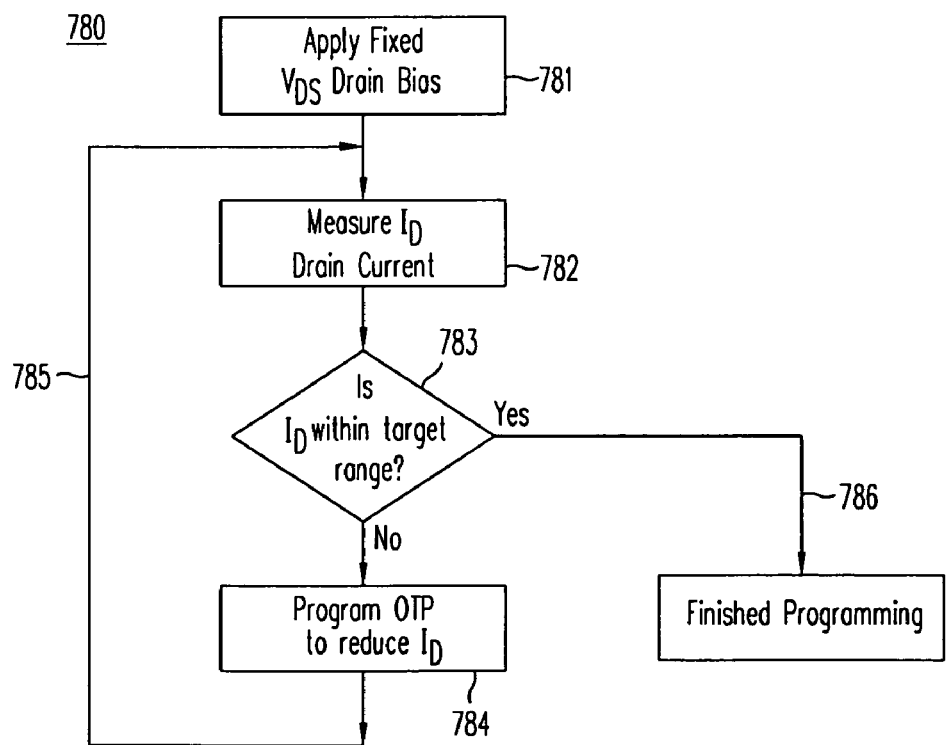
FIG. 16D is a flow chart of a calibration algorithm for the trimming circuit.
Figure 16B:
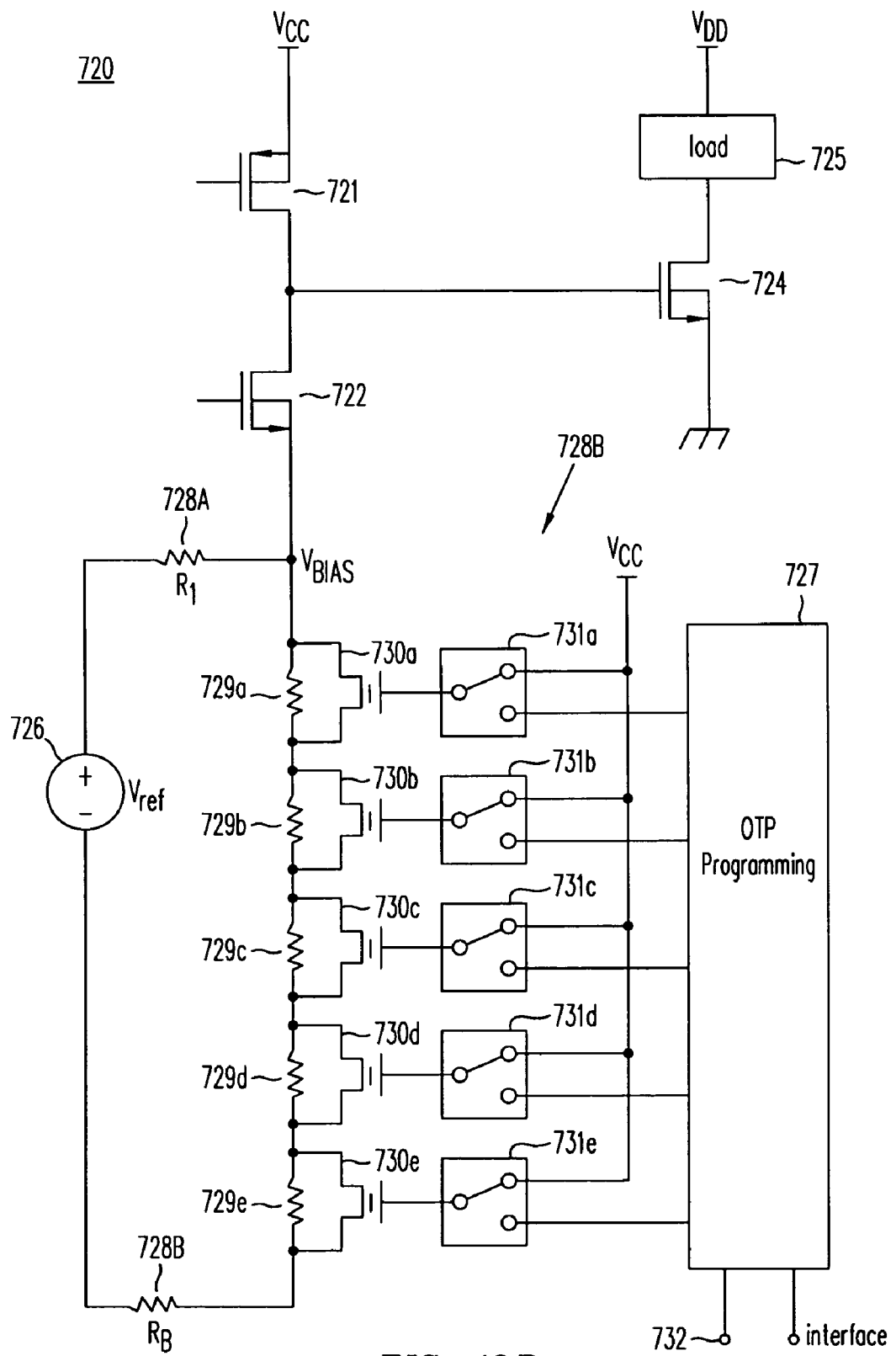
FIG. 16B is a circuit diagram of a trimming circuit for a gate driver of this invention containing one-time programmable MOSFETs.

A trimmed gate drive circuit 720, shown in FIG. 16B, includes a gate driver with MOSFETs 721 and 722, a power MOSFET 724, and a load 725. The remaining components are used to implement the trimmed bias voltage $V_{BIAS}$, including a reference voltage source 726 providing a reference voltage $V_{ref}$, a resistor divider network 728, including resistors 728A and 728B and 729a-729e, one time programmable (OTP) MOSFETs 730a-730e, bias multiplexers 731a-731e and an OTP programmer 727. Resistors 728A and 728B have values $R_A$ and $R_B$, respectively.

After fabrication, OTP MOSFETs 730a-730e exhibit normal threshold voltages well below $V_{cc}$. During operation, multiplexers 731a-731e bias the gate of each of OTP MOSFETs 730a-730e to $V_{cc}$, turning each of OTP MOSFETs 730a-730e on and shorting out the one of resistors 729a-729e with which it is connected in parallel. For example, in an un-programmed state, OTP MOSFET 730c has a threshold of 0.7V. When multiplexer 731c connects the gate of OTP MOSFET 730c to $V_{cc}$, then it conducts and shorts out corresponding resistor 729c.

In an un-programmed state, all resistors 729a-729e are shorted, so that $V_{BIAS}$ is set by the 728 resistor divider to be $$V_{BIAS} = \left(\frac{R_A}{R_A + R_B}\right) \cdot V_{ref}$$

Figure 16C:
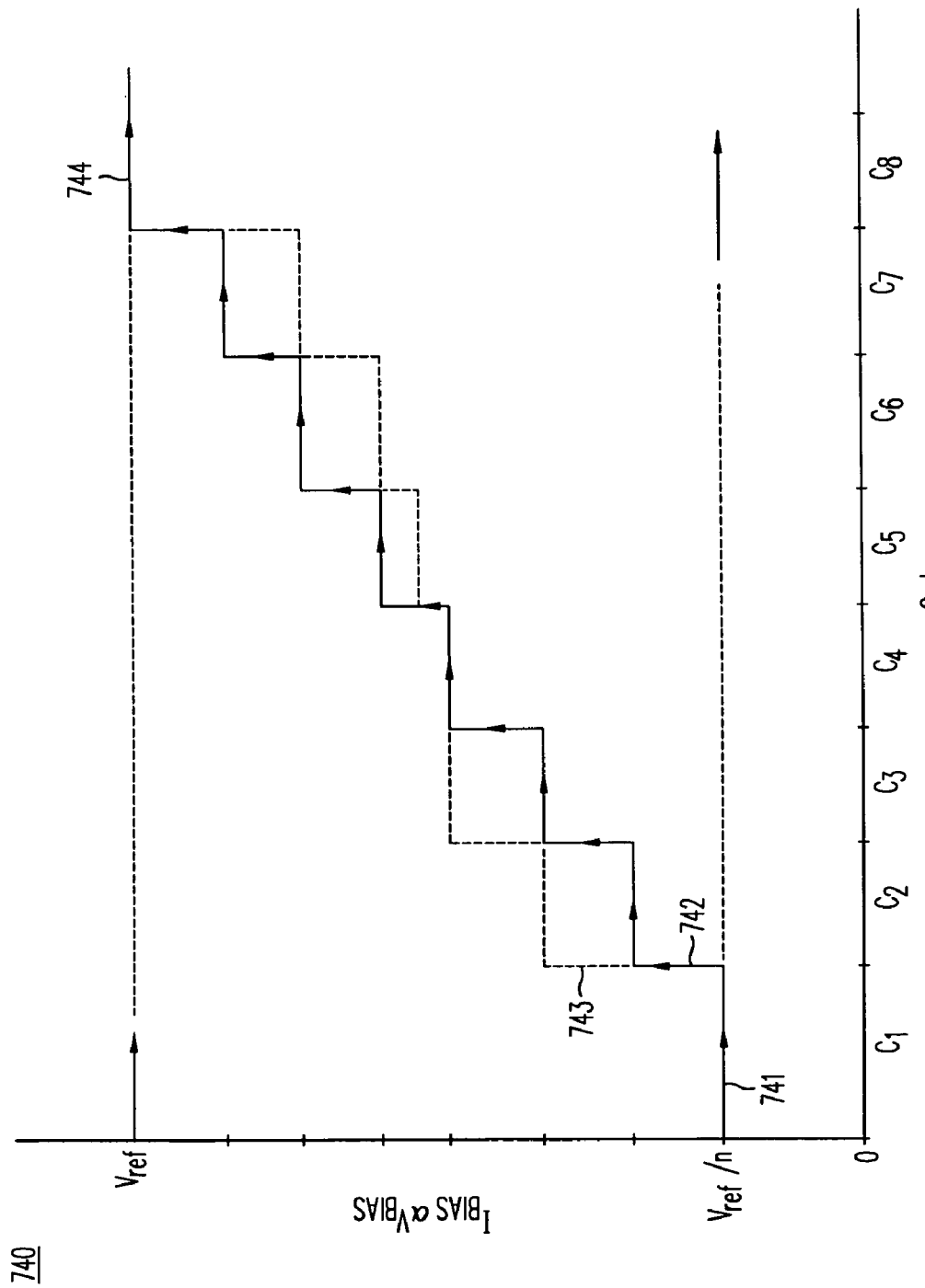
FIG. 16C is a graph of a bias programming code for the gate driver of FIG. 16B.

Programming involves connecting the gate of any given one of OTP MOSFETs 730a-730e to programmer 727, and biasing the device into saturation at high voltages. The process creates hot carriers and charges the gate oxide permanently increasing the threshold voltage of the device to a higher value so that under normal operation the OTP MOSFET will not conduct. The parallel one of resistors 729a-729e is thereby inserted into voltage divider 728, adjusting the resistor divider ratio and the value of $V_{BIAS}$. The values of resistors 729a-729e may be equal or different, so that trimming may be linear or non-linear. Depending on the values of resistors 729a-729e, the trimmed output can range from as high as $V_{ref}$ to some fraction $V_{ref}/m$. The codes may be arranged in any number of combinations, such as those shown in FIG. 16C. As shown, codes C1 to C8 correspond to various resistor combinations depending on which resistors are shorted by un-programmed OTP MOSFETs 730a-730e. The code C1 starts with $V_{BIAS}$ at the lowest voltage (line 741) and increases (line 742) as various bits are programmed by turning off individuals ones of OTP MOSFETs 730a-730e. An alternative pattern, indicated by line 743, uses non-linear steps and ends with a maximum voltage (line 744) of magnitude $V_{ref}$.

While many specific programming sequences are possible, a general programming algorithm 780 for trimming $V_{BIAS}$ is shown in FIG. 16D, where a fixed voltage $V_{DS}$ is applied to power MOSFET 724 operated in its low-current, i.e. $I_{DBIAS}$, state. After applying this bias in step 781, the drain current $I_D$ is measured in step 782, and in step 783 the drain current $I_D$ is compared to a target range of $I_{DBIAS}$ within some tolerance. If the current is too low, one or more of OTP MOSFETs 730a-730e are programmed in step 784, increasing $V_{BIAS}$ and the current $I_D$. The process is then repeated (step 785), until the measured $I_D$ reaches the specified range for $I_{DBIAS}$ and then the program terminates (step 786).

Figure 16E:
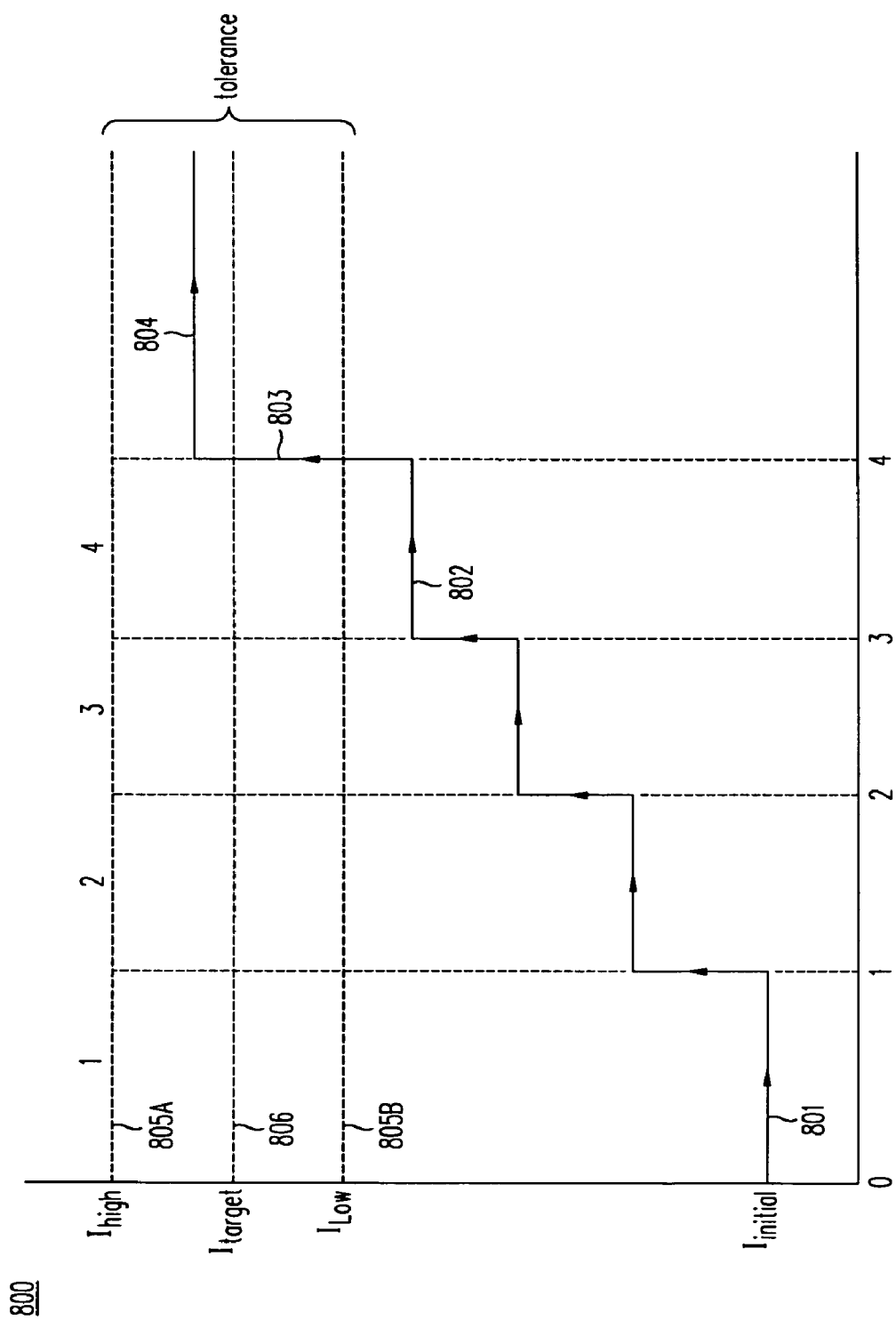
FIG. 16E is a graph of a programming sequence for the trimming circuit.

An example of $I_{DBIAS}$ programming is shown in FIG. 16E, where a product after manufacture has a current of magnitude $I_{initial}$ (line 801) and during each iteration the current increases until it reaches a value represented by line 802, just outside the target range of $I_{Dlow}$ to $I_{Dhigh}$. In the fifth iteration the current increases to a value represented by line 804, which is within the target range, and the program is then terminated. While the program may be performed at room temperature, the same program may also be used at higher temperatures.

Alternatively, programming may be performed at two temperatures—one to correct for errors in the initial current and the second trimming to compensate the effect of threshold variations with temperature. Temperature compensation circuit 709 in FIG. 16A may assume a certain temperature coefficient, e.g. at −3 mV/° C. to avoid the need for trimming at high temperatures. Either way, the accuracy of $I_{DBIAS}$ is improved using trimming, and therefore more tightly controls the gate charge swing of MOSFET 702.

Reduced Gate Drive Loss Circuit with Current Mirror Drive: In the techniques described above, the magnitude of $I_{DBIAS}$ depends on the power MOSFET's threshold. In one case, active trimming was employed to adjust the value of $V_{BIAS}$ to produce a targeted value of $I_{DBIAS}$. In the other case, current feedback was employed to force $I_D$ to a target value $I_{DBIAS}$ under closed loop operation.

Figure 17A:
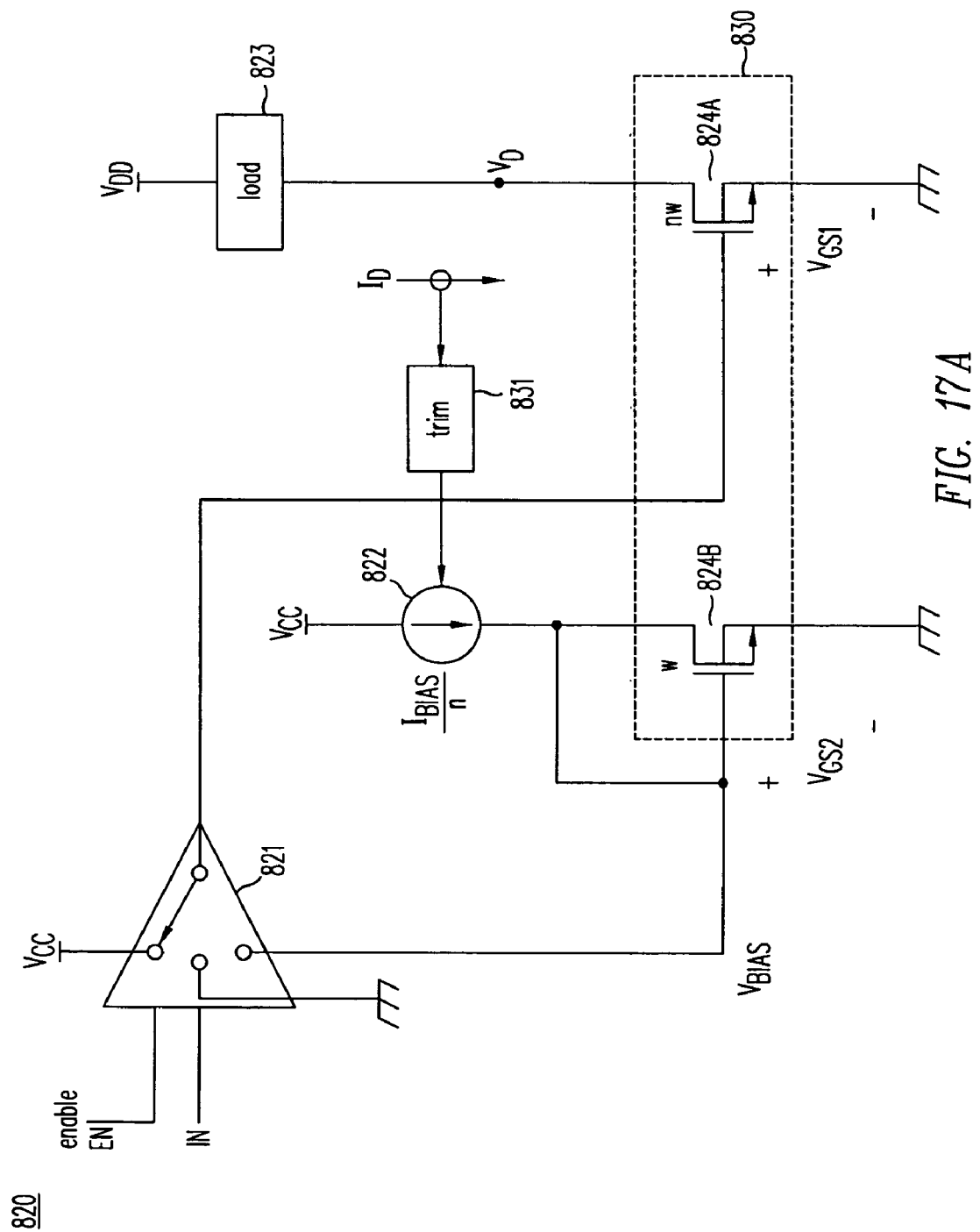
FIG. 17A is a circuit diagram of a gate driver utilizing a current mirror to control the current in the MOSFET in the low-current condition.

In another embodiment of this invention, a reduced gate drive loss circuit utilizes a gate drive technique insensitive to threshold fluctuations in the power MOSFET. One such method to eliminate sensitivity to threshold utilizes the current-mirror gate drive circuit 820 shown in FIG. 17A. Without actually sensing the current, the technique employs the principle that two MOSFETs fabricated monolithically will exhibit substantially matched threshold voltages and under identical gate drive conditions, in saturation the drain currents will scale roughly in proportion to MOSFET gate width.

Specifically MOSFETs 824A and 824B are fabricated monolithically as a current mirror 830. Power MOSFET 824A is a low-resistance device with a large gate width n·W, while current mirror MOSFET 824B has a gate width of W—a factor of "n" smaller than the gate width of MOSFET 824A. The gate of MOSFET 824A is driven by gate driver 821 with options of selecting among three inputs—$V_{cc}$, $V_{BIAS}$ and ground. When $V_{cc}$ is selected, power MOSFET 824A is biased into a low-resistance state, operating in its linear region. When ground is selected, power MOSFET 824A is cut off and no current flows.

Figure 17B:
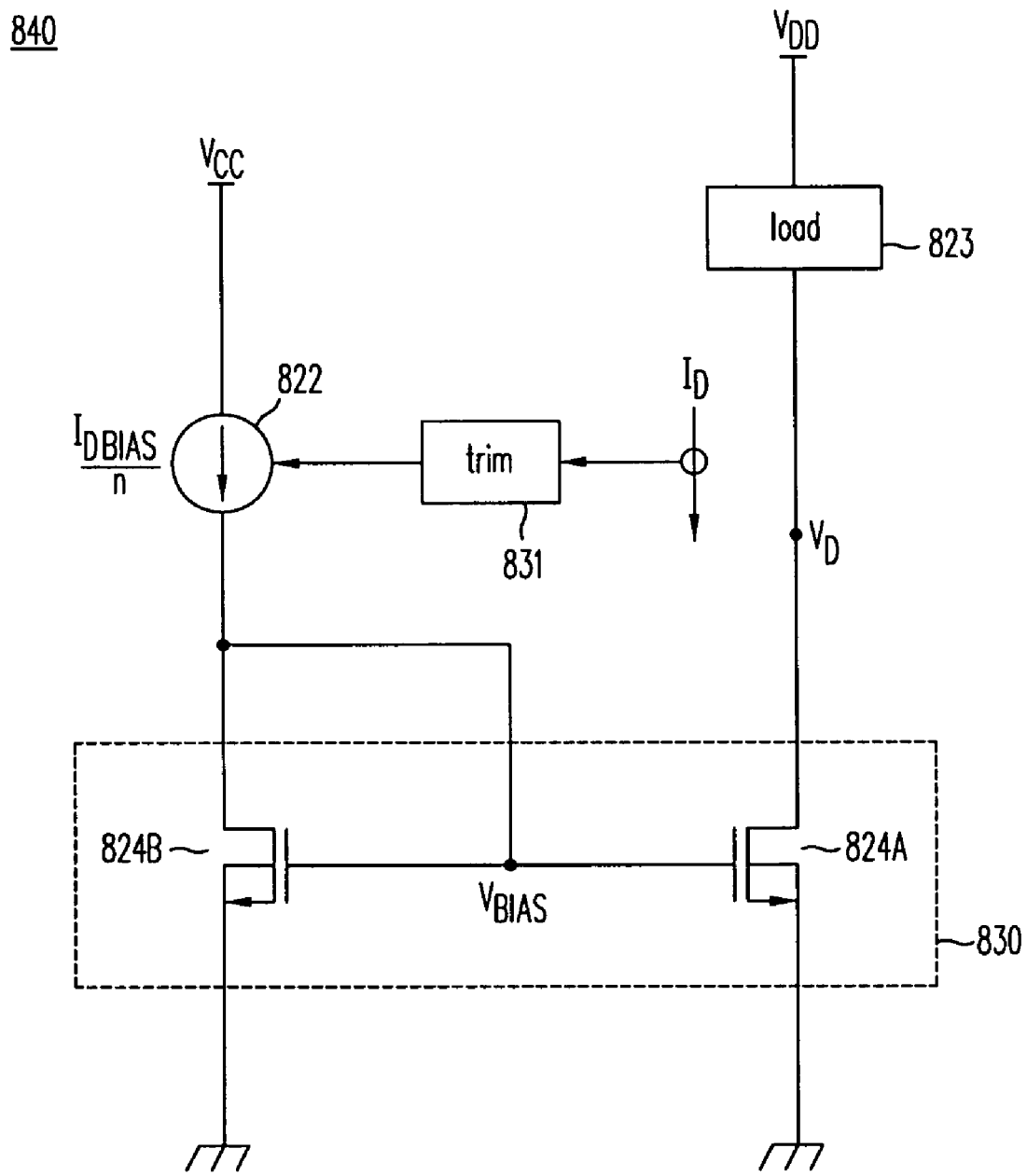
FIG. 17B is a circuit diagram showing a trimming circuit to adjust the size of the mirror current.

When $V_{BIAS}$ is selected, the gate drive of power MOSFET 824A is determined by a bias network comprising a current source 822 and mirror MOSFET 824B. The equivalent circuit in this mode is shown in FIG. 17B, where a fixed current source 822 is chosen or preset to supply the target current $I_{DBIAS}$ divided by the width ratio "n". This current $I_{DBIAS}/n$ is fed into MOSFET 824B having its drain and gate shorted, i.e. threshold-connected. Threshold-connected MOSFET 824B is self biasing, meaning it will adjust its gate voltage to a potential $V_{BIAS}$ needed to carry the drain current supplied by fixed current source 822. By definition, a threshold-connected MOSFET operates in its saturation region, since $V_{DS}=V_{GS}$ guarantees the saturation condition $V_{DS}>(V_{GS}-V_t)$ is always met.

This $V_{BIAS}$ voltage, the gate voltage of MOSFET 824B, is also the gate voltage on large power MOSFET 824A. Provided that $V_{DS}$ on MOSFET 824A is large, meaning $I_{DBIAS}$ is not too great, then it is also in saturation and the currents in MOSFETs 824A and 824B should scale by the ratio "n". If current source 822 is preset to a current $I_{DBIAS}/n$, then the current in MOSFET 824A and load 823 should be $$I_D = n \cdot (I_{DBIAS}/n) = I_{DBIAS}$$

Since the threshold voltages of MOSFETs 824A and 824B are closely matched, any shift in $V_t$ due to process variations or temperature occurs in both devices and is rejected as common-mode noise. For example if $V_t$ drops to $(V_t-\Delta V_t)$ for any reason, then $V_{BIAS}$ drops by a commensurate amount to $(V_{BIAS}-\Delta V_t)$. The gate drive on MOSFET 824A changes from $(V_{BIAS}-V_t)$ to a value $$(V_{BIAS}-\Delta V_t)-(V_t-\Delta V_t)=(V_{BIAS}-V_t)$$

which is the same as the original condition. The effect of threshold variation is therefore cancelled using the current-mirror gate drive.

Any error in setting $I_{DBIAS}$ is therefore due to secondary factors such as short-channel effects, series resistance, quasi-saturation, etc. If needed, a trim circuit 831 can be employed to adjust the value of current source 822 as part of the manufacturing process.

Figure 18:
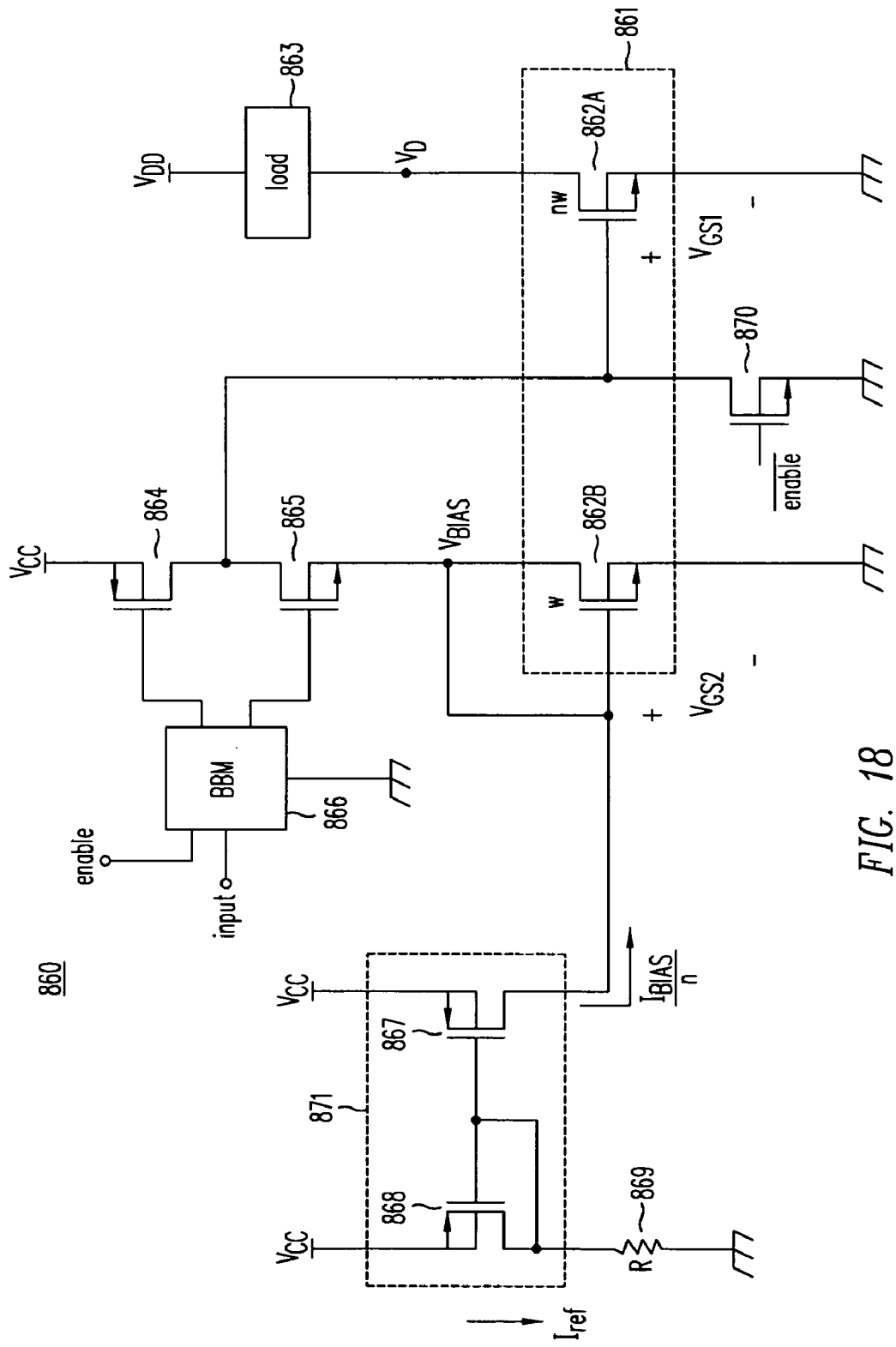
FIG. 18 is a circuit diagram of a gate driver including a P-channel current mirror.

A current mirror gate drive circuit 860 without trimming is shown in FIG. 18. Gate drive circuit 860 comprises a current-mirror MOSFET pair 861, a load 863, a tri-state gate drive including MOSFETs 864, 865 and 870, a break-before-make (BBM) buffer 866 and a bias current generator MOSFET pair 871 with a resistor 869. As shown, power MOSFET 862A may be biased into a low-resistance state when P-channel MOSFET 864 is on, into a fully-off non-conducting state when N-channel MOSFET 870 is on and into saturation at a low controlled current $I_{DBIAS}$ when N-channel MOSFET 865 is on. Under the control of BBM buffer 866 only one of MOSFETs 864, 865 and 870 may be on at one time.

MOSFET pair 861 comprises power MOSFET 862A with gate width n·W and smaller current mirror MOSFET 862B with gate width W. With voltage $V_{BIAS}$ on the gate and drain of MOSFET 862B, the device conducts a drain current $I_{DBIAS}/n$. This current is established by current mirror 871 comprising P-channel MOSFETs 867 and 868. Threshold-connected MOSFET 868 conducts a current $I_{ref}$ set by resistor 869, having a magnitude of $$I_{ref} = \frac{V_{cc} - V_{tp}}{R} \equiv \frac{I_{DBIAS}}{n}$$

The current $I_{ref}$ is mirrored by MOSFET 867 to drive MOSFET 862B. Given P-channel threshold voltage $V_{tp}$, the value R of resistor 869 is adjusted to set this current to a target value $I_{DBIAS}/n$.

Figure 19:
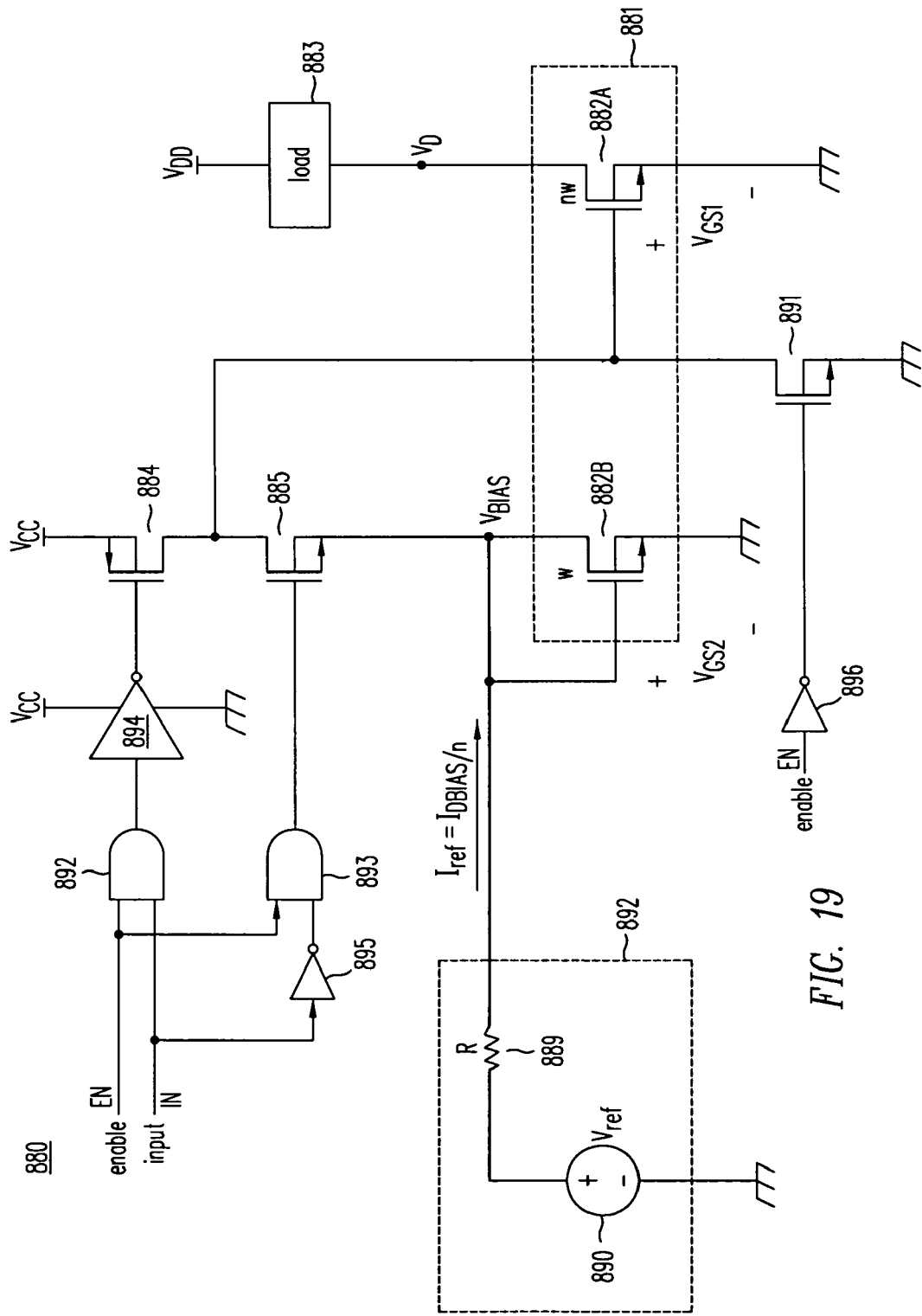
FIG. 19 is a circuit diagram of a gate driver including circuitry for converting a reference voltage to a reference current to control the size of the current in the MOSFET in the low-current state.

FIG. 19 illustrates a current-mirror gate drive 880 made in accordance with this invention, wherein $I_{ref}$ is implemented using a voltage reference source 890 providing a voltage $V_{ref}$ and a resistor 889. The current $I_{ref}$ is then given by $$I_{ref} = \frac{V_{ref} - V_m}{R} \equiv \frac{I_{DBIAS}}{n}$$

where the value of R is chosen so that $I_{ref}=I_{DBIAS}/n$.

Circuit 880 also illustrates another implementation of a tri-state gate driver. The gate driver comprises a $V_{cc}$-connected P-channel MOSFET 884, a $V_{BIAS}$-connected N-channel MOSFET 885 and ground-connected N-channel MOSFET 891 being driven by logical "AND" gates 892 and 893 and by inverters 894, 895, and 896. Whenever enable signal EN is a logic low state the output of AND gates 892 and 893 are low turning MOSFET 885 off, and inverted by inverter 894, the output of AND gate 892 biases the gate of P-channel MOSFET 884 high, turning it off. The low enable signal inverted by inverter 896 drives ground MOSFET 891 with a high gate bias, turning it on and shorting the gate of power MOSFET 882A to ground. In such a state, MOSFET 891 is on and MOSFETs 884 and 885 are off.

When enable EN is high, the output of inverter 896 is low and MOSFET 891 is off. With EN as a high input to AND gates 892 and 893, their outputs depend solely on the state of the input pin IN. When IN is high, inverter 895 drives the input and output of AND gate 893 low and turns off N-channel MOSFET 885. A high input, however, drives the input and output of AND gate 892 high and inverted by inverter 894, the gate of P-channel MOSFET 884 low, turning on P-channel 884. In such a state, MOSFET 884 is on and MOSFETs 885 and 896 are off.

Conversely when EN is high and IN is low, inverter 895 drives the input and output of AND gate 893 high and turns on N-channel MOSFET 885. A low input, however, drives the input and output of AND gate 892 low and inverted by 894, the gate of P-channel MOSFET 884 high, turning off P-channel 884. In such a state, MOSFET 885 is on and MOSFETs 884 and 896 are off.

Using combinational logic, only one of the three MOSFETs, 884, 885 or 891 driving the gate of power MOSFET 882A, is on at any one time. Circuit 880 therefore operates as a tri-state gate driver to control the conduction and gate charge swing of power MOSFET 882A in accordance with this invention. Table 3 is a truth table for the tri-state gate driver's logic.

TABLE 3

| Input | | Logic | | | Power MOSFET 882A | | |
|---|---|---|---|---|---|---|---|
| EN | IN | 884 | 885 | 891 | $V_{GS1}$ | State | $I_D$ |
| L | L/H | off | off | On | 0 V | cut off | ~0 |
| H | H | on | off | Off | $V_{cc}$ | low-resistance | $V_{DD}/R_{DS(on)}$ |
|  | L | off | on | Off | $V_{BIAS}$ | saturated | $I_{DBIAS}$ |

Figure 20:
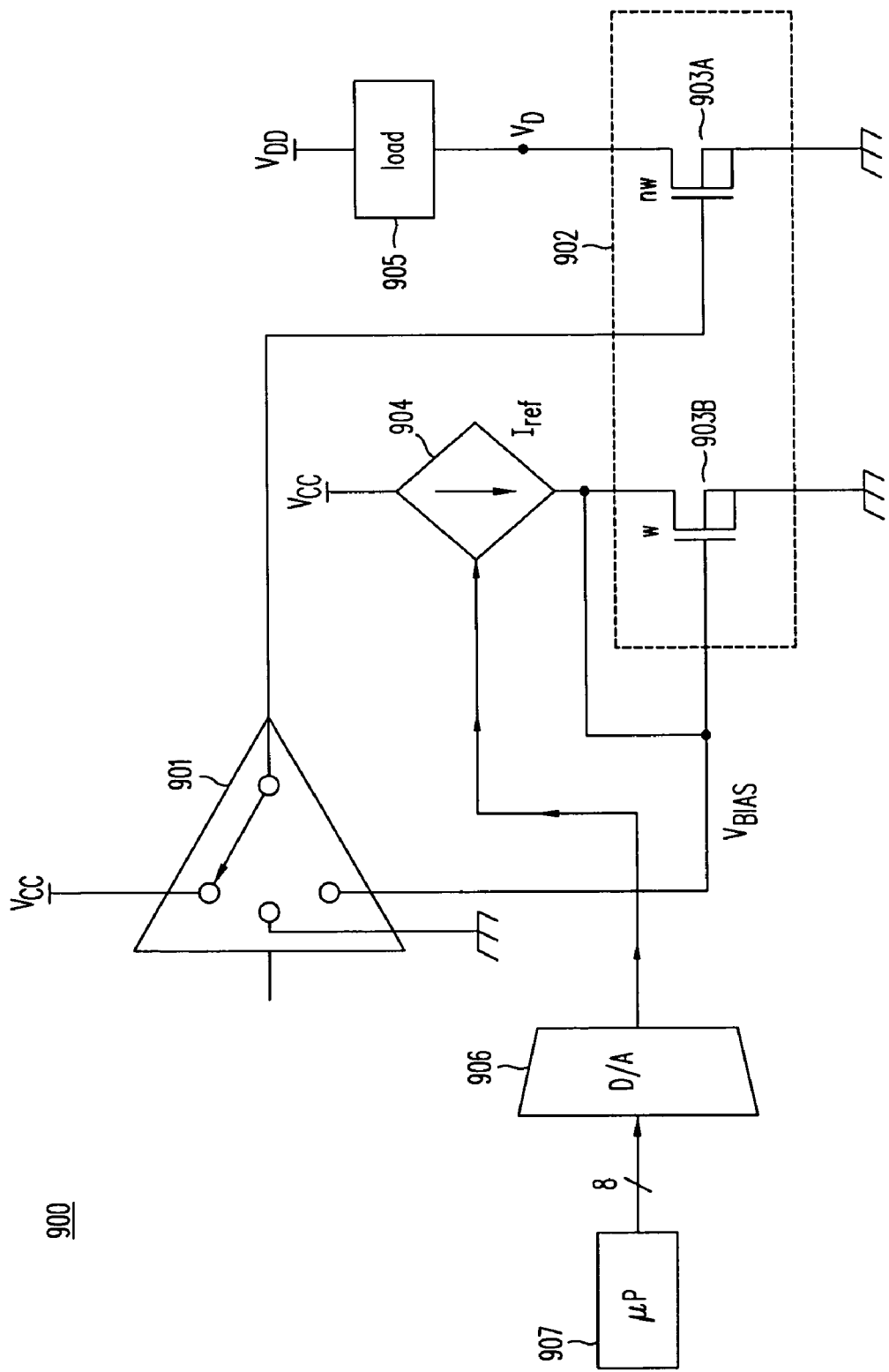
FIG. 20 is a circuit diagram of a gate driver including circuitry for obtaining a variable reference current to control the size of the current in the MOSFET in the low-current state.

Another variant of current-mirror gate driver in accordance with this invention is illustrated in FIG. 20, where a tri-state gate driver 901 drives the gate of a power MOSFET 903A with a value $V_{GS1}$ to one of three potentials—$V_{cc}$, ground, or $V_{BIAS}$. The voltage $V_{BIAS}$ is determined by threshold-connected MOSFET 903B conducting a current $I_{ref}$ from a controlled current source 904. MOSFETs 903B and 903A together comprise a monolithically fabricated MOSFET pair 902 with gate widths W and n·W, respectively.

The current $I_{ref}$ is adjusted by a D/A converter 906 under control of a digital logic, digital signal processor, or microprocessor 907 and may be adjusted dynamically and in real time as desired. D/A converter 906 and dependent current source 904 together may comprise a current-output D/A converter.

Figure 21A:
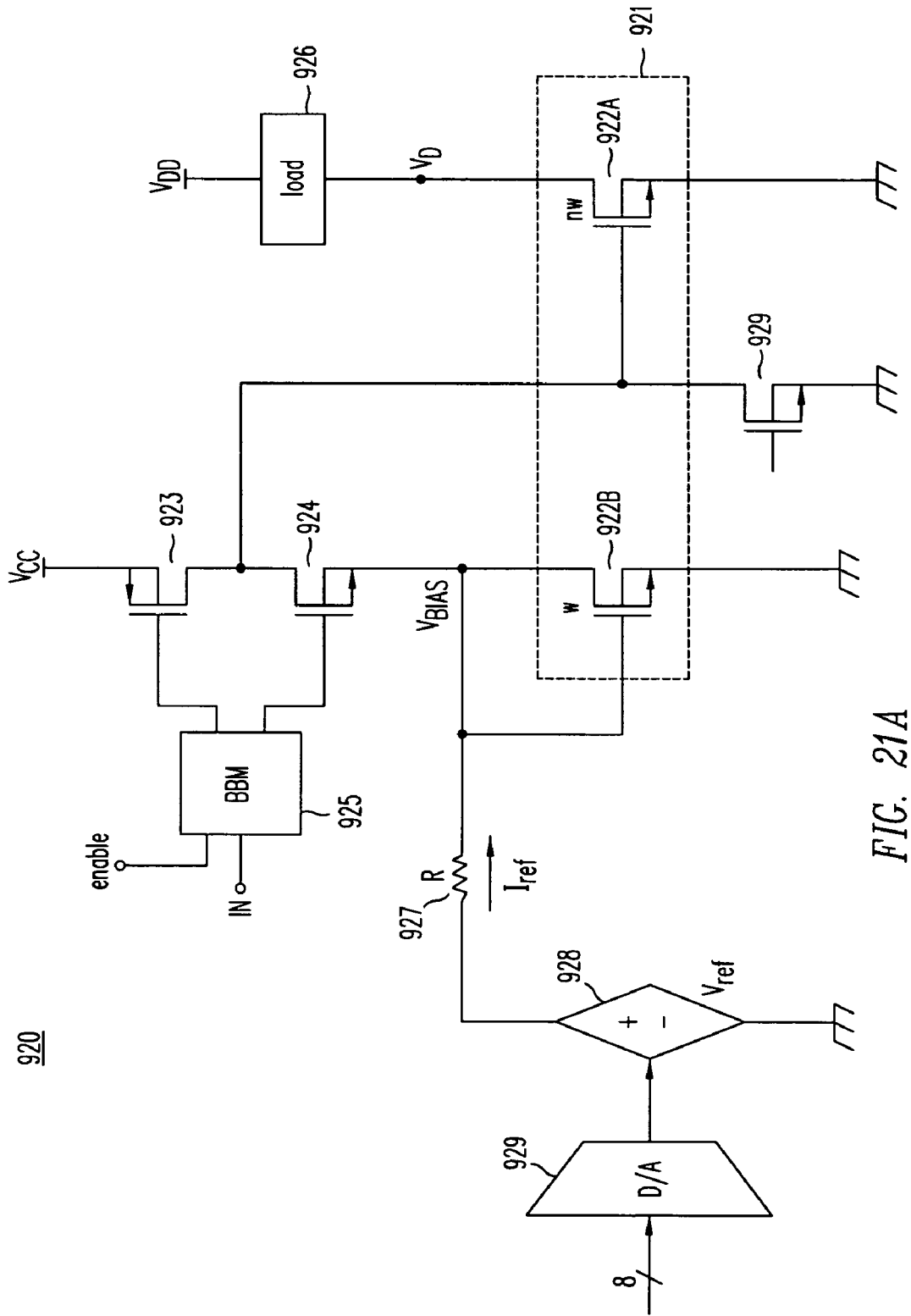
FIG. 21A is a circuit diagram of another gate driver including circuitry for obtaining a variable reference current to control the size of the current in the MOSFET in the low-current state.
Figure 21B:
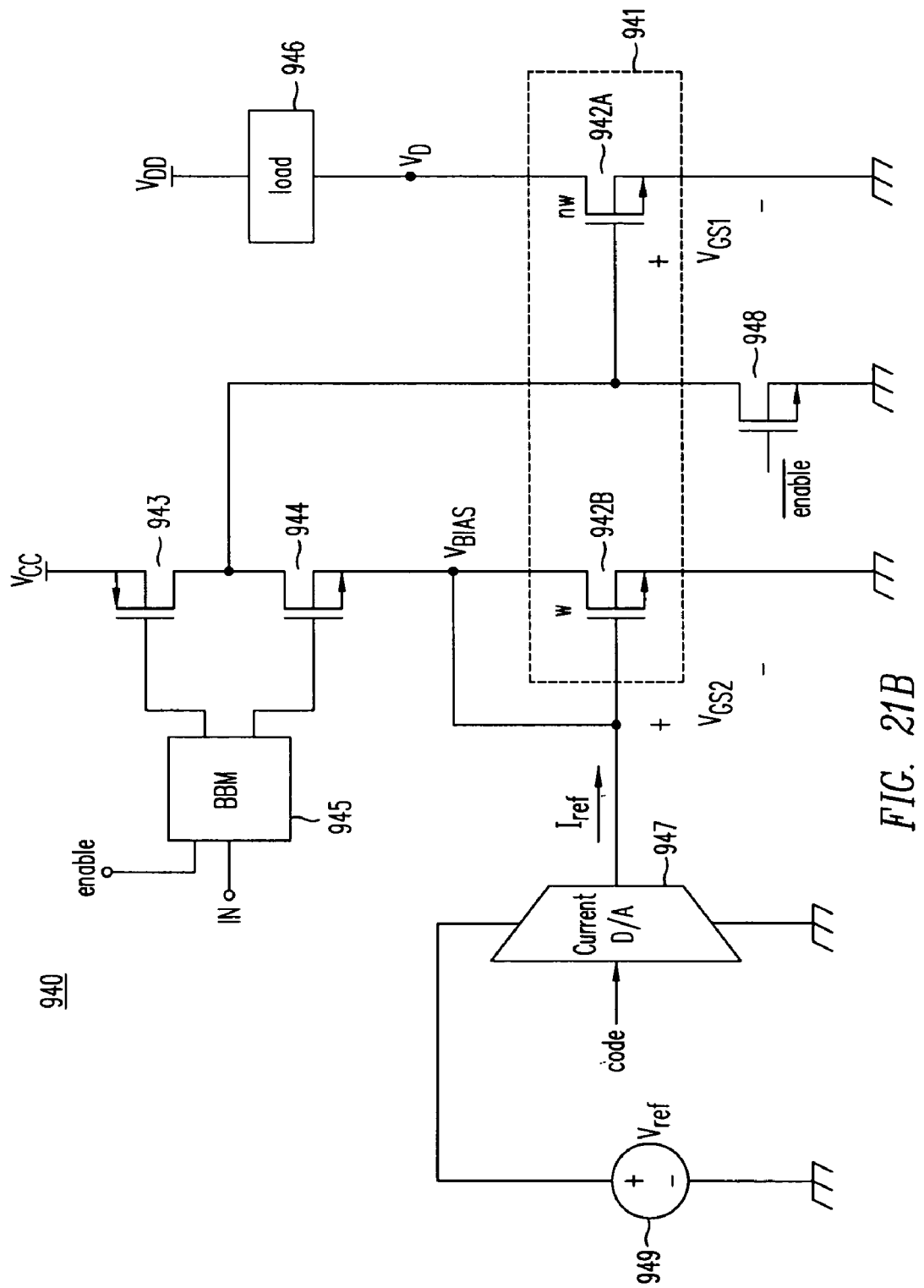
FIG. 21B is a circuit diagram of a gate driver including a digital-to-analog converter that generates a variable reference current to control the size of the current in the MOSFET in the low-current state.

An example of a current-type D/A converter 947 directly driving a mirror MOSFET 942B is illustrated in FIG. 21B. Current-mode D/A-converter 947 includes a reference voltage source 949 generating a reference voltage $V_{ref}$ to eliminate sensitivity to fluctuations in the supply voltage $V_{cc}$. Alternatively, the current $I_{ref}$ may be generated, as shown in FIG. 21A, using a D/A converter 929 controlling a controlled voltage source 928. The voltage $V_{ref}$ is converted into a current using a resistor 927 having a value R, whereby $I_{ref} = (V_{ref} - V_{tn})/R$. The precise value of R may be trimmed using a series of resistors and OTP MOSFETs as described previously.

By facilitating system control of $V_{BIAS}$, the value of drain current $I_{Dsat}$ during saturation, i.e. $I_{DBIAS}$, can be adjusted in response to changing conditions. For example $I_{DBIAS}$ can be adjusted as a percentage of $I_{Dlin}$ conducted during the linear low-resistance state, i.e.

$$I_{Dsat} = I_{DBIAS} \propto I_{Dlin} = V_{cc}/R_{DS(on)}$$

Figure 22A:
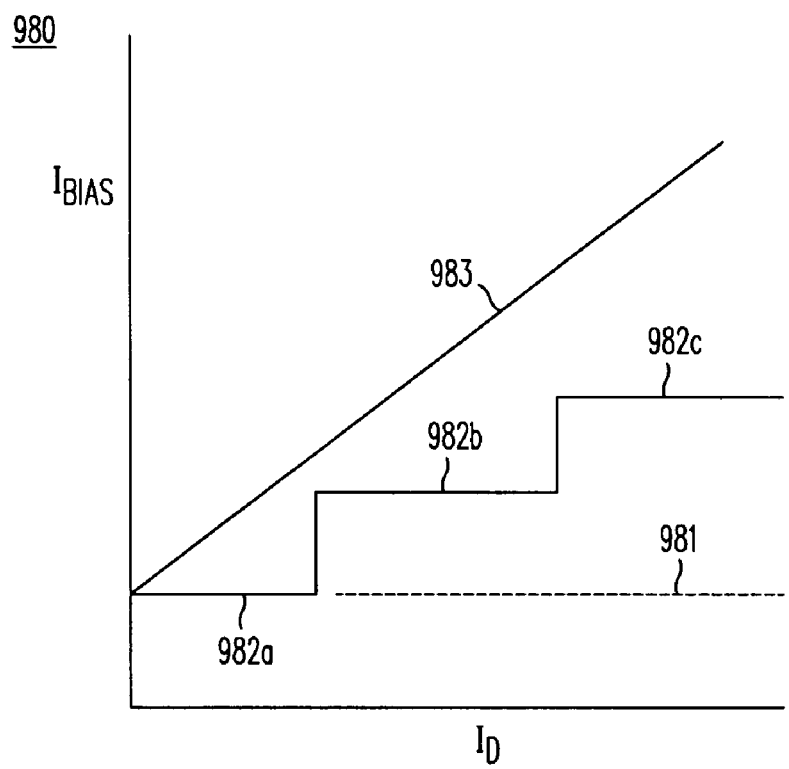
FIG. 22A is a graph showing the gate drive current as a function of drain current.
Figure 22B:
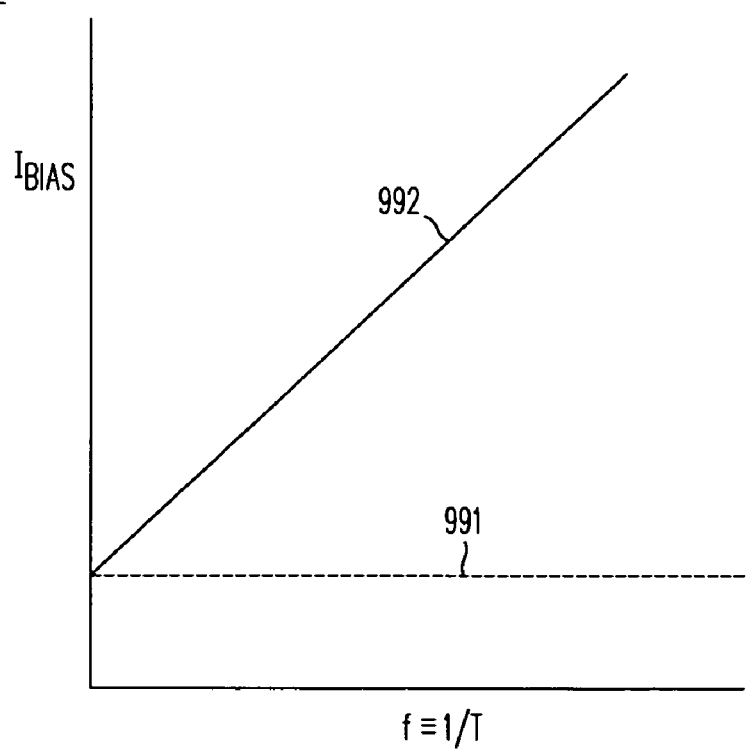
FIG. 22B is a graph showing the gate drive current as a function of conduction time.

Such an example is shown in FIG. 22A, illustrating $I_{DBIAS}$ versus $I_{Dlin}$. Curve 983 in graph 980 illustrates a constant percentage controlled using analog feedback of the linear region current. Alternatively a stair stepped increase in $I_{DBIAS}$ comprising currents shown as curves 982a, 982b and 982c can be achieved using a D/A converter and digital control. A constant $I_{DBIAS}$ is shown as line 981 for reference. In graph 990 of FIG. 22B, $I_{DBIAS}$ is varied (curve 992) as a function of frequency f rather than remaining constant (line 991).

Reduced Gate Drive Loss Circuit with Switched-Bias Current-Mirror Drive: In the previous current-mirror drive circuits, power MOSFET gate bias was determined by a multiplexing gate driver that selects among $V_{cc}$, $V_{BIAS}$ and optionally ground. In such implementations $V_{BIAS}$ is established by a current source feeding a current mirror MOSFET hardwired as a threshold-connected device, i.e. with $V_{GS} = V_{DS}$.

Figure 23A:
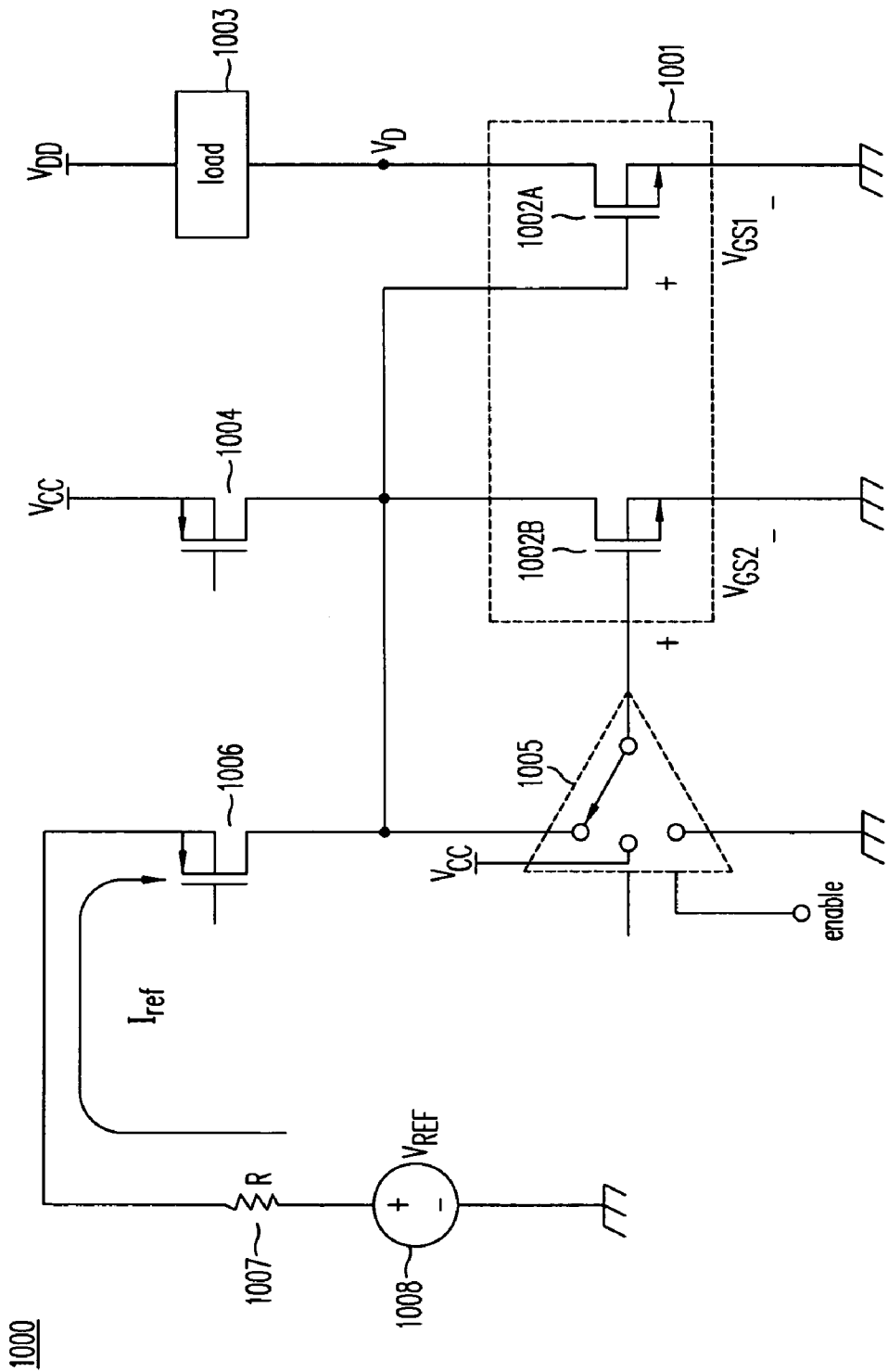
FIG. 23A is a conceptual circuit diagram of a gate driver wherein the gate of a MOSFET mirror is switched between ground and a bias supply current.

An alternative approach, illustrated in FIG. 23A, is to switch the gate bias on current mirror MOSFET 1002B between ground and a bias supply current $I_{ref}$ during high frequency switching. When P-channel MOSFET 1004 is on and the enable signal is high, a gate driver 1005 connects the gate of N-channel MOSFET 1002B to ground, turning off MOSFET 1002B. As a result, $V_{GS1} = V_{cc}$, and power MOSFET 1002A is biased into a low-resistance state, during which MOSFET 1006 remains off.

In the saturated low-current mode, MOSFET 1004 is turned off and with the enable signal high, gate driver 1005 shorts the gate of mirror MOSFET 1002B to its drain. Simultaneously MOSFET 1006 is turned on, and a reference voltage source 1008 supplies a current $I_{ref}$ through a resistor 1007 to threshold-connected MOSFET 1002B. Mirror MOSFET 1002B is threshold-connected only during the time when $V_{GS1} = V_{BIAS}$. As a result, power MOSFET 1002A is biased into saturation with a drain current of $I_{DBIAS}$.

If the enable signal is low, gate driver 1005 connects the gate of MOSFET 1002B to $V_{cc}$ turning it on and grounding the gate of power MOSFET 1002A. In this condition, MOSFETs 1004 and 1006 remain off.

An advantage of switched bias circuit 1000 is that it requires only two large area MOSFETs as buffers to drive the gate of power MOSFET 1002A, namely high-side MOSFET 1004 to drive power MOSFET 1002A into a low resistance state, and multifunction mirror MOSFET 1002B to provide $V_{BIAS}$ gate drive for operation of power MOSFET 1002A in saturation and to turn off power MOSFET 1002A.

Figure 23B:
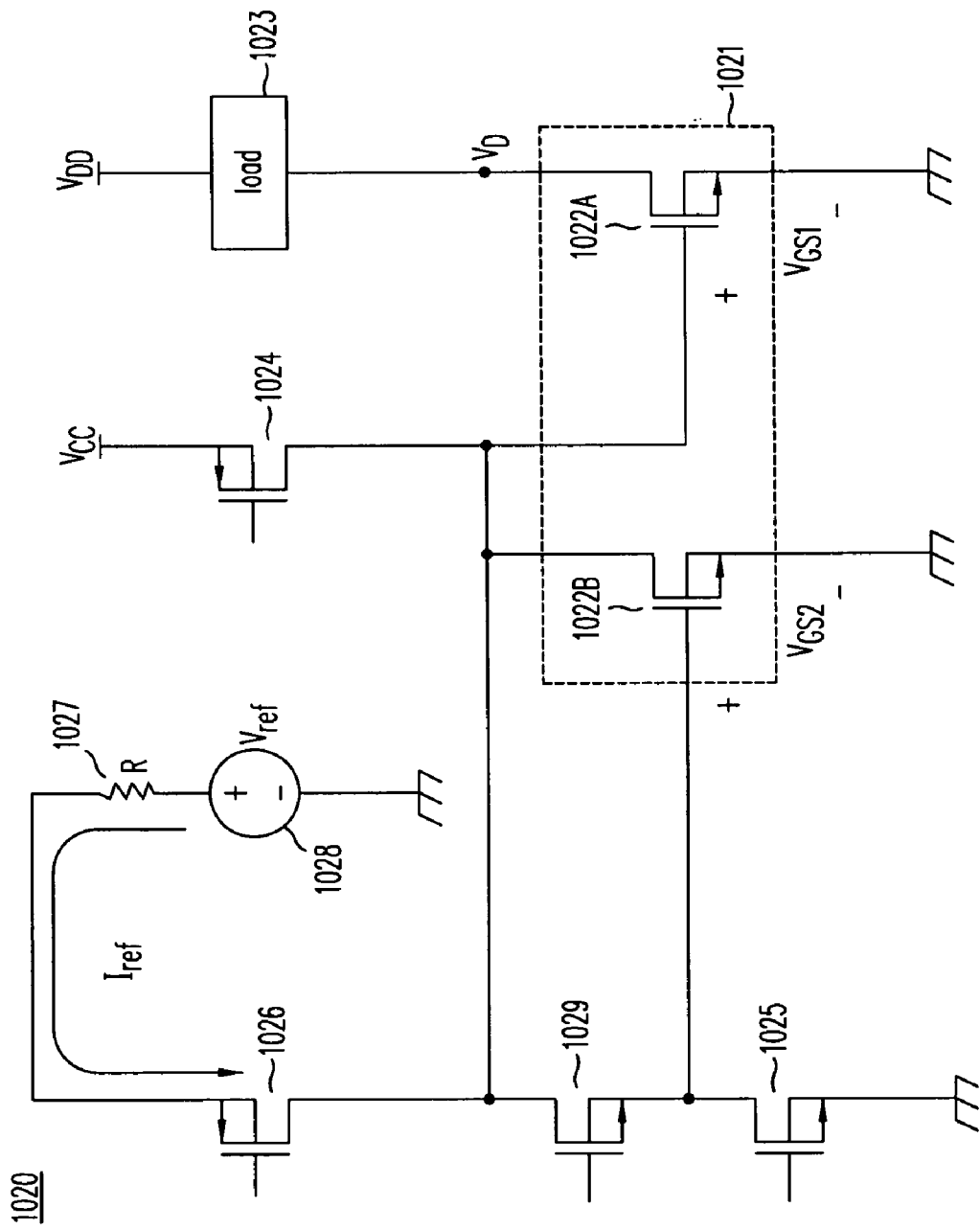
FIG. 23B is a more detailed circuit diagram of the gate driver shown in FIG. 23A.

FIG. 23B illustrates a version of circuit 1000 wherein the gate driver driving the gate of current mirror MOSFET 1022B comprises a grounded N-channel MOSFET 1025 for turning MOSFET 1022B off, and an N-channel MOSFET 1029 for shorting the gate and drain of MOSFET 1022B. MOSFET 1026 is employed to bias the gate of mirror MOSFET 1022B at a voltage $V_{BIAS}$. MOSFET 1024 is used to drive power MOSFET 1022A into a low resistance state.

Applications and Topologies of Reduced Gate Drive Loss Circuit: The above-described methods and circuits for driving a power MOSFET with low gate drive losses can be applied to low-side, high-side or push-pull configured power MOSFETs, of either N-channel or P-channel conductivity types. FIGS. 24A-24D illustrate low-loss gate drives using N-channel power MOSFETs, while FIGS. 25A and 25B illustrate low-loss gate drives using P-channel and complementary power MOSFETs.

As noted above, the gate driver may comprise a two-state driver switching between a low-resistance fully-on condition, and a limited-current saturated-MOSFET condition. Alternatively, the gate driver may comprise a tri-state buffer switching between a low resistance fully-on condition, a limited current saturated-MOSFET condition, and a fully-off condition for sleep mode operation. Each power MOSFET in a power circuit may employ one of the low gate drive loss techniques or alternatively only one of the power devices may utilize the low-drive-loss method.

Figure 24A:
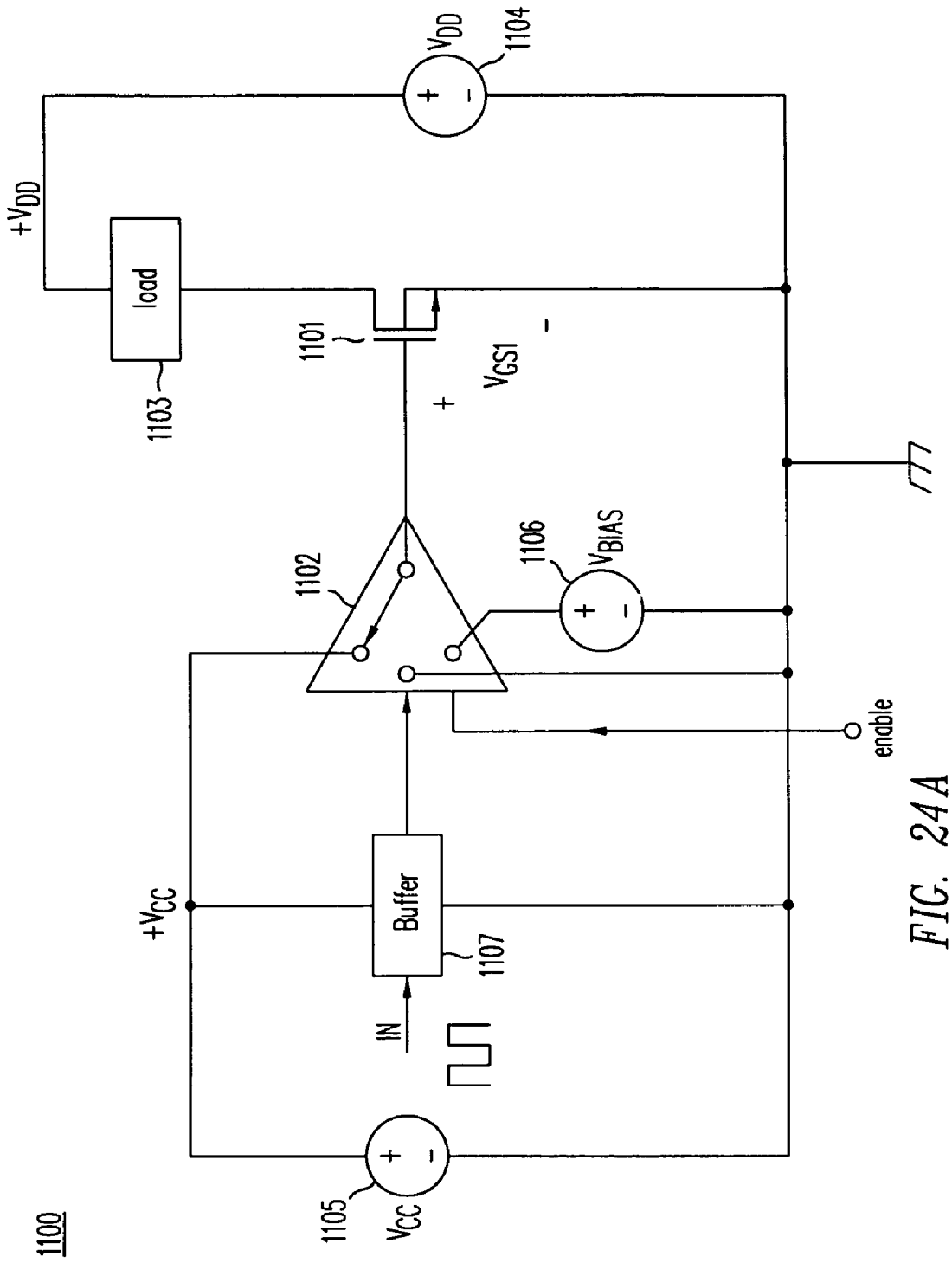
FIG. 24A is a circuit diagram showing the use of a gate driver of this invention with an N-channel low-side MOSFET connected to a load.
Figure 25A:
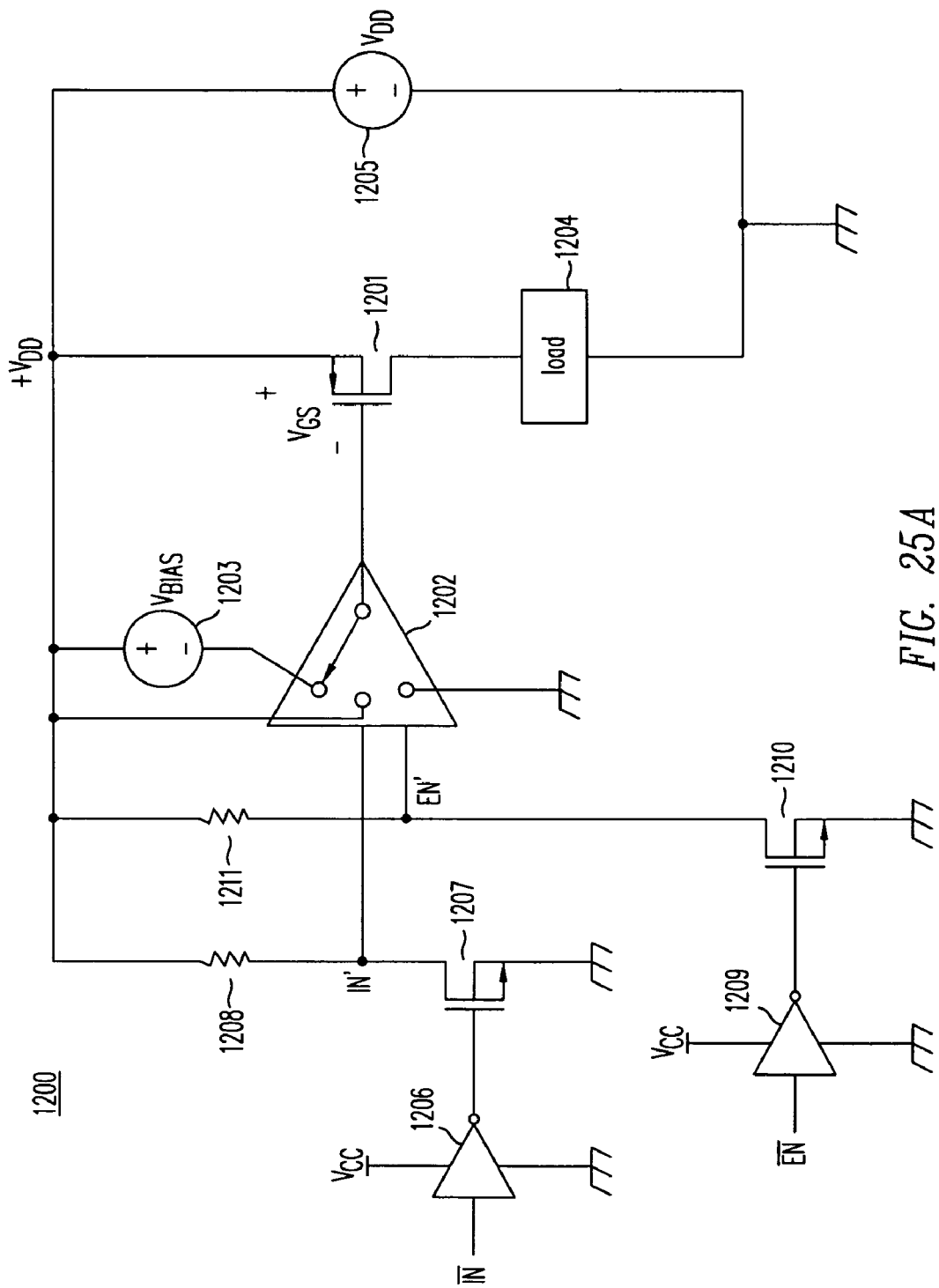
FIG. 25A is a circuit diagram showing the use of a gate driver of this invention with a P-channel high-side MOSFET connected to a load.
Figure 25B:
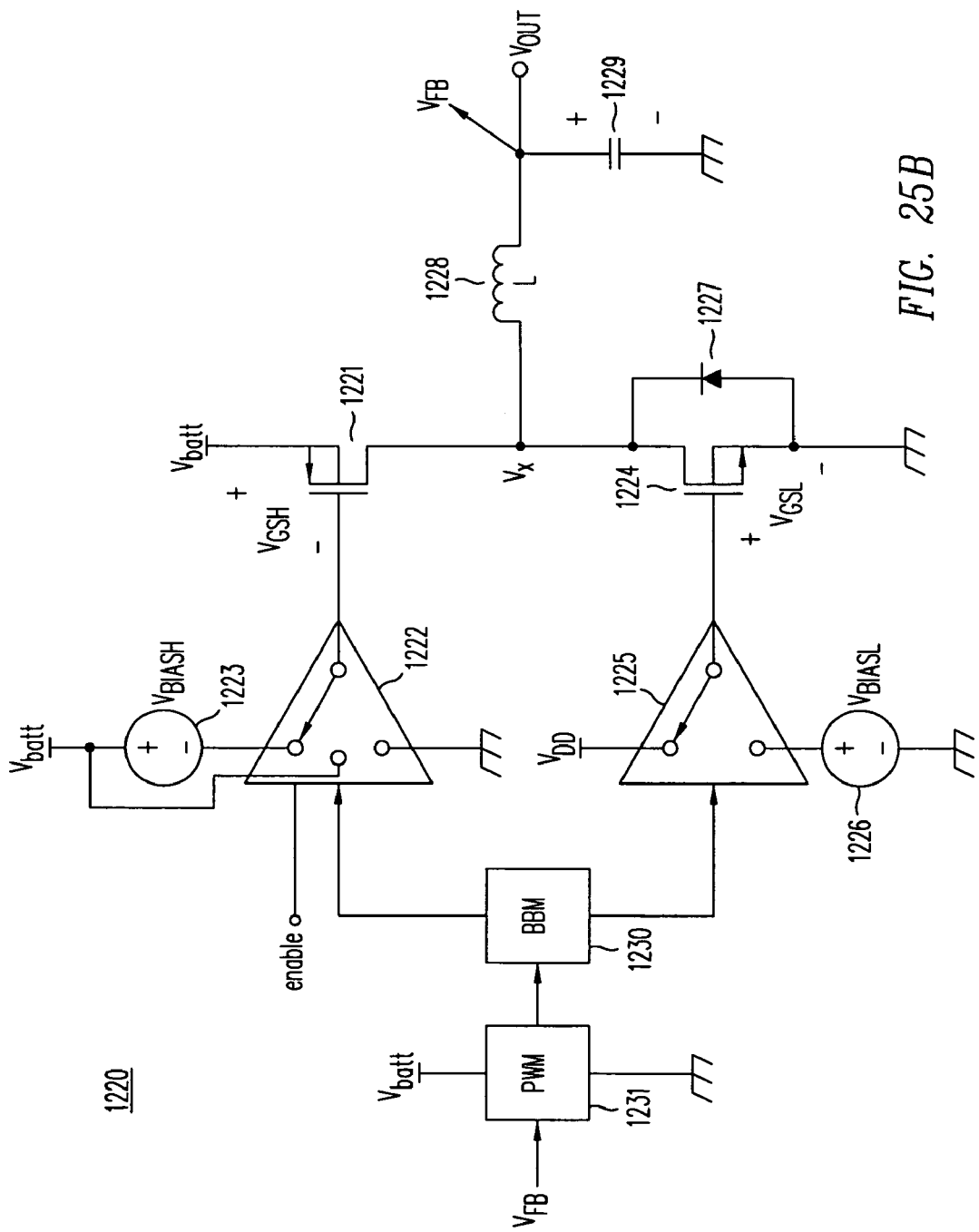
FIG. 25B is a circuit diagram showing the use of a gate driver of this invention in a complementary Buck converter.

FIG. 24A illustrates a tri-state gate driver 1102 with a voltage supply 1106 generating $V_{BIAS}$ and powered by a voltage supply 1105 generating $V_{cc}$ driving a grounded, i.e. low-side configured, N-channel power MOSFET 1101. Supplied by a voltage source 1104 generating $V_{DD}$, the current in power MOSFET 1101 and load 1103 may comprise $V_{DD}/R$ in a low resistance state, a constant current $I_{DBIAS}$ when in saturation, and when not switching $I_D=0$. Switching is inhibited when enable EN is low and the gate of power MOSFET 1101 is grounded. Voltage supplies 1104 ($V_{DD}$) and 1105 ($V_{cc}$) may comprise the same power supply. By limiting the gate bias during switching between $V_{cc}$ and $V_{BIAS}$ the gate charge swing is reduced and the efficiency of power MOSFET 1101 during switching is improved.

Figure 24B:
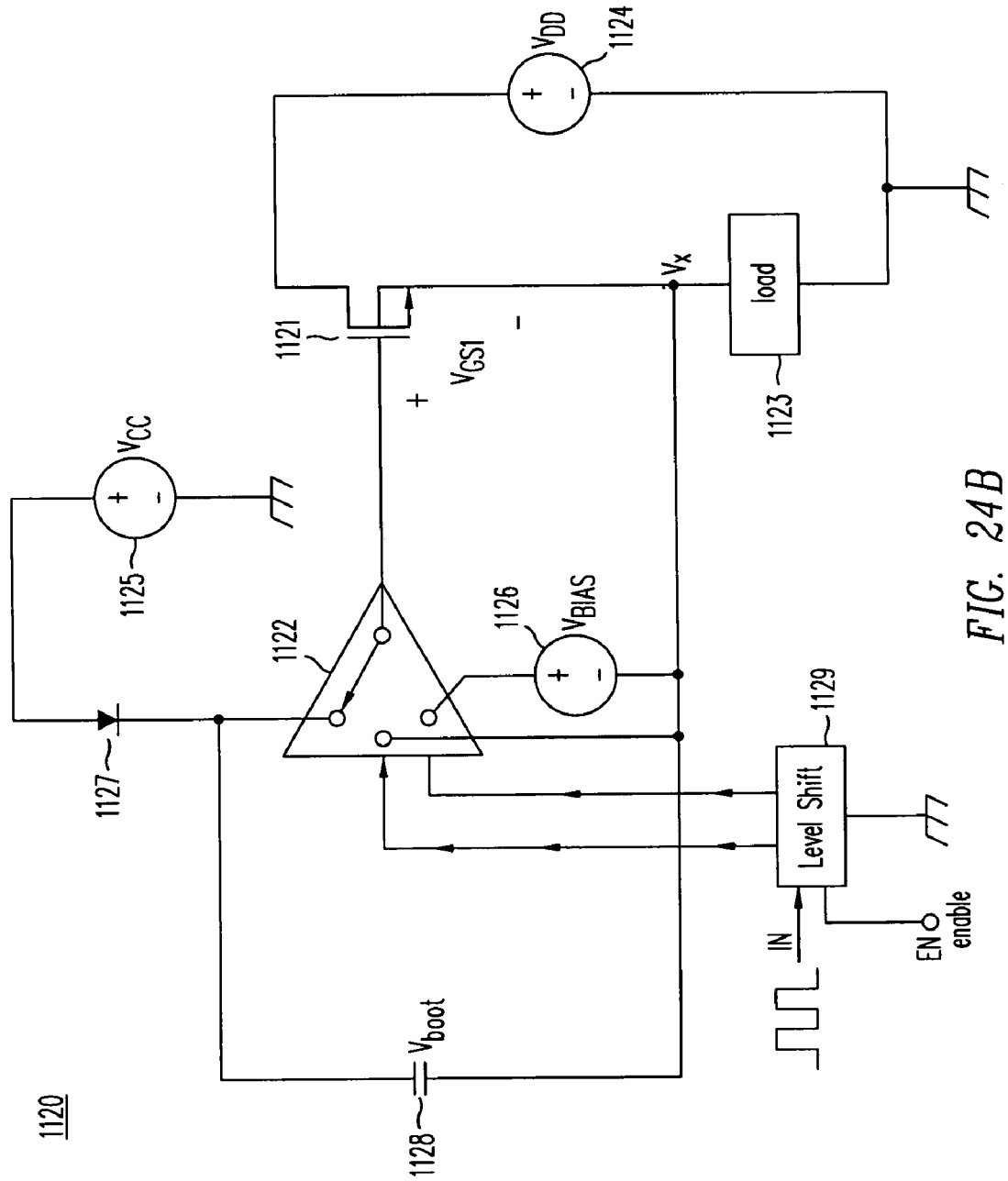
FIG. 24B is a circuit diagram showing the use of a gate driver of this invention with an N-channel high-side MOSFET connected to a load.

FIG. 24B illustrates floating tri-state gate driver 1122 with a floating voltage supply 1126 generating $V_{BIAS}$ powered by a bootstrap capacitor 1128 driving a high-side, i.e. source-follower configured, N-channel power MOSFET 1121. Bootstrap capacitor 1128 is charged by a voltage supply 1125 generating $V_{cc}$ through a bootstrap diode 1127 whenever MOSFET 1121 is off and a voltage $V_x$ at a load 1123 is at ground or less than the supply voltage $V_{cc}$. The bootstrap capacitor powers gate driver 1222 during the interval when $V_{GS1}=V_{boot}\approx V_{cc}$ and MOSFET 1121 is fully on with a low-resistance.

Supplied by a voltage source 1124 generating $V_{DD}$, the current in power MOSFET 1121 and load 1123 may be equal to $V_{DD}/R$ when MOSFET 1121 is in a low-resistance state, a constant current $I_{DBIAS}$ when MOSFET 1121 is in saturation, or zero when MOSFET 1121 is not switching. The switching of MOSFET 1121 is inhibited when the enable signal EN is low and the gate of power MOSFET 1121 is connected to its source voltage $V_x$. The enable and input signals are level-shifted by a level-shift circuit 1129 feeding gate driver 1122. The voltage supplies 1124 ($V_{DD}$) and 1125 ($V_{cc}$) may be a single voltage supply. By switching the gate of MOSFET 1121 between $V_{cc}$ and $V_{BIAS}$, the gate charge swing is reduced and the efficiency of MOSFET 1121 during switching is improved.

Figure 24C:
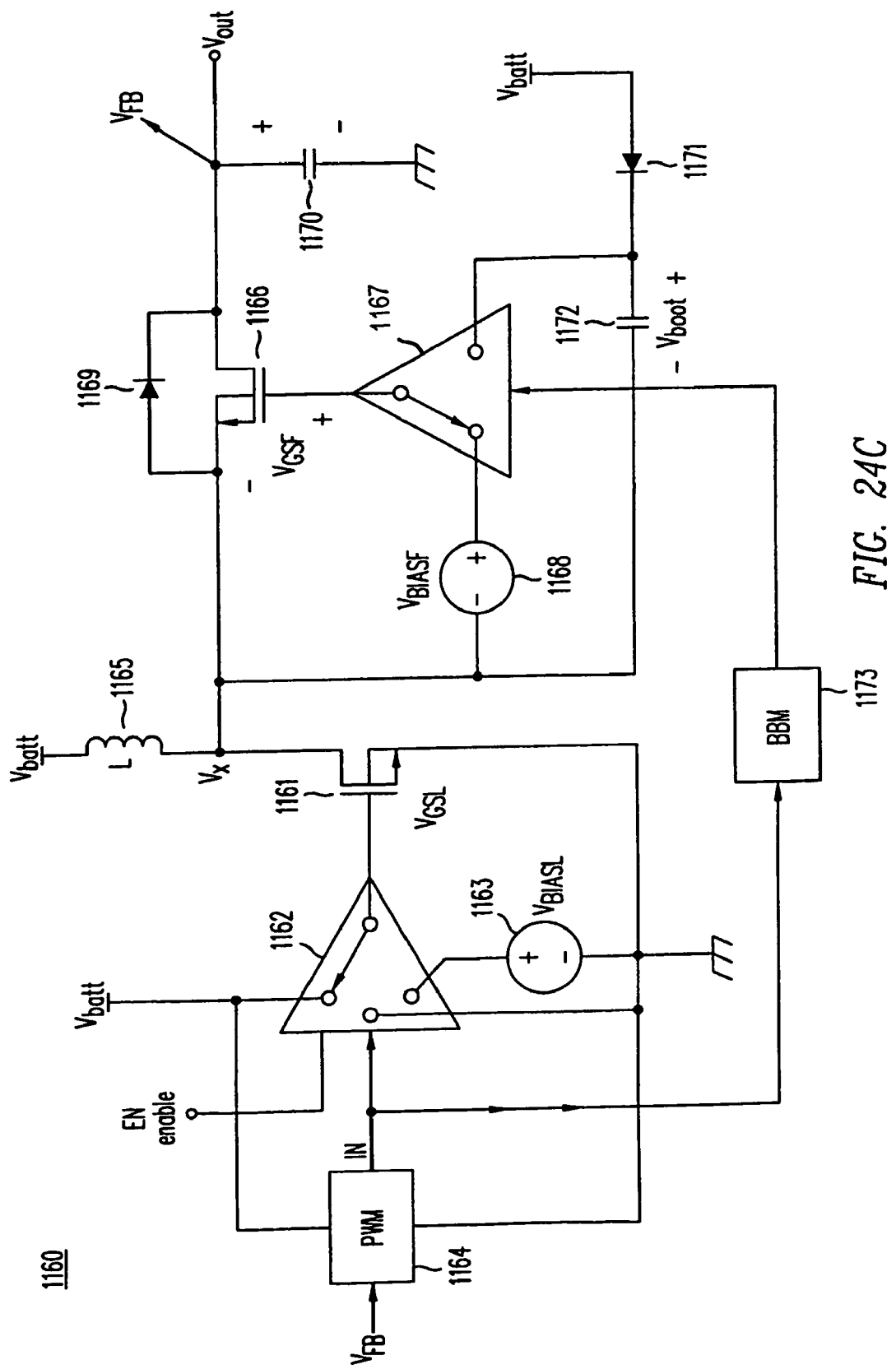
FIG. 24C is a circuit diagram showing the use of a gate driver of this invention in a synchronous boost converter.

FIG. 24C illustrates a synchronous boost converter 1160 comprising a low-side N-channel power MOSFET 1161, a synchronous rectifier MOSFET 1166, and low loss gate drivers 1162 and 1167 in accordance with this invention. As shown, tri-state gate driver 1162 with a voltage supply 1163 generating $V_{BIASL}$ is powered by $V_{batt}$ and drives a grounded, low-side configured, N-channel power MOSFET 1161. The current in power MOSFET 1161 may be equal to $V_x/R$ when MOSFET 1161 is in a low-resistance state, a constant current $I_{DBIAS}$ when MOSFET 1161 is in saturation, or zero when MOSFET 1161 is not switching. Switching is inhibited when the enable signal EN is low and the gate of power MOSFET 1161 is grounded. When enabled, a pulse-width modulation (PWM) controller 1164 determines the pulse width and the on time of MOSFET 1161 which in turn controls the current flowing in an inductor 1165. By limiting the gate bias of MOSFET 1161 during switching between $V_{batt}$ and $V_{BIASL}$, the gate charge swing is reduced and the efficiency of power MOSFET 1161 during switching is improved.

Boost converter 1160 also illustrates a P-N rectifier diode 1169 which conducts whenever low-side MOSFET 1161 is off and $V_x$ flies above $V_{out}$. To reduce power losses, a floating N-channel synchronous rectifier MOSFET 1166 conducts some portion of the time when low-side MOSFET 1161 is off. As shown, synchronous rectifier MOSFET 1166 is driven by a two-state gate driver 1167, and powered by a bootstrap capacitor 1172. Bootstrap capacitor 1172 is charged from $V_{batt}$ through a bootstrap diode 1171 whenever $V_x$ is near ground. The voltage $V_{boot}$ floats on top of $V_x$ so that the supply to gate driver 1167 is $V_{boot}\approx(V_{batt}-V_f)$ regardless of the magnitude of the voltage $V_x$. $V_f$ is the forward-bias voltage across bootstrap diode 1171 while charging bootstrap capacitor 1172.

The floating two-state gate driver 1167 drives the gate of floating MOSFET 1166 with a potential $V_{GSF}=V_{boot}$ for operating at a low on-state voltage drop and At a potential $V_{GSF}=V_{BIASF}$ for operating as a saturated current source at a current $I_{DBIAS}$. The synchronous rectifier MOSFET 1166 is preferably driven out of phase with low-side MOSFET 1161 by inverting break-before-make buffer 1173 so that only one MOSFET at a time is operating in a low-resistance high-current state.

During such intervals, the other MOSFET may be off or conducting a low bias current $I_{DBIAS}$ to reduce gate charge swing in accordance with this invention. Since N-channel MOSFET 1161 exhibits a larger drain voltage transition during conduction than synchronous rectifier MOSFET 1166, the benefit of the invention limiting the gate charge swing is greatest for gate driver 1162 driving low-side MOSFET 1161. Nonetheless, driver 1167 driving synchronous rectifier MOSFET 1166 provides some reduction in gate drive losses and more importantly reduces the efficiency loss and noise generated from diode recovery in rectifier diode 1169. The subject of controlling diode recovery by biasing a synchronous rectifier MOSFET as a current source is addressed in application Ser. No. 11/890,947, titled "Low-Noise DC/DC Converter With Controlled Diode Conduction," filed contemporaneously herewith and incorporated herein by reference. Table 4 is a truth table describing the various combinations described above.

TABLE 4

| Input | | Power MOSFET 1161 | | | Sync Rect MOSFET 1166 | | |
|---|---|---|---|---|---|---|---|
| EN | IN | $V_{GSL}$ | State | $I_D$ | $V_{GSF}$ | State | $I_D$ |
| L | L/H | 0 V | cut off | ~0 | | does not matter | |
| H | H | $V_{batt}$ | low $R_{DS}$ | $V_{batt}/R_{DS(on)}$ | $V_{BIASF}$ | saturated | $I_{DBIAS}$ |
|   | L | $V_{BIASL}$ | saturated | $I_{DBIAS}$ | $V_{boot}$ | low $R_{DS}$ | $(V_x - V_{out})/R_{DS(on)}$ |

Note also that in the embodiment of FIG. 24C only gate driver 1162 is tri-state, since MOSFET 1161 forms a series shunt from the battery input to ground. Putting MOSFET 1166 into a sleep mode wherein the switching of MOSFET 1166 is inhibited does not prevent $V_{batt}$ from charging output capacitor 1170 to approximately $V_{batt}$ since diode 1169 is forward biased whenever $V_{batt} > V_{out}$. The main benefit of putting synchronous rectifier MOSFET 1166 into a sleep mode is to prevent a gradual discharge of capacitor 1170 back into $V_{batt}$.

Figure 24D:
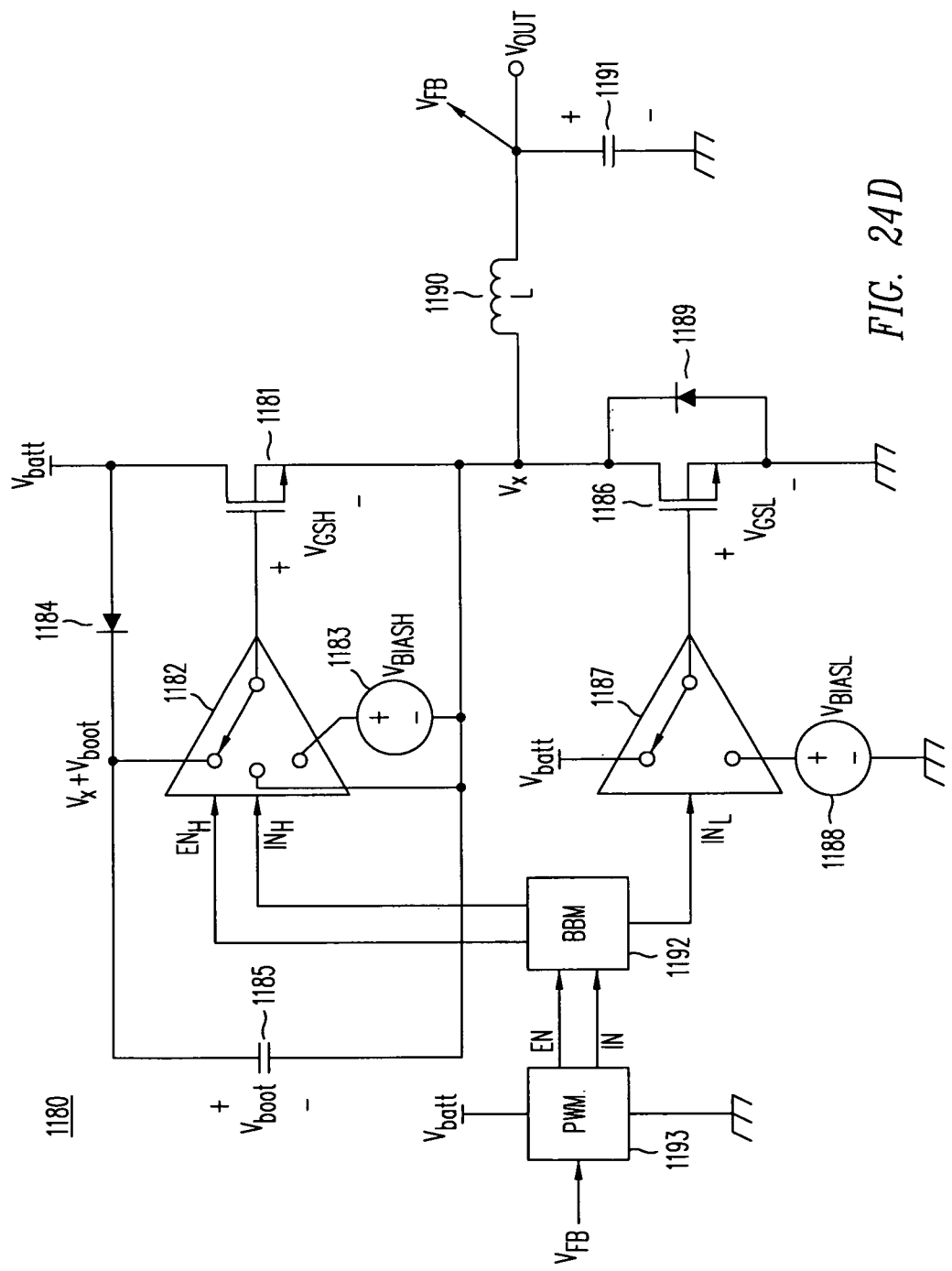
FIG. 24D is a circuit diagram showing the use of a gate driver of this invention in a synchronous Buck converter.

In another embodiment of this invention, an N-channel synchronous Buck converter 1180 with reduced gate drive losses in accordance with this invention is illustrated in FIG. 24D. As shown Buck converter 1180 comprises a floating tri-state gate driver 1182 with a floating voltage supply 1183 generating $V_{BIASH}$. Gate driver 1182 is powered by a bootstrap capacitor 1185 and drives a high-side, i.e. source-follower configured, N-channel power MOSFET 1181. Bootstrap capacitor 1185 is charged from $V_{batt}$ through a bootstrap diode 1184 whenever MOSFET 1181 is off and voltage $V_x$ is at ground or less than the supply voltage $V_{batt}$. Bootstrap capacitor 1185 powers gate driver 1282 during the interval when $V_{GSH} = V_{boot} \approx V_{batt}$ and MOSFET 1181 is fully on with a low-resistance.

MOSFET 1181 has its on-time controlled by a PWM controller 1193. The width of the pulses supplied to MOSFET 1181 is modulated to control the current flowing through inductor 1190 and charging capacitor 1191. Using closed-loop control, the output voltage $V_{out}$ is fed back to PWM controller 1193, using a feedback signal $V_{FB}$, to regulate the output voltage against variations in the input voltage $V_{batt}$ and load current. Whenever MOSFET 1181 is saturated and conducting a low current $I_{DBIAS}$, inductor 1190 forces $V_x$ below ground, and as a result diode 1189 becomes forward-biased. A low-side N-channel MOSFET 1186 is included to reduce diode conduction losses by shunting current through a lower voltage drop path whenever gate driver 1187 biases the gate of MOSFET 1186 to $V_{batt}$.

Conversely, whenever high-side MOSFET 1181 is conducting current in a low resistance state with $V_{GSH} = V_{boot}$ then synchronous rectifier MOSFET 1186 is biased by gate buffer with $V_{GSL} = V_{BIAS}$ and synchronous rectifier conducts a low current $I_{DBIAS}$ BBM circuit 1192 prevents both high-side and low-side MOSFETs 1181 and 1182 from simultaneously conducting high currents.

Since high-side MOSFET 1181 exhibits a larger drain voltage transition during conduction than synchronous rectifier MOSFET 1186, the benefit of the invention in limiting the gate charge swing is greatest for gate driver 1182 driving high-side MOSFET 1181. Nonetheless, gate driver 1187 driving synchronous rectifier MOSFET 1186 provides some reduction in gate drive losses and more importantly reduces the efficiency loss and noise generated from diode recovery in rectifier diode 1189.

The subject of controlling diode recovery by biasing a synchronous rectifier MOSFET as a current source is addressed in the above-referenced application Ser. No. 11/890,947. Table 5 is truth table describing the various combinations described above.

TABLE 5

| Input | | Power MOSFET 1181 | | | Sync Rect MOSFET 1186 | | |
|---|---|---|---|---|---|---|---|
| EN | IN | $V_{GSH}$ | State | $I_D$ | $V_{GSL}$ | State | $I_D$ |
| L | L/H | 0 V | cut off | ~0 | | does not matter | |
| H | H | $V_{boot}$ | low $R_{DS}$ | $(V_{batt} - V_x)/R_{DS(on)}$ | $V_{BIASL}$ | saturated | $I_{DBIAS}$ |
|   | L | $V_{BIASH}$ | saturated | $I_{DBIAS}$ | $V_{batt}$ | low $R_{DS}$ | $V_x/R_{DS(on)}$ |

Note also that only gate driver 1182 need be tri-state since turning off either MOSFET 1181 or 1186 breaks the current path from $V_{batt}$ to ground.

In another embodiment of this invention, FIG. 25A in circuit 1200 illustrates a tri-state gate driver 1202 with a voltage supply 1203 generating $V_{BIAS}$. A voltage supply 1205 generating $V_{DD}$ drives a load 1204 via a $V_{cc}$-connected, i.e. high-side configured, P-channel power MOSFET 1201. Supplied by voltage source 1205, the current in power MOSFET 1201 and load 1204 may be equal to $V_{DD}/R$ in a low resistance state of MOSFET 1201, a constant current $I_{DBIAS}$ when MOSFET 1201 is in saturation, and zero when MOSFET 1201 is not switching. The switching of MOSFET 1201 is inhibited when an enable signal EN is low and the gate of power MOSFET 1201 is connected to $V_{DD}$.

The enable (EN) and input (IN) signals may be delivered to logic switching between $V_{DD}$ and ground, as indicated by inverters 1206 and 1209, which are biased between $V_{cc}$ and ground. If the supply voltage $V_{DD}$ is greater than $V_{cc}$ the EN and IN signals must be level-shifted to $V_{DD}$. In the embodiment of FIG. 25A, the level shift circuit employs an N-channel MOSFET 1207 and a resistor 1208 to convert the output of inverter 1206 into an input signal IN' switching between $V_{DD}$ and ground. Similarly, an N-channel MOSFET 1210 and resistor 1211 convert the output of inverter 1209 into an enable signal EN' switching between $V_{DD}$ and ground. Alternatively, $V_{cc}$ and $V_{DD}$ may be supplied by a single power supply so that level-shift circuitry is not required. In conclusion, by limiting the gate bias of power MOSFET 1201 during switching between $V_{DD}$ and $V_{BIAS}$ the gate charge swing is reduced and the efficiency of power MOSFET during switching is improved.

A complementary synchronous Buck converter 1220 with reduced gate drive losses in accordance with this invention is illustrated in FIG. 25B. Converter 1220 comprises a high-side referenced tri-state gate driver 1222 with a high-side referenced voltage supply 1223 generating $V_{BIASH}$ powered directly by $V_{batt}$ and driving a high-side, i.e. common-source configured, P-channel power MOSFET 1221.

The on-time of MOSFET 1221 is controlled by a PWM controller 1231. The width of the pulses delivered to the gate of MOSFET 1221 is modulated to control the current flowing through an inductor 1228, charging a capacitor 1229. Using closed-loop control, the output voltage $V_{out}$ is fed back to PWM controller 1231 using a feedback signal $V_{FB}$ to regulate the output voltage against variations in the input voltage and load current. Whenever MOSFET 1221 is saturated and conducting a low current $I_{DBIAS}$, inductor 1228 forces $V_x$ below ground, and as a result diode 1227 becomes forward-biased. A low-side N-channel MOSFET 1224 is included to reduce diode conduction losses by shunting current through a lower voltage drop path whenever gate driver 1225 biases the gate of MOSFET 1224 to $V_{batt}$.

Conversely, whenever high-side P-channel MOSFET 1221 is conducting current in a low resistance state with $V_{GSH}=-V_{batt}$ then synchronous rectifier MOSFET 1224 is biased by gate driver with $V_{GSL}=V_{BIAS}$ and synchronous rectifier MOSFET 1224 conducts a low current $I_{DBIAS}$. A BBM circuit 1230 prevents MOSFETs 1221 and 1224 from simultaneously conducting high currents.

Since P-channel MOSFET 1221 exhibits a larger drain voltage transition during conduction than synchronous rectifier MOSFET 1224, the benefit of the invention in limiting the gate charge swing is greatest for gate driver 1222 driving high-side P-channel MOSFET 1221. Nonetheless gate driver 1225 driving synchronous rectifier MOSFET 1224 provides some reduction in gate drive losses and more importantly reduces the efficiency loss and noise generated from diode recovery in rectifier diode 1227.

The subject of controlling diode recovery by biasing a synchronous rectifier MOSFET as a current source is addressed in the above-referenced application Ser. No. 11/890,947. Table 6 is a truth table describing the various combinations is described above

TABLE 6

| Input | | P-ch Power MOSFET 1221 | | | N-ch Sync Rect MOSFET 1224 | | |
|---|---|---|---|---|---|---|---|
| EN | IN | $V_{GS1}$ | State | $I_D$ | $V_{GS2}$ | State | $I_D$ |
| L | L/H | 0 V | cut off | ~0 | | does not matter | |
| H | H | $-V_{batt}$ | low $R_{DS}$ | $-(V_{batt}-V_x)/R_{DS(on)}$ | $V_{BIASL}$ | saturated | $-I_{DBIAS}$ |
| | L | $-V_{BIASH}$ | saturated | $-I_{DBIAS}$ | $V_{batt}$ | low $R_{DS}$ | $-V_x/R_{DS(on)}$ |

Note also that only gate driver 1222 need be tri-state since turning off either MOSFET 1221 or 1224 breaks the current path from $V_{batt}$ to ground.

While specific embodiments of this invention have been described herein, it will be understood by those of skill in the art that the embodiments described are illustrative only, and not limiting. The broad principles of this invention are defined in the following claims.

I claim:

1. A combination comprising a power MOSFET and a gate driver, the power MOSFET being connected with a load in a power circuit, an output terminal of the gate driver being connected to a gate terminal of the power MOSFET, the gate driver further comprising:

a first input terminal and a second input terminal, the first input terminal being connected to a first voltage source, the second input terminal being connected to a second variable voltage source;

a switching element for switching the output terminal between the first input terminal and second input terminal;

wherein a first voltage provided by the first voltage source causes the power MOSFET to be in a fully on condition when delivered to the gate terminal and a second voltage provided by the second variable voltage source causes the power MOSFET to be in a low-current condition when delivered to the gate terminal;

the combination further comprising a feedback circuit connected between the power circuit and the second input terminal of the gate driver, the feedback circuit being for generating an error signal which maintains the current in the low-current condition of the power MOSFET at a target value; the feedback circuit comprising a current sensor connected in the power circuit and an amplifier, the current sensor being connected to a first input terminal of the amplifier, a second input terminal of the amplifier being connected to a reference voltage, an output of the amplifier being connected to the variable voltage source.

2. The combination of claim 1 wherein the switching element comprises a CMOS pair, a first MOSFET of the CMOS pair being connected between the first input terminal and the output terminal, a second MOSFET of the CMOS pair being connected between the second input terminal and the output terminal.

3. The combination of claim 1 wherein the current sensor includes a sense resistor.

4. A combination comprising a gate driver and a power MOSFET, an output terminal of the gate driver being connected to a gate terminal of the power MOSFET, the gate driver further comprising:

a first input terminal and a second input terminal, the first input terminal being connected to a first voltage source, the second input terminal being connected to a second voltage source;

a switching element for switching the output terminal between the first input terminal and second input terminal;

wherein a first voltage provided by the first voltage source causes the power MOSFET to be in a fully on condition when delivered to the gate terminal and a second voltage provided by the second voltage source causes the power MOSFET to be in a low-current condition when delivered to the gate terminal;

wherein the power MOSFET is connected with a load in a power circuit, the combination further comprising a feedback circuit connected between the power circuit and the second input terminal of the gate driver, the feedback circuit being for generating an error signal which maintains the current in the low-current condition of the power MOSFET at a target value; and wherein the feedback circuit comprises:
a current mirror arrangement for generating a mirror current, the size of the mirror current being proportional to the size of the current in the power circuit;
a sense resistor connected to the current mirror arrangement such that the mirror current flows through the sense resistor; and
an amplifier, a first input terminal of the amplifier being connected to a reference voltage source, a second input terminal of the amplifier being connected to the sense resistor, and an output terminal of the amplifier being connected to the second input terminal of the gate driver.

5. The combination of claim 4 wherein the feedback circuit comprises a second MOSFET connected in series with the power MOSFET.

6. The combination of claim 4 wherein the current mirror arrangement comprises:
a current mirror circuit comprising a first current source connected in series with a current mirror MOSFET, a gate terminal of the current mirror MOSFET being connected to the output terminal of the gate driver, a source terminal of the current mirror MOSFET being connected to a source terminal of the power MOSFET;
a second current source connected in series with the sense resistor;
a second amplifier, a first input terminal of the second amplifier being connected to a drain terminal of the current mirror MOSFET, a second input terminal of the second amplifier being connected to a drain terminal of the power MOSFET, an output terminal of the second amplifier being connected to a control input terminal of each of the first and second current sources.

7. The combination of claim 5 wherein the current mirror arrangement comprises:
a current mirror circuit comprising a first current source connected in series with a current mirror MOSFET, a gate terminal of the current mirror MOSFET being connected to a gate terminal of the second MOSFET and to a second reference voltage, a source terminal of the current mirror MOSFET being connected to a source terminal of the second MOSFET;
a second current source connected in series with the sense resistor;
a second amplifier, a first input terminal of the second amplifier being connected to a drain terminal of the current mirror MOSFET, a second input terminal of the second amplifier being connected to a drain terminal of the second MOSFET, an output terminal of the second amplifier being connected to a control input terminal of each of the first and second current sources.

* * * * *